(12) United States Patent
Nosaka

(10) Patent No.: US 10,601,401 B2
(45) Date of Patent: Mar. 24, 2020

(54) ELASTIC WAVE FILTER DEVICE, RADIO-FREQUENCY FRONT-END CIRCUIT, AND COMMUNICATION APPARATUS

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/367,389

(22) Filed: Mar. 28, 2019

(65) Prior Publication Data

US 2019/0222199 A1     Jul. 18, 2019

Related U.S. Application Data

(63) Continuation of application No. PCT/JP2017/033142, filed on Sep. 13, 2017.

(30) Foreign Application Priority Data

Sep. 30, 2016 (JP) ................................. 2016-194845

(51) Int. Cl.
    *H03H 9/64*         (2006.01)
    *H03H 9/145*       (2006.01)
    (Continued)

(52) U.S. Cl.
    CPC ........... *H03H 9/6403* (2013.01); *H03F 3/195* (2013.01); *H03F 3/213* (2013.01); *H03F 3/245* (2013.01);
    (Continued)

(58) Field of Classification Search
    CPC ........ H03H 9/725; H03H 9/6483; H03H 9/25; H03H 9/145; H03H 9/64; H03H 9/72;
    (Continued)

(56) References Cited

U.S. PATENT DOCUMENTS

2002/0180562 A1     12/2002    Taniguchi
2009/0201104 A1     8/2009    Ueda et al.
(Continued)

FOREIGN PATENT DOCUMENTS

JP      2002-314372 A     10/2002
JP      2008-028539 A      2/2008
(Continued)

OTHER PUBLICATIONS

International Search Report for International Application No. PCT/JP2017/033142, dated Nov. 28, 2017.
(Continued)

*Primary Examiner* — Ajibola A Akinyemi
(74) *Attorney, Agent, or Firm* — Pearne & Gordon LLP

(57) ABSTRACT

A filter includes a longitudinally coupled resonator device, a parallel arm resonator, and a variable frequency circuit. The parallel arm resonator is connected between a ground and a node provided on a path connecting input-output terminals. The variable frequency circuit is connected to the first parallel arm resonator. The longitudinally coupled resonator device includes three or more odd-number IDT electrodes, an odd-numbered IDT terminal, and an even-numbered IDT terminal. The even-numbered IDT terminal is a first signal terminal connected to at least one IDT electrode located at an even-numbered position from an edge of an arrangement order of the plural IDT electrodes. The odd-numbered IDT terminal is a second signal terminal connected to two or more IDT electrodes located at odd-numbered positions from the edge. The longitudinally coupled resonator device is disposed so that the even-numbered IDT terminal is connected to the node.

20 Claims, 37 Drawing Sheets

(51) Int. Cl.
*H03H 7/38* (2006.01)
*H03F 3/213* (2006.01)
*H04B 1/04* (2006.01)
*H03F 3/195* (2006.01)
*H03F 3/24* (2006.01)
*H04B 1/18* (2006.01)

(52) U.S. Cl.
CPC ............ *H03H 7/38* (2013.01); *H03H 9/1455* (2013.01); *H03H 9/64* (2013.01); *H03H 9/6483* (2013.01); *H04B 1/04* (2013.01); *H04B 1/0458* (2013.01); *H04B 1/18* (2013.01); *H03F 2200/165* (2013.01); *H03F 2200/294* (2013.01); *H03F 2200/451* (2013.01); *H03H 2210/025* (2013.01); *H03H 2210/026* (2013.01); *H04B 2001/0408* (2013.01)

(58) Field of Classification Search
CPC ........... H03H 9/14541; H03H 9/02992; H03H 9/02559; H03H 9/0576; H03H 9/02574; H03H 9/542; H03H 9/6436; H03H 9/6489; H03H 9/706; H03H 3/08; H03H 7/38; H03H 9/059; H03H 9/0009

USPC ........................................................ 455/118
See application file for complete search history.

(56) References Cited

U.S. PATENT DOCUMENTS

| | | | |
|---|---|---|---|
| 2009/0251235 A1 | 10/2009 | Belot et al. | |
| 2010/0109802 A1* | 5/2010 | Tanaka ................... | H03H 9/725 333/133 |
| 2010/0127800 A1* | 5/2010 | Sakuraba ............. | H03H 9/6483 333/195 |
| 2012/0062337 A1* | 3/2012 | Tsurunari ............... | H03H 9/725 333/133 |
| 2014/0218128 A1 | 8/2014 | Fujita | |

FOREIGN PATENT DOCUMENTS

| | | |
|---|---|---|
| JP | 2009-207116 A | 9/2009 |
| WO | 2013/061694 A1 | 5/2013 |

OTHER PUBLICATIONS

Written Opinion for International Application No. PCT/JP2017/033142, dated Nov. 28, 2017.

\* cited by examiner

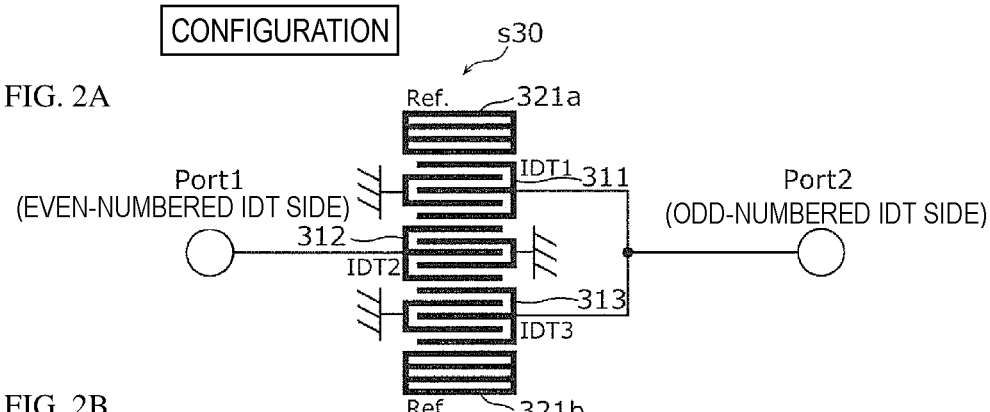

FIG. 2A

LONGITUDINALLY COUPLED RESONATOR DEVICE CONFIGURATION

FIG. 2B

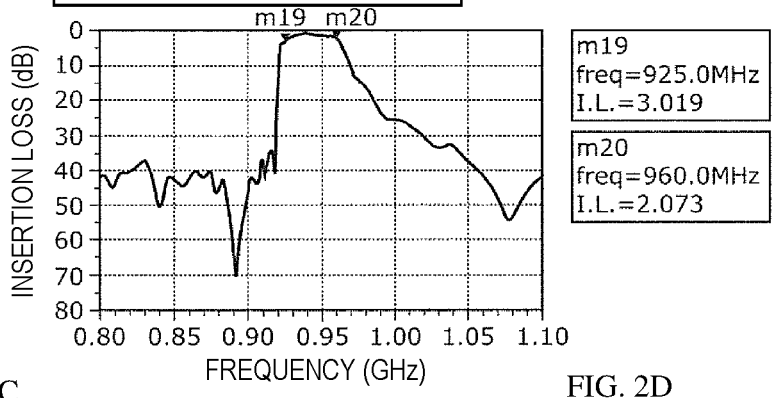

BANDPASS CHARACTERISTICS m19
freq=925.0MHz
I.L.=3.019 m20
freq=960.0MHz
I.L.=2.073

FIG. 2C

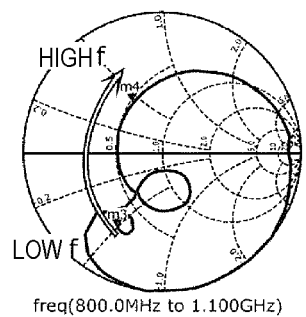

IMPEDANCE CHARACTERISTICS:
Port1
(EVEN-NUMBERED IDT SIDE)

m3
freq=925.0MHz
$\rho/\theta$=0.612/-122.025
impedance=
Z0*(0.309-j0.513)

m4
freq=960.0MHz
$\rho/\theta$=0.428/117.815
impedance=
Z0*(0.516+j0.478)

FIG. 2D

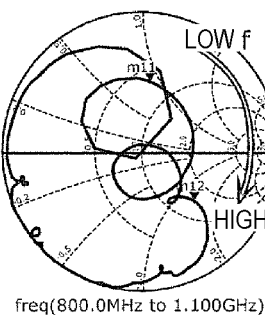

IMPEDANCE CHARACTERISTICS:
Port2
(ODD-NUMBERED IDT SIDE)

m11
freq=925.0MHz
$\rho/\theta$=0.525/82.669
impedance=
Z0*(0.634+j0.913)

m12
freq=960.0MHz
$\rho/\theta$=0.511/-42.266
impedance=
Z0*(1.464-j1.362)

PARALLEL ARM RESONATOR CONFIGURATION

BANDPASS CHARACTERISTICS

| m21 |
| --- |
| freq=925.0MHz |
| I.L.=2.333 |

| m22 |
| --- |
| freq=960.0MHz |
| I.L.=0.031 |

IMPEDANCE CHARACTERISTICS: Port1 and Port2

| m5 |
| --- |
| freq=925.0MHz |
| $\rho/\theta$=0.571/130.499 |
| impedance= Z0*(0.326+j0.420) |

| m6 |
| --- |
| freq=960.0MHz |
| $\rho/\theta$=0.040/-96.278 |
| impedance= Z0*(0.988-j0.080) | freq(800.0MHz to 1.100GHz)

SERIES ARM RESONATOR CONFIGURATION

BANDPASS CHARACTERISTICS

| m23 |
| --- |
| freq=925.0MHz |
| I.L.=0.141 |

| m24 |
| --- |
| freq=960.0MHz |
| I.L.=2.684 |

IMPEDANCE CHARACTERISTICS:
Port1 and Port2

| m7 |
| --- |
| freq=925.0MHz |
| $\rho/\theta$=0.144/-79.481 |
| impedance= |
| Z0*(1.011-j0.293) |

| m8 |
| --- |
| freq=960.0MHz |
| $\rho/\theta$=0.624/47.047 |
| impedance= |
| Z0*(1.133+j1.695) | freq(800.0MHz to 1.100GHz)

FIG. 5A
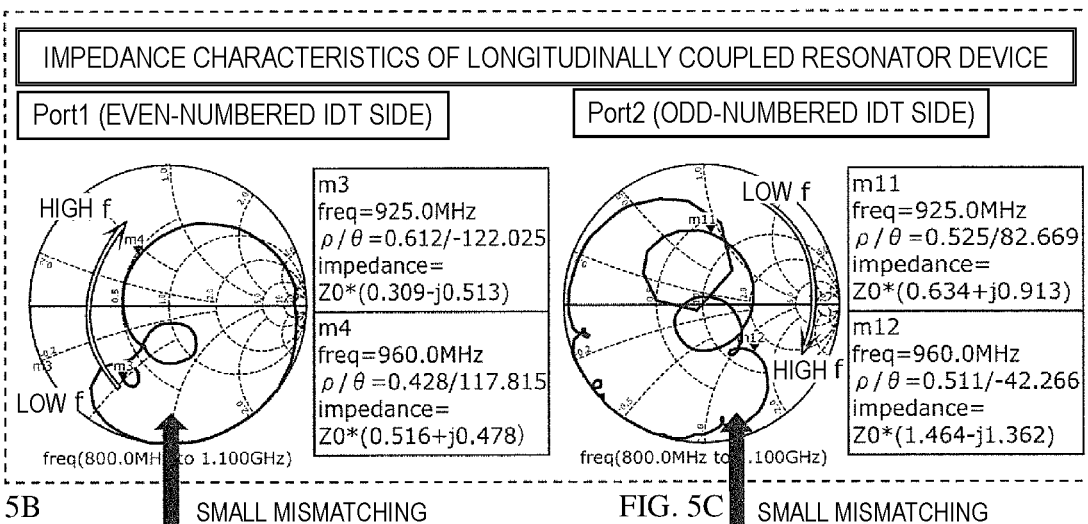
FIG. 5B
FIG. 5C
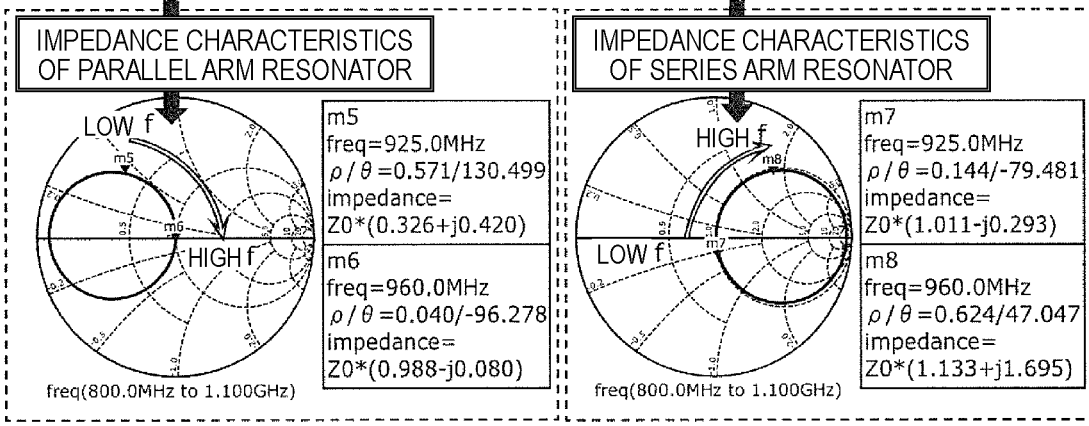

FIG. 7A

SERIES ARM RESONATOR ON EVEN-NUMBERED IDT SIDE
PARALLEL ARM RESONATOR ON ODD-NUMBERED IDT SIDE

CONFIGURATION

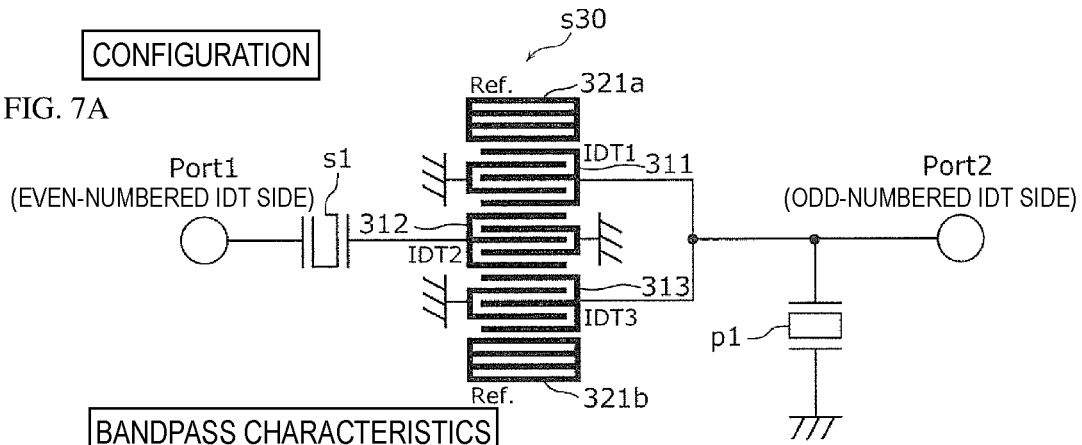

FIG. 7B

BANDPASS CHARACTERISTICS

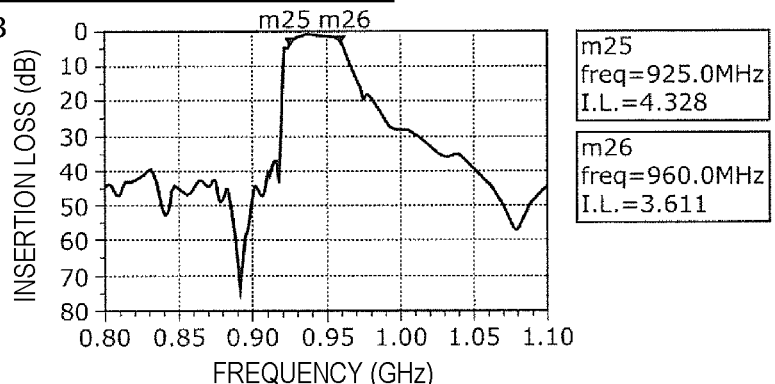

m25
freq=925.0MHz
I.L.=4.328 m26
freq=960.0MHz
I.L.=3.611

FIG. 7C

IMPEDANCE CHARACTERISTICS:
Port1
(CLOSER TO SERIES ARM RESONATOR)

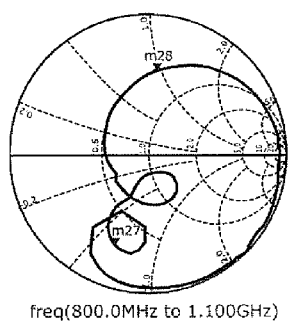

m27
freq=925.0MHz
ρ/θ=0.710/-109.999
impedance=
Z0*(0.249-j0.671)

m28
freq=960.0MHz
ρ/θ=0.603/83.951
impedance=
Z0*(0.514+j0.970)

freq(800.0MHz to 1.100GHz)

FIG. 7D

IMPEDANCE CHARACTERISTICS:
Port2
(CLOSER TO PARALLEL ARM RESONATOR)

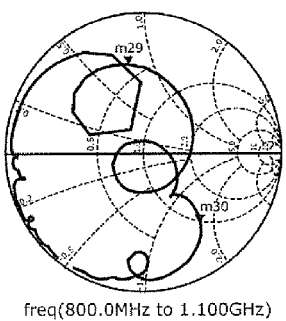

m29
freq=925.0MHz
ρ/θ=0.644/99.422
impedance=
Z0*(0.360+j0.782)

m30
freq=960.0MHz
ρ/θ=0.662/-50.626
impedance=
Z0*(0.939-j1.710)

freq(800.0MHz to 1.100GHz)

FIG. 8A

LADDER CIRCUIT (WITH VARIABLE FREQUENCY CIRCUIT) CONFIGURATION

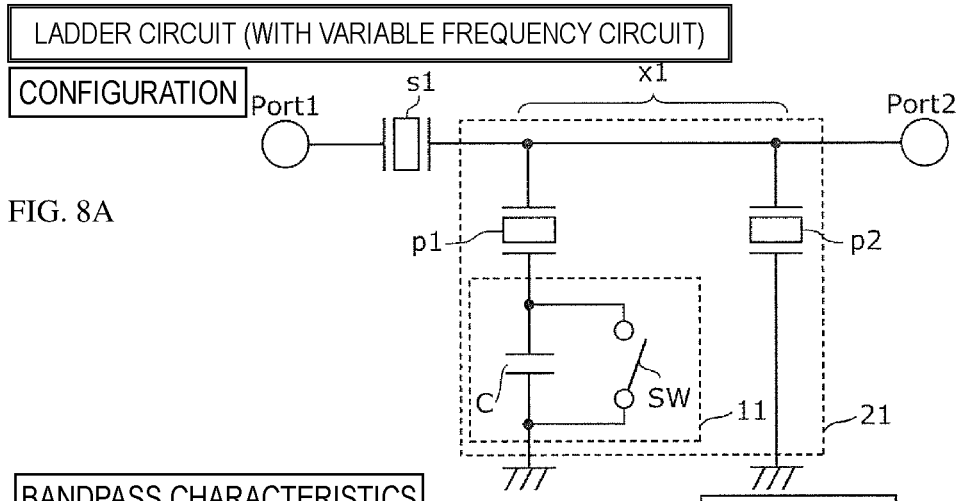

FIG. 8B

BANDPASS CHARACTERISTICS

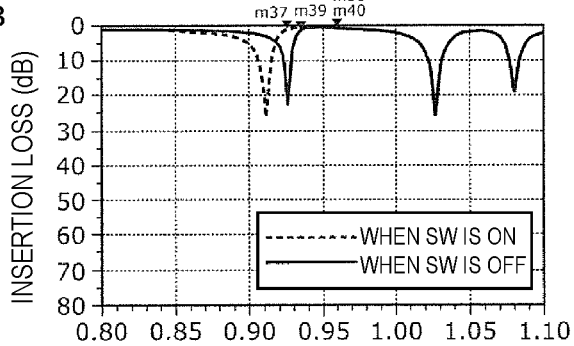

------- WHEN SW IS ON
——— WHEN SW IS OFF

| m37 |
|---|
| freq=925.0MHz |
| I.L.=0.749 |

| m38 |
|---|
| freq=960.0MHz |
| I.L.=0.400 |

| m39 |
|---|
| freq=935.0MHz |
| I.L.=0.946 |

| m40 |
|---|
| freq=960.0MHz |
| I.L.=0.384 |

FIG. 8C

IMPEDANCE CHARACTERISTICS:Port1 (CLOSER TO SERIES ARM RESONATOR)

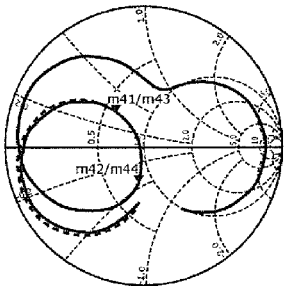

freq(800.0MHz to 1.100GHz)

------- WHEN SW IS ON
——— WHEN SW IS OFF

| m41 |
|---|
| freq=925.0MHz |
| ρ/θ =0.311/128.282 |
| impedance= |
| Z0*(0.609+j0.330) |

| m42 |
|---|
| freq=960.0MHz |
| ρ/θ =0.266/-97.882 |
| impedance= |
| Z0*(0.812-j0.461) |

| m43 |
|---|
| freq=935.0MHz |
| ρ/θ =0.324/130.346 |
| impedance= |
| Z0*(0.587+j0.324) |

| m44 |
|---|
| freq=960.0MHz |
| ρ/θ =0.256/-97.549 |
| impedance= |
| Z0*(0.825-j0.448) |

FIG. 8D

IMPEDANCE CHARACTERISTICS: Port2 (CLOSER TO PARALLEL ARM RESONATOR)

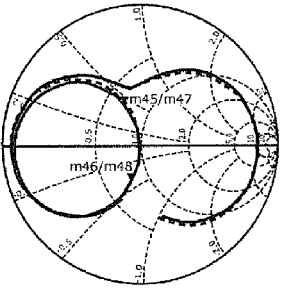

freq(800.0MHz to 1.100GHz)

------- WHEN SW IS ON
——— WHEN SW IS OFF

| m45 |
|---|
| freq=925.0MHz |
| ρ/θ =0.314/112.135 |
| impedance= |
| Z0*(0.675+j0.436) |

| m46 |
|---|
| freq=960.0MHz |
| ρ/θ =0.268/-105.720 |
| impedance= |
| Z0*(0.763-j0.424) |

| m47 |
|---|
| freq=935.0MHz |
| ρ/θ =0.327/115.847 |
| impedance= |
| Z0*(0.642+j0.423) |

| m48 |
|---|
| freq=960.0MHz |
| ρ/θ =0.258/-105.333 |
| impedance= |
| Z0*(0.776-j0.413) |

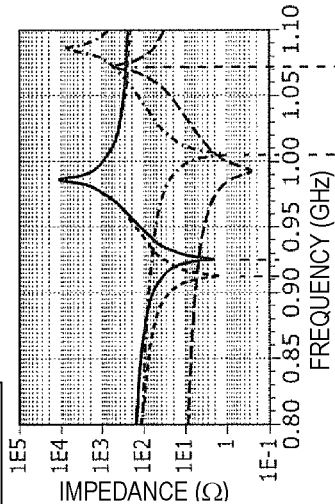
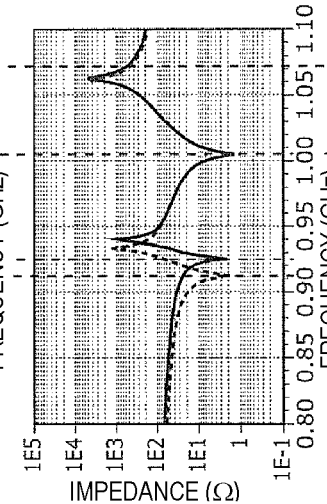
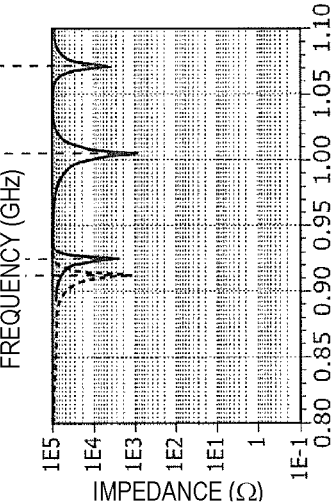

LADDER CIRCUIT (WITH VARIABLE FREQUENCY CIRCUIT) CHARACTERISTICS

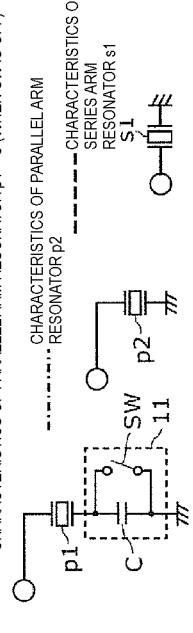

FIG. 9A
SINGLE RESONATOR CHARACTERISTICS (IMPEDANCE CHARACTERISTICS)

······ CHARACTERISTICS OF PARALLEL ARM RESONATOR p1 (WHEN SW IS ON)
——— CHARACTERISTICS OF PARALLEL ARM RESONATOR p1 + C (WHEN SW IS OFF)
— — — CHARACTERISTICS OF PARALLEL ARM RESONATOR p2
——— CHARACTERISTICS OF SERIES ARM RESONATOR s1

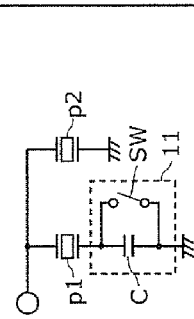

FIG. 9B
COMBINED CHARACTERISTICS (IMPEDANCE CHARACTERISTICS) OF PARALLEL ARM

······ WHEN SW IS ON
——— WHEN SW IS OFF

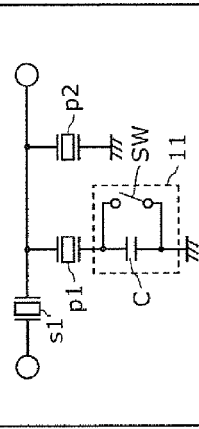

FIG. 9C
FILTER CHARACTERISTICS (BANDPASS CHARACTERISTICS)

······ WHEN SW IS ON
——— WHEN SW IS OFF

FIRST CONFIGURATION EXAMPLE (FIRST EXAMPLE)

IMPEDANCE CHARACTERISTICS:
Port1
(EVEN-NUMBERED IDT SIDE)

IMPEDANCE CHARACTERISTICS:
Port2
(ODD-NUMBERED IDT SIDE)

FIG. 12C

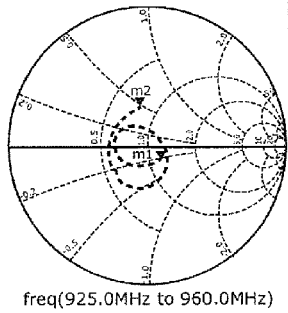

m1
freq=925.0MHz
ρ/θ=0.134/-41.575
impedance=
Z0*(1.202-j0.218)

m2
freq=960.0MHz
ρ/θ=0.291/98.205
impedance=
Z0*(0.784+j0.493)

freq(925.0MHz to 960.0MHz)

FIG. 12D

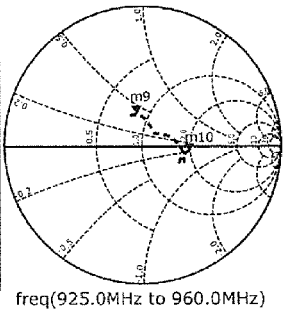

m9
freq=925.0MHz
ρ/θ=0.249/97.864
impedance=
Z0*(0.830+j0.436)

m10
freq=960.0MHz
ρ/θ=0.383/-5.137
impedance=
Z0*(2.224-j0.179)

freq(925.0MHz to 960.0MHz)

FIG. 12E

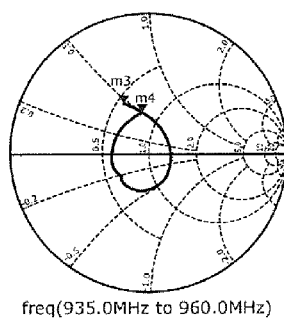

m3
freq=935.0MHz
ρ/θ=0.412/118.311
impedance=
Z0*(0.533-j0.465)

m4
freq=960.0MHz
ρ/θ=0.300/99.248
impedance=
Z0*(0.767+j0.499)

freq(935.0MHz to 960.0MHz)

FIG. 12F

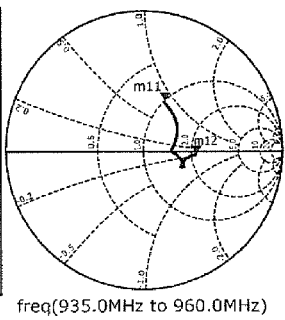

m11
freq=935.0MHz
ρ/θ=0.383/66.176
impedance=
Z0*(1.019+j0.836)

m12
freq=960.0MHz
ρ/θ=0.390/-4.809
impedance=
Z0*(2.262-j0.174)

freq(935.0MHz to 960.0MHz)

-------- WHEN SW IS ON
———— WHEN SW IS OFF

SECOND CONFIGURATION EXAMPLE (SECOND EXAMPLE)

| IMPEDANCE CHARACTERISTICS: Port1 (EVEN-NUMBERED IDT SIDE) | IMPEDANCE CHARACTERISTICS: Port2 (ODD-NUMBERED IDT SIDE) |
|---|---|

FIG. 13C

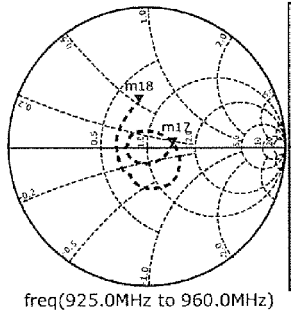

m17
freq=925.0MHz
ρ/θ =0.175/-0.089
impedance=
Z0*(1.425-j8.002E-4)

m18
freq=960.0MHz
ρ/θ =0.329/99.310
impedance=
Z0*(0.734+j0.535)

freq(925.0MHz to 960.0MHz)

FIG. 13D

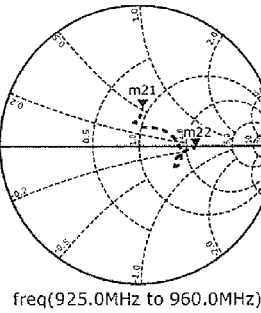

m21
freq=925.0MHz
ρ/θ =0.265/85.539
impedance=
Z0*(0.904+j0.513)

m22
freq=960.0MHz
ρ/θ =0.403/-4.003
impedance=
Z0*(2.338-j0.157)

freq(925.0MHz to 960.0MHz)

FIG. 13E

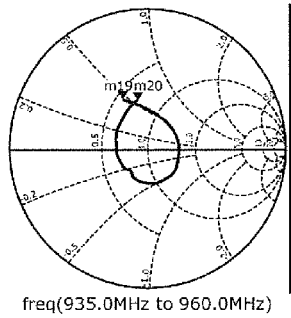

m19
freq=935.0MHz
ρ/θ =0.376/118.079
impedance=
Z0*(0.575-j0.444)

m20
freq=960.0MHz
ρ/θ =0.338/100.560
impedance=
Z0*(0.715+j0.537)

freq(935.0MHz to 960.0MHz)

FIG. 13F

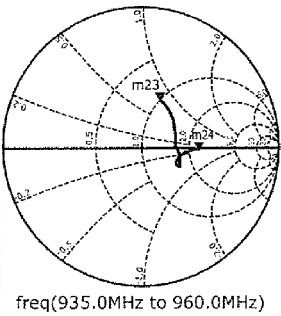

m23
freq=935.0MHz
ρ/θ =0.356/70.383
impedance=
Z0*(0.984+j0.756)

m24
freq=960.0MHz
ρ/θ =0.410/-3.693
impedance=
Z0*(2.378-j0.151)

freq(935.0MHz to 960.0MHz)

- - - - - - - WHEN SW IS ON
———— WHEN SW IS OFF

| m25 |
| --- |
| freq=925.0MHz |
| I.L.=1.789 |

| m26 |
| --- |
| freq=960.0MHz |
| I.L.=1.936 |

| m27 |
| --- |
| freq=935.0MHz |
| I.L.=1.586 |

| m28 |
| --- |
| freq=960.0MHz |
| I.L.=1.950 |

THIRD CONFIGURATION EXAMPLE (THIRD EXAMPLE)

IMPEDANCE CHARACTERISTICS: Port1 (EVEN-NUMBERED IDT SIDE)

IMPEDANCE CHARACTERISTICS: Port2 (ODD-NUMBERED IDT SIDE)

FIG. 14C

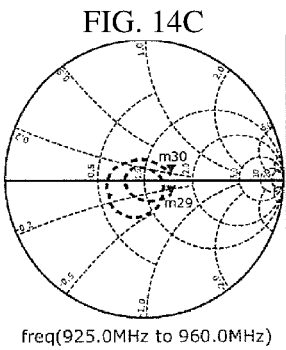

| m29 |
|---|
| freq=925.0MHz |
| $\rho/\theta$ =0.236/-21.302 |
| impedance= |
| Z0*(1.532-j0.278) |

| m30 |
|---|
| freq=960.0MHz |
| $\rho/\theta$ =0.212/8.969 |
| impedance= |
| Z0*(1.525+j0.105) | freq(925.0MHz to 960.0MHz)

FIG. 14D

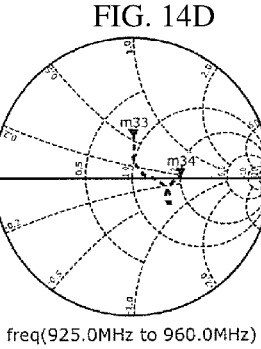

| m33 |
|---|
| freq=925.0MHz |
| $\rho/\theta$ =0.308/87.850 |
| impedance= |
| Z0*(0.844+j0.575) |

| m34 |
|---|
| freq=960.0MHz |
| $\rho/\theta$ =0.358/4.134 |
| impedance= |
| Z0*(2.105-j0.125) | freq(925.0MHz to 960.0MHz)

FIG. 14E

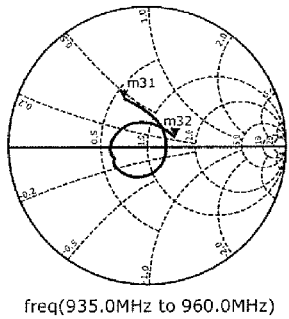

| m31 |
|---|
| freq=935.0MHz |
| $\rho/\theta$ =0.373/116.642 |
| impedance= |
| Z0*(0.584+j0.453) |

| m32 |
|---|
| freq=960.0MHz |
| $\rho/\theta$ =0.212/12.874 |
| impedance= |
| Z0*(1.513+j0.150) | freq(935.0MHz to 960.0MHz)

FIG. 14F

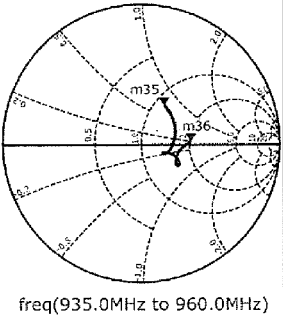

| m35 |
|---|
| freq=935.0MHz |
| $\rho/\theta$ =0.328/60.448 |
| impedance= |
| Z0*(1.138+j0.728) |

| m36 |
|---|
| freq=960.0MHz |
| $\rho/\theta$ =0.362/3.372 |
| impedance= |
| Z0*(2.128+j0.104) | freq(935.0MHz to 960.0MHz)

--------- WHEN SW IS ON
——— WHEN SW IS OFF

FOURTH CONFIGURATION EXAMPLE (FIRST COMPARATIVE EXAMPLE)
CONFIGURATION
FIG. 15A
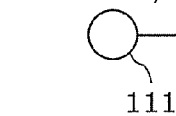
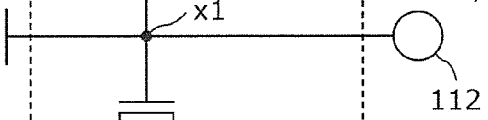
FIG. 15B
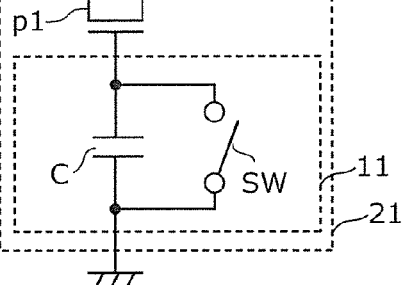
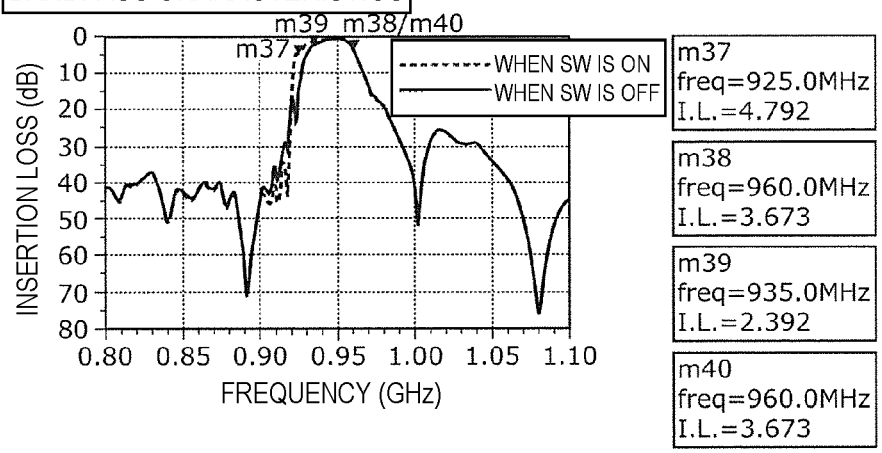

FOURTH CONFIGURATION EXAMPLE (FIRST COMPARATIVE EXAMPLE)

| IMPEDANCE CHARACTERISTICS: Port1 (EVEN-NUMBERED IDT SIDE) | IMPEDANCE CHARACTERISTICS: Port2 (ODD-NUMBERED IDT SIDE) |
|---|---|

FIG. 15C

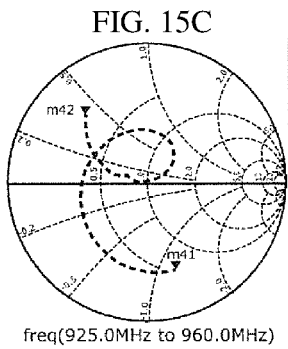

m41
freq=925.0MHz
$\rho/\theta$ =0.673/-71.868
impedance=
Z0*(0.529-j1.237)

m42
freq=960.0MHz
$\rho/\theta$ =0.653/130.982
impedance=
Z0*(0.251+j0.432)

freq(925.0MHz to 960.0MHz)

FIG. 15D

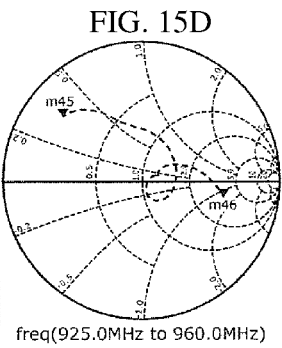

m45
freq=925.0MHz
$\rho/\theta$ =0.736/140.123
impedance=
Z0*(0.172+j0.353)

m46
freq=960.0MHz
$\rho/\theta$ =0.633/-13.349
impedance=
Z0*(3.549-j1.732)

freq(925.0MHz to 960.0MHz)

FIG. 15E

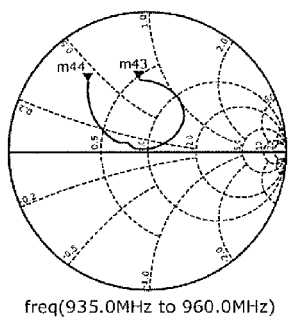

m43
freq=935.0MHz
$\rho/\theta$ =0.514/97.747
impedance=
Z0*(0.525+j0.726)

m44
freq=960.0MHz
$\rho/\theta$ =0.653/130.661
impedance=
Z0*(0.252+j0.435)

freq(935.0MHz to 960.0MHz)

FIG. 15F

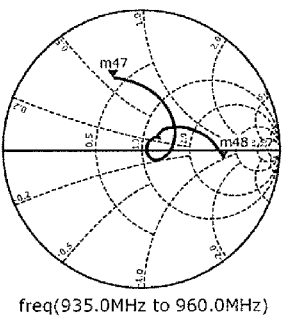

m47
freq=935.0MHz
$\rho/\theta$ =0.537/111.756
impedance=
Z0*(0.422+j0.591)

m48
freq=960.0MHz
$\rho/\theta$ =0.630/-11.332
impedance=
Z0*(3.736-j1.535)

freq(935.0MHz to 960.0MHz)

--------WHEN SW IS ON
————WHEN SW IS OFF

FIFTH CONFIGURATION EXAMPLE (SECOND COMPARATIVE EXAMPLE)

CONFIGURATION

BANDPASS CHARACTERISTICS

FIFTH CONFIGURATION EXAMPLE (SECOND COMPARATIVE EXAMPLE)

| IMPEDANCE CHARACTERISTICS: Port1 (EVEN-NUMBERED IDT SIDE) | IMPEDANCE CHARACTERISTICS: Port2 (ODD-NUMBERED IDT SIDE) |
|---|---|

FIG. 16C

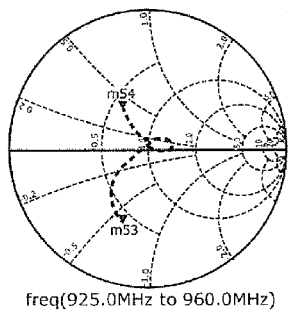

m53
freq=925.0MHz
ρ/θ =0.566/-107.720
impedance=
Z0*(0.408-j0.648)

m54
freq=960.0MHz
ρ/θ =0.346/121.249
impedance=
Z0*(0.595+j0.400)

freq(925.0MHz to 960.0MHz)

FIG. 16D

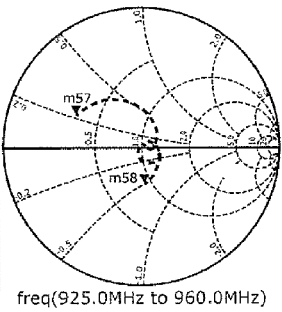

m57
freq=925.0MHz
ρ/θ =0.526/155.999
impedance=
Z0*(0.323+j0.191)

m58
freq=960.0MHz
ρ/θ =0.276/-87.451
impedance=
Z0*(0.879-j0.524)

freq(925.0MHz to 960.0MHz)

FIG. 16E

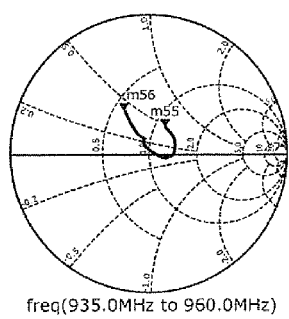

m55
freq=935.0MHz
ρ/θ =0.220/59.908
impedance=
Z0*(1.150+j0.459)

m56
freq=960.0MHz
ρ/θ =0.348/119.326
impedance=
Z0*(0.601+j0.415)

freq(935.0MHz to 960.0MHz)

FIG. 16F

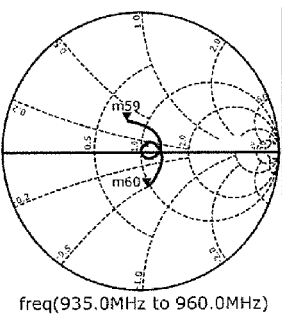

m59
freq=935.0MHz
ρ/θ =0.231/116.233
impedance=
Z0*(0.753+j0.329)

m60
freq=960.0MHz
ρ/θ =0.271/-82.054
impedance=
Z0*(0.928-j0.538)

freq(935.0MHz to 960.0MHz)

--------WHEN SW IS ON
————WHEN SW IS OFF

SIXTH CONFIGURATION EXAMPLE (FOURTH EXAMPLE)

CONFIGURATION

BANDPASS CHARACTERISTICS

SIXTH CONFIGURATION EXAMPLE (FOURTH EXAMPLE)

| IMPEDANCE CHARACTERISTICS: Port1 (EVEN-NUMBERED IDT SIDE) | IMPEDANCE CHARACTERISTICS: Port2 (ODD-NUMBERED IDT SIDE) |
|---|---|

FIG. 17C

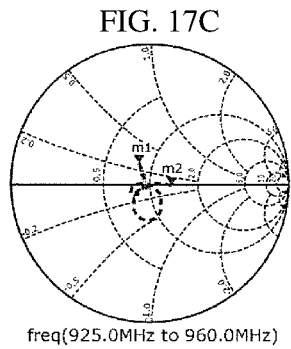

m1
freq=925.0MHz
$\rho/\theta$ =0.168/113.138
impedance=
Z0*(0.837+j0.267)

m2
freq=960.0MHz
$\rho/\theta$ =0.183/-7.445
impedance=
Z0*(1.441+j0.071)

freq(925.0MHz to 960.0MHz)

FIG. 17D

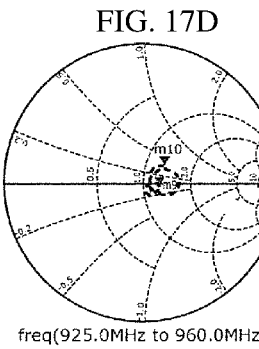

m9
freq=925.0MHz
$\rho/\theta$ =0.116/-21.497
impedance=
Z0*(1.238-j0.107)

m10
freq=960.0MHz
$\rho/\theta$ =0.193/35.260
impedance=
Z0*(1.333+j0.308)

freq(925.0MHz to 960.0MHz)

FIG. 17E

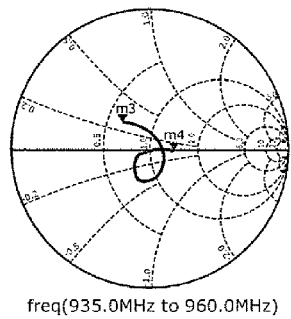

m3
freq=935.0MHz
$\rho/\theta$ =0.287/131.820
impedance=
Z0*(0.626+j0.292)

m4
freq=960.0MHz
$\rho/\theta$ =0.181/-2.403
impedance=
Z0*(1.440-j0.023)

freq(935.0MHz to 960.0MHz)

FIG. 17F

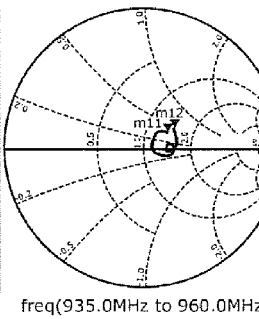

m11
freq=935.0MHz
$\rho/\theta$ =0.243/36.249
impedance=
Z0*(1.411+j0.432)

m12
freq=960.0MHz
$\rho/\theta$ =0.194/32.620
impedance=
Z0*(1.353+j0.294)

freq(935.0MHz to 960.0MHz)

--------- WHEN SW IS ON
———— WHEN SW IS OFF

| SEVENTH CONFIGURATION EXAMPLE (FIFTH EXAMPLE) |

| IMPEDANCE CHARACTERISTICS: Port1 (EVEN-NUMBERED IDT SIDE) | IMPEDANCE CHARACTERISTICS: Port2 (ODD-NUMBERED IDT SIDE) |

FIG. 18C

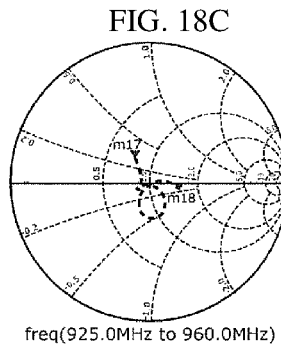

m17
freq=925.0MHz
$\rho/\theta$ =0.211/118.123
impedance=
Z0*(0.769+j0.299)

m18
freq=960.0MHz
$\rho/\theta$ =0.238/-21.411
impedance=
Z0*(1.538-j0.284)

freq(925.0MHz to 960.0MHz)

FIG. 18D

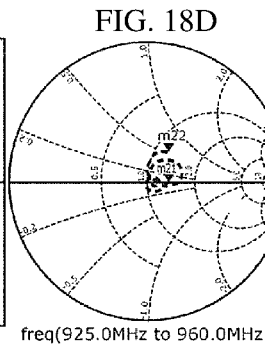

m21
freq=925.0MHz
$\rho/\theta$ =0.150/-3.035
impedance=
Z0*(1.351-j0.022)

m22
freq=960.0MHz
$\rho/\theta$ =0.248/50.980
impedance=
Z0*(1.252+j0.514)

freq(925.0MHz to 960.0MHz)

FIG. 18E

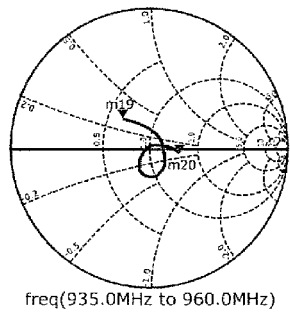

m19
freq=935.0MHz
$\rho/\theta$ =0.284/131.331
impedance=
Z0*(0.632+j0.293)

m20
freq=960.0MHz
$\rho/\theta$ =0.232/-17.543
impedance=
Z0*(1.548-j0.229)

freq(935.0MHz to 960.0MHz)

FIG. 18F

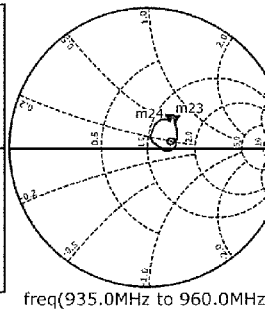

m11
freq=935.0MHz
$\rho/\theta$ =0.257/44.827
impedance=
Z0*(1.331+j0.517)

m24
freq=960.0MHz
$\rho/\theta$ =0.245/49.076
impedance=
Z0*(1.272+j0.500)

freq(935.0MHz to 960.0MHz)

--------WHEN SW IS ON
————WHEN SW IS OFF

EIGHTH CONFIGURATION EXAMPLE (SIXTH EXAMPLE)

CONFIGURATION

BANDPASS CHARACTERISTICS

| m25 freq=925.0MHz I.L.=1.841 |
| m26 freq=960.0MHz I.L.=1.275 |
| m27 freq=935.0MHz I.L.=1.306 |
| m28 freq=960.0MHz I.L.=1.288 |

EIGHTH CONFIGURATION EXAMPLE (SIXTH EXAMPLE)

IMPEDANCE CHARACTERISTICS:
Port1
(EVEN-NUMBERED IDT SIDE)

IMPEDANCE CHARACTERISTICS:
Port2
(ODD-NUMBERED IDT SIDE)

FIG. 19C

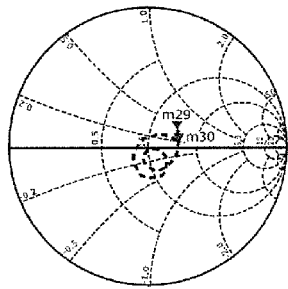

m29
freq=925.0MHz
$\rho/\theta$ =0.238/28.447
impedance=
Z0*(1.479+j0.356)

m30
freq=960.0MHz
$\rho/\theta$ =0.231/3.083
impedance=
Z0*(1.600+j0.042)

freq(925.0MHz to 960.0MHz)

FIG. 19D

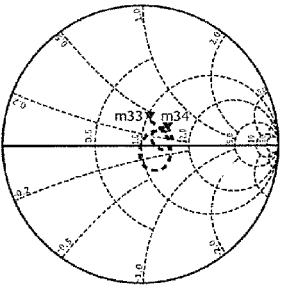

m33
freq=925.0MHz
$\rho/\theta$ =0.192/69.188
impedance=
Z0*(1.070-j0.398)

m34
freq=960.0MHz
$\rho/\theta$ =0.234/19.937
impedance=
Z0*(1.537+j0.259)

freq(925.0MHz to 960.0MHz)

FIG. 19E

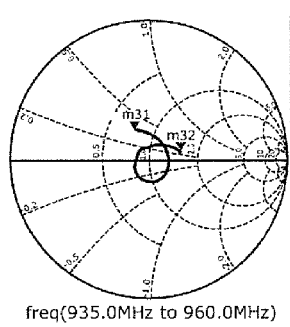

m31
freq=935.0MHz
$\rho/\theta$ =0.232/116.324
impedance=
Z0*(0.752+j0.330)

m32
freq=960.0MHz
$\rho/\theta$ =0.231/7.182
impedance=
Z0*(1.591+j0.097)

freq(935.0MHz to 960.0MHz)

FIG. 19F

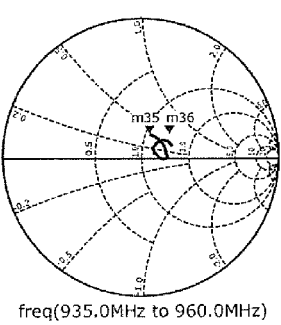

m35
freq=935.0MHz
$\rho/\theta$ =0.176/70.020
impedance=
Z0*(1.064+j0.363)

m36
freq=960.0MHz
$\rho/\theta$ =0.235/17.989
impedance=
Z0*(1.555+j0.239)

freq(935.0MHz to 960.0MHz)

--------- WHEN SW IS ON
——— WHEN SW IS OFF

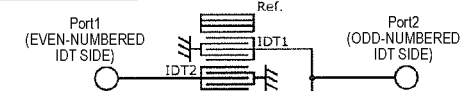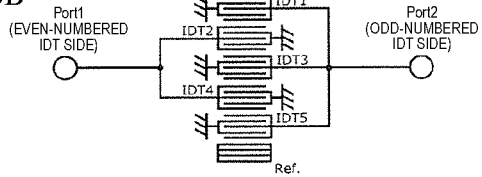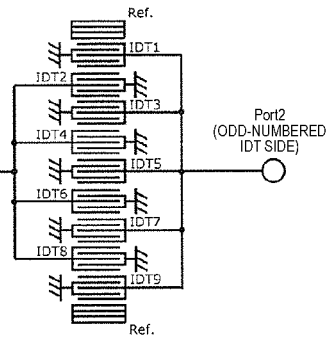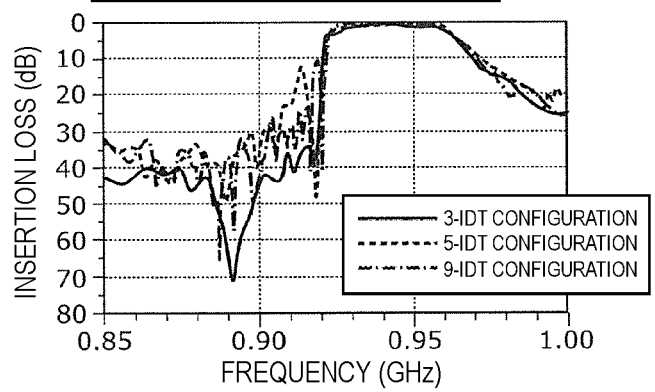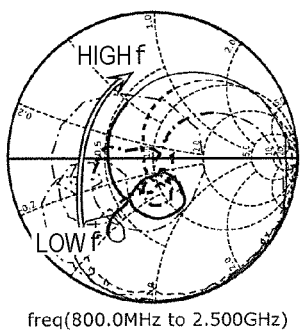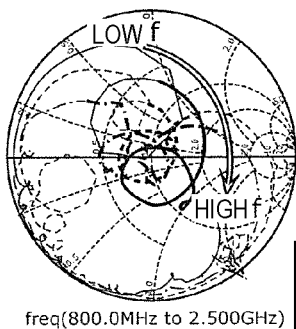

FIG. 22A
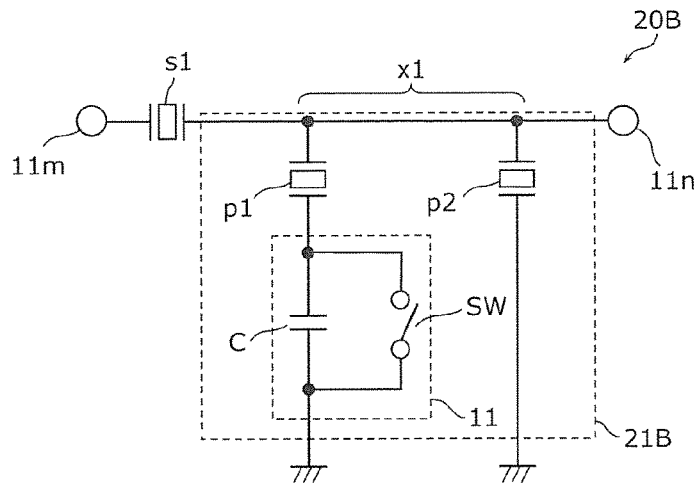
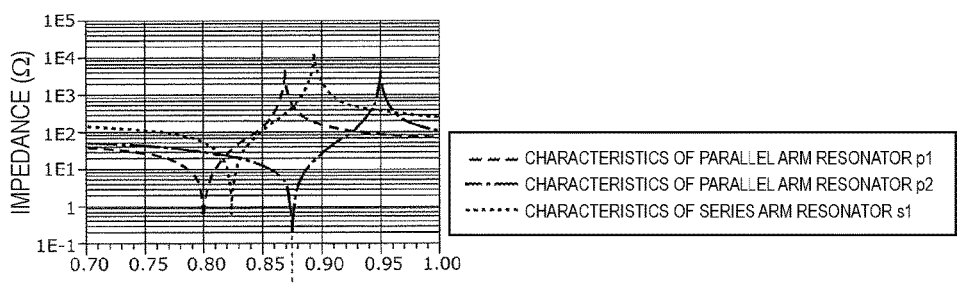
FIG. 22B
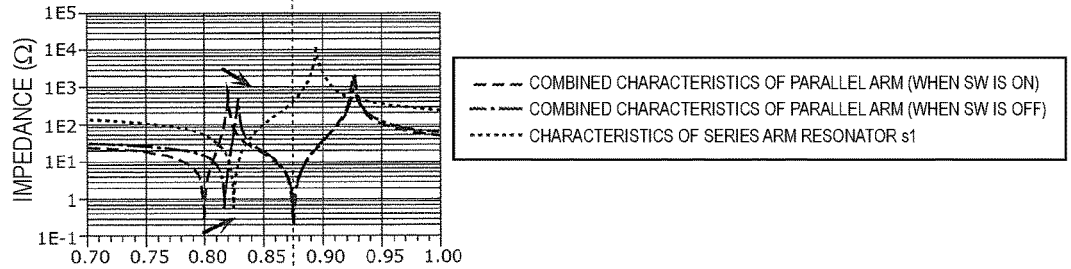
FIG. 22C
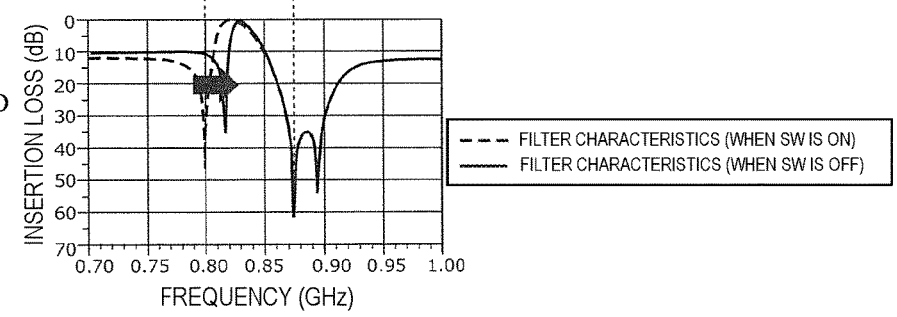
FIG. 22D

FIG. 23A

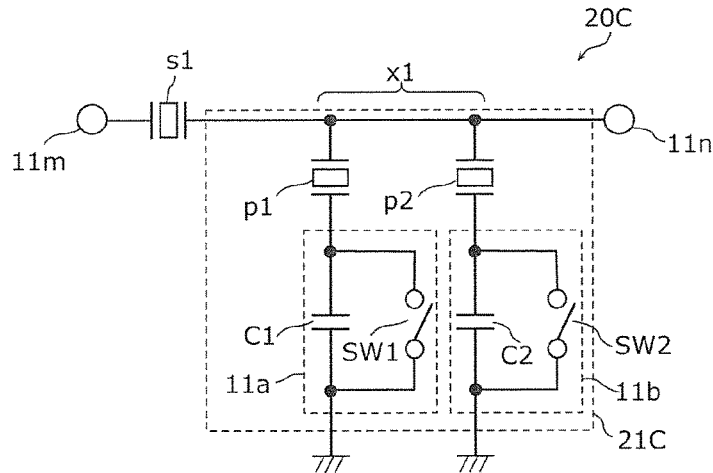

FIG. 23B

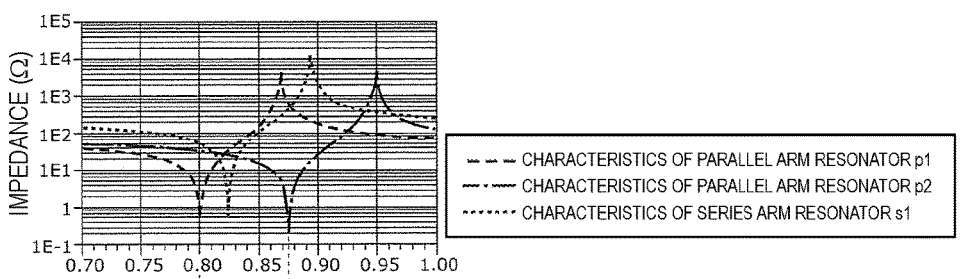

– – – CHARACTERISTICS OF PARALLEL ARM RESONATOR p1
– · – CHARACTERISTICS OF PARALLEL ARM RESONATOR p2
······· CHARACTERISTICS OF SERIES ARM RESONATOR s1

FIG. 23C

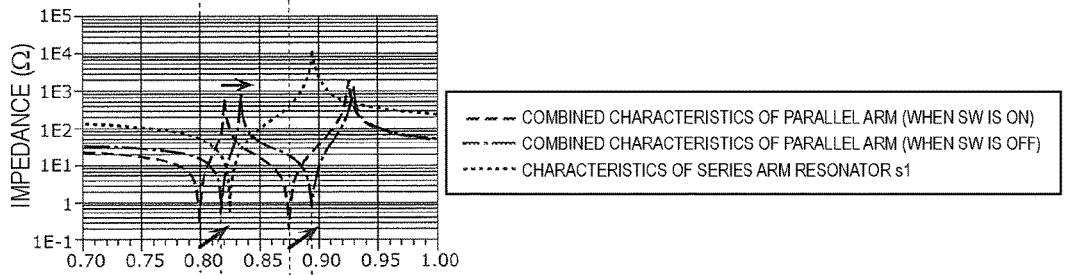

– – – COMBINED CHARACTERISTICS OF PARALLEL ARM (WHEN SW IS ON)
– · – COMBINED CHARACTERISTICS OF PARALLEL ARM (WHEN SW IS OFF)
······· CHARACTERISTICS OF SERIES ARM RESONATOR s1

FIG. 23D

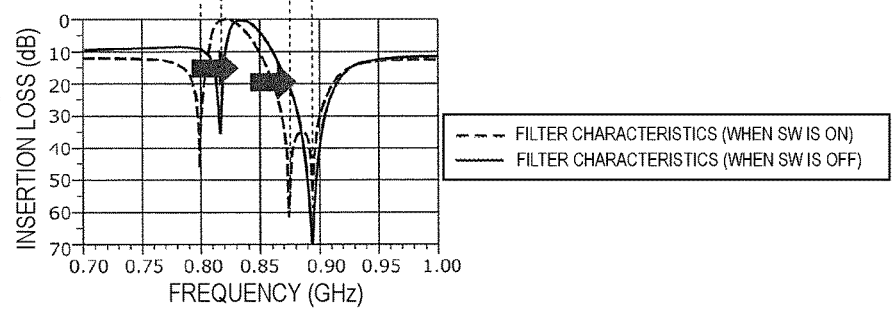

– – – FILTER CHARACTERISTICS (WHEN SW IS ON)
―― FILTER CHARACTERISTICS (WHEN SW IS OFF)

FIG. 24A

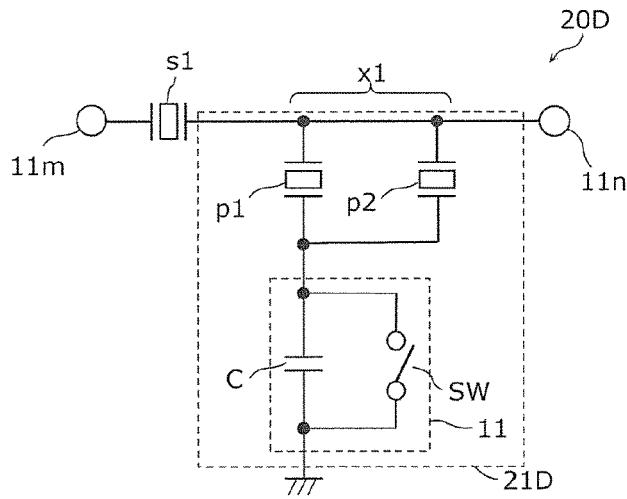

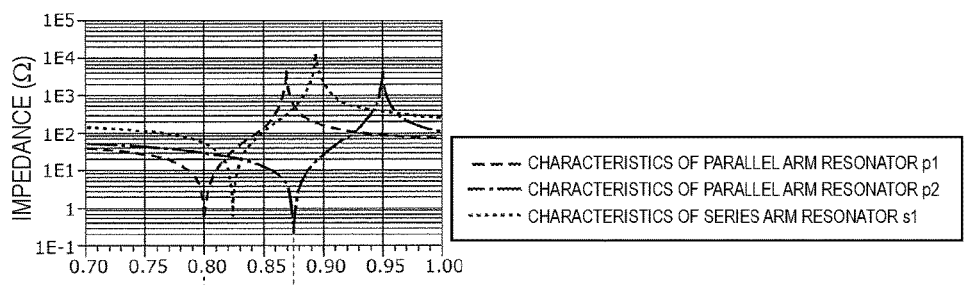

FIG. 24B

- - - CHARACTERISTICS OF PARALLEL ARM RESONATOR p1
- · - CHARACTERISTICS OF PARALLEL ARM RESONATOR p2
· · · · · CHARACTERISTICS OF SERIES ARM RESONATOR s1

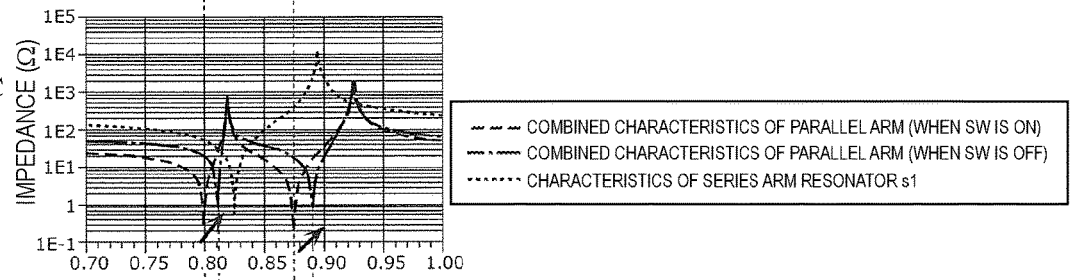

FIG. 24C

- - - COMBINED CHARACTERISTICS OF PARALLEL ARM (WHEN SW IS ON)
- · - COMBINED CHARACTERISTICS OF PARALLEL ARM (WHEN SW IS OFF)
· · · · · CHARACTERISTICS OF SERIES ARM RESONATOR s1

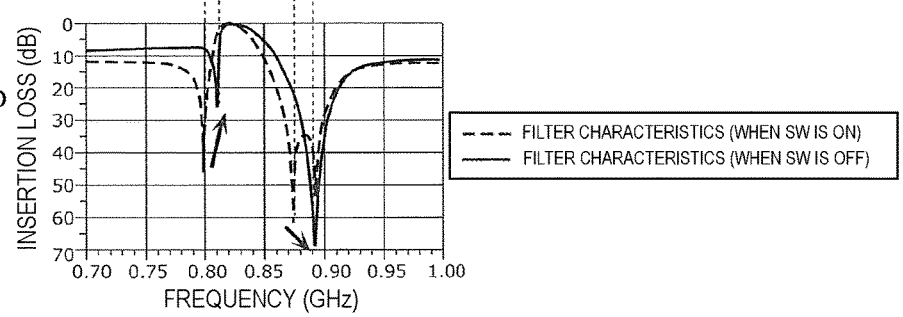

FIG. 24D

- - - FILTER CHARACTERISTICS (WHEN SW IS ON)
——— FILTER CHARACTERISTICS (WHEN SW IS OFF)

FIG. 27A

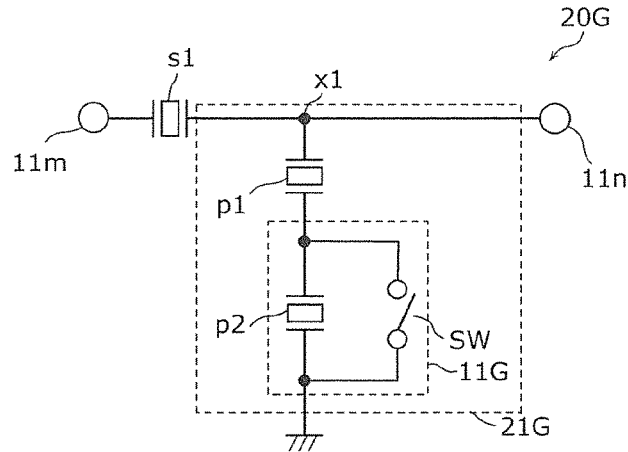

FIG. 27B

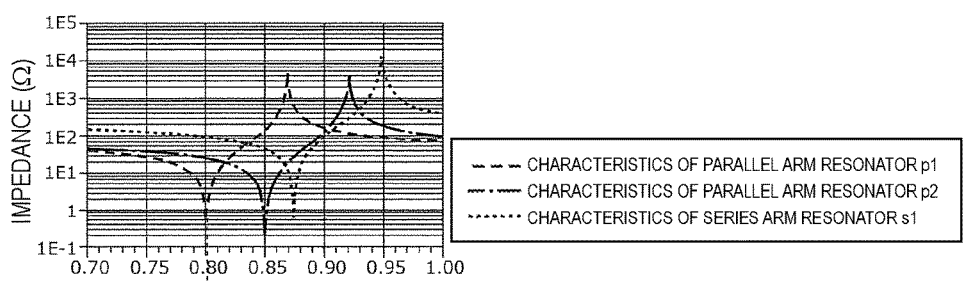

– – – CHARACTERISTICS OF PARALLEL ARM RESONATOR p1
— · — CHARACTERISTICS OF PARALLEL ARM RESONATOR p2
·······  CHARACTERISTICS OF SERIES ARM RESONATOR s1

FIG. 27C

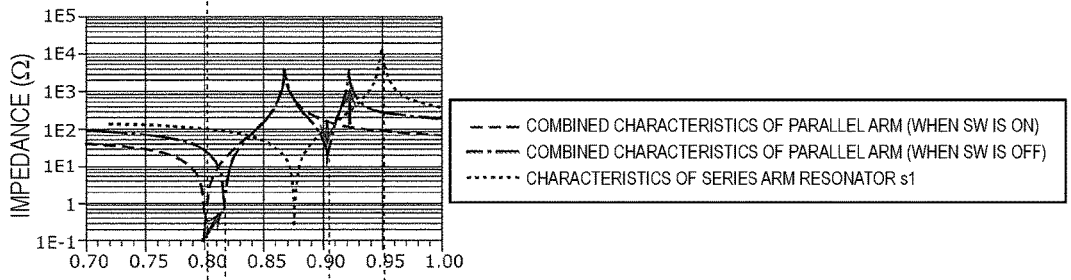

– – – COMBINED CHARACTERISTICS OF PARALLEL ARM (WHEN SW IS ON)
— · — COMBINED CHARACTERISTICS OF PARALLEL ARM (WHEN SW IS OFF)
·······  CHARACTERISTICS OF SERIES ARM RESONATOR s1

FIG. 27D

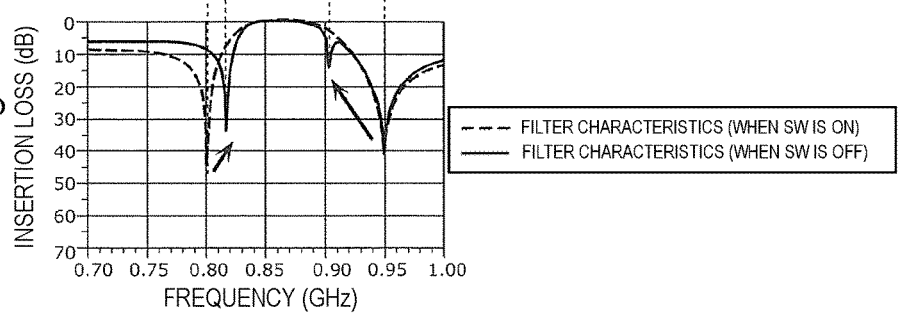

– – – FILTER CHARACTERISTICS (WHEN SW IS ON)
——— FILTER CHARACTERISTICS (WHEN SW IS OFF)

FIG. 28A
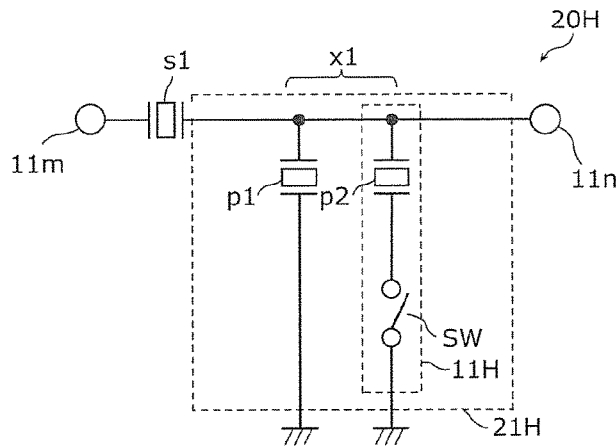
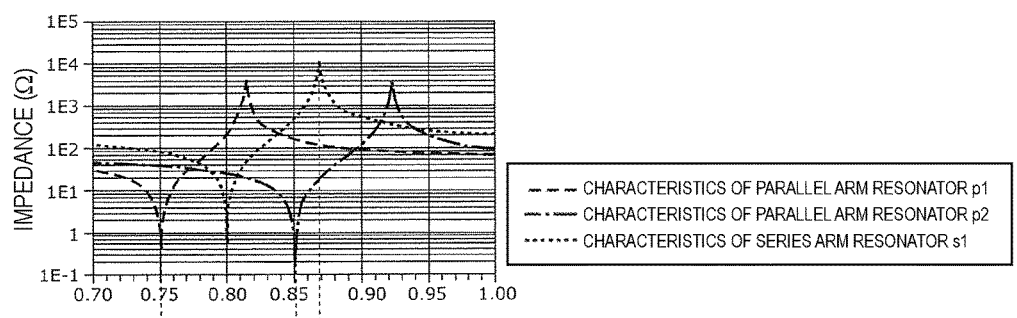
FIG. 28B
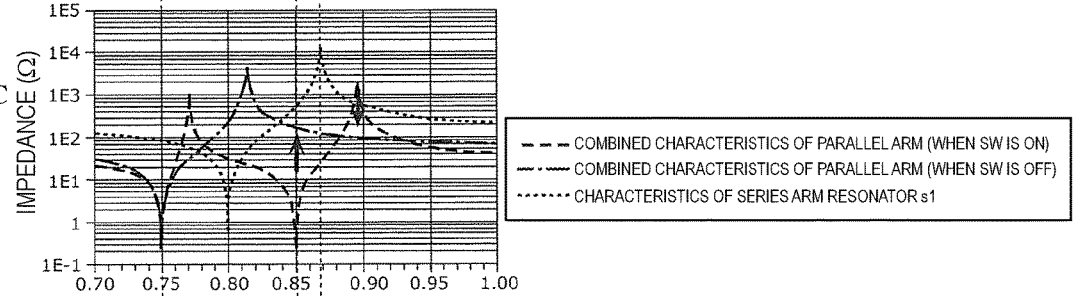
FIG. 28C
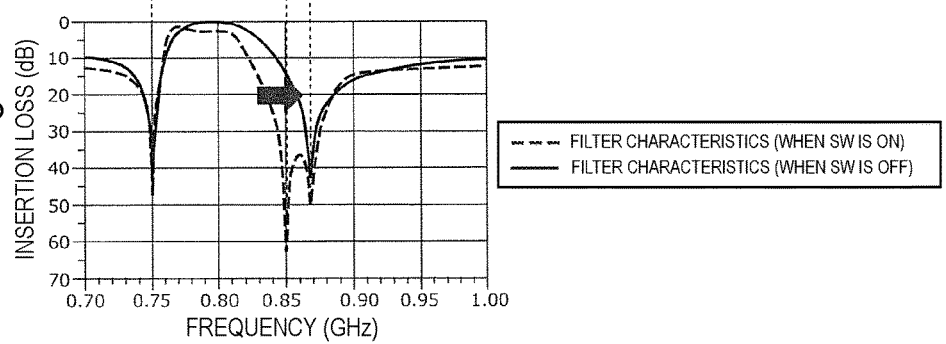
FIG. 28D

ELASTIC WAVE FILTER DEVICE, RADIO-FREQUENCY FRONT-END CIRCUIT, AND COMMUNICATION APPARATUS

This is a continuation of International Application No. PCT/JP2017/033142 filed on Sep. 13, 2017 which claims priority from Japanese Patent Application No. 2016-194845 filed on Sep. 30, 2016. The contents of these applications are incorporated herein by reference in their entireties.

BACKGROUND OF THE DISCLOSURE

Field of the Disclosure

The present disclosure relates to an elastic wave filter device including an elastic wave resonator, a radio-frequency front-end circuit, and a communication apparatus.

Description of the Related Art

Hitherto, as a multiband-support elastic wave filter device, a variable-frequency elastic wave filter device (tunable filter) has been proposed. As the variable-frequency elastic wave filter device, the following configuration (see Patent Document 1, for example) is known. In a ladder filter (ladder circuit) including a parallel arm resonance circuit and a series arm resonance circuit constituted by elastic wave resonators, a capacitor and a switch connected in parallel with each other is connected in series with a parallel arm resonator within the parallel arm resonance circuit.

Patent Document 1: U.S. Patent Application Publication No. 2009/0251235

BRIEF SUMMARY OF THE DISCLOSURE

In the configuration of the above-described variable-frequency filter device of the related art, it is difficult to obtain sufficient attenuation in a band separated from a pass band. To achieve sufficient attenuation, a longitudinally coupled resonator may be provided.

However, if the parallel arm resonance circuit is connected to the odd-numbered IDT terminal of the longitudinally coupled resonator, sufficient impedance matching may not be obtained between the longitudinally coupled resonator and the parallel arm resonance circuit. This may increase the loss of the elastic wave filter device within the pass band. This is unfavorable particularly in a variable-frequency elastic wave filter device in which the impedance within a pass band is variable by changing the frequency.

Accordingly, it is an object of the present disclosure to provide a variable-frequency elastic wave filter device, a radio-frequency front-end circuit, and a communication apparatus that are capable of reducing the loss within a pass band while achieving sufficient attenuation in a band separated from the pass band.

To achieve the above-described object, an elastic wave filter device according to an aspect of the present disclosure includes first and second input-output terminals, a longitudinally coupled resonator, a first parallel arm resonator, and a variable frequency circuit. The longitudinally coupled resonator is disposed on a path connecting the first and second input-output terminals. The first parallel arm resonator is an elastic wave resonator connected between a node on the path and a ground and determines a pass band together with the longitudinally coupled resonator. The variable frequency circuit is connected to the first parallel arm resonator and includes a first impedance element and a switch element. The variable frequency circuit varies the pass band as a result of the switch element being switched between ON and OFF. The longitudinally coupled resonator includes a plurality of IDT electrodes, an even-numbered IDT terminal, and an odd-numbered IDT terminal. The plurality of IDT electrodes are disposed along a propagating direction of elastic waves. One terminal of each of the plurality of IDT electrodes is connected to a ground. The plurality of IDT electrodes are three or more odd-number IDT electrodes. The even-numbered IDT terminal is a first signal terminal connected to the other terminal of each of one or more IDT electrodes located at even-numbered positions from an edge of an arrangement order of the plurality of IDT electrodes. The odd-numbered IDT terminal is a second signal terminal connected to the other terminal of each of two or more IDT electrodes located at odd-numbered positions from the edge of the arrangement order of the plurality of IDT electrodes. The longitudinally coupled resonator is disposed so that the even-numbered IDT terminal is connected to the node.

The impedance of the even-numbered IDT terminal is capacitive at the low edge of the pass band and becomes inductive as the frequency increases. In contrast, the impedance of the odd-numbered IDT terminal is inductive at the low edge of the pass band and becomes capacitive as the frequency increases. The impedance of the parallel arm resonator is inductive at the low edge of the pass band and approaches the normalized impedance as the frequency increases. As a result of connecting the parallel arm resonator to the even-numbered IDT terminal of the longitudinally coupled resonator, the impedance of the longitudinally coupled resonator and that of the parallel arm resonator almost satisfy a conjugate relationship, thereby reducing the loss caused by impedance mismatching within the filter. The variable frequency circuit is connected to the parallel arm resonator, thereby making it possible to vary the frequency as a result of the switch element being switched between ON and OFF. According to this aspect, it is thus possible to implement a variable-frequency elastic wave filter device (tunable filter) that can reduce the loss within the pass band as a result of providing impedance matching with the longitudinally coupled resonator. That is, it is possible to reduce the loss within the pass band as a result of providing impedance matching with the longitudinally coupled resonator while achieving sufficient attenuation in a band separated from the pass band by using the longitudinally coupled resonator.

The even-numbered IDT terminal may be connected to the first input-output terminal via the node. The odd-numbered IDT terminal may be connected to the second input-output terminal.

This configuration can reduce the occurrence of impedance mismatching both at the even-numbered IDT terminal and at the odd-numbered IDT terminal of the longitudinally coupled resonator, thereby further reducing the loss within the pass band.

The first parallel arm resonator and the variable frequency circuit may be connected in series with each other. The first impedance element and the switch element may be connected in parallel with each other. The elastic wave filter device may further include a circuit having a second parallel arm resonator that is an elastic wave resonator. A circuit including the first parallel arm resonator and the circuit including the second parallel arm resonator may be connected in parallel with each other. The resonant frequency of the second parallel arm resonator may be different from that of the first parallel arm resonator. The anti-resonant frequency of the second parallel arm resonator may be different from that of the first parallel arm resonator.

This configuration implements a tunable filter that can switch the frequency of at least one of the attenuation pole on the low-frequency side of the pass band and that on the high-frequency side of the pass band as a result of the switch element being switched between ON and OFF.

The elastic wave filter device may further include a first series arm resonator that is an elastic wave resonator disposed on a path connecting the first input-output terminal and the even-numbered IDT terminal.

The provision of the first series arm resonator adds the characteristics of a ladder circuit to those of the longitudinally coupled resonator, thereby enhancing the attenuation characteristics outside the pass band, for example, sharp attenuation characteristics are obtained on the high-frequency side of the pass band.

The elastic wave filter device may further include a second series arm resonator that is an elastic wave resonator disposed on a path connecting the odd-numbered IDT terminal and the second input-output terminal. The odd-numbered IDT terminal and the second input-output terminal may be connected to each other without any elastic wave resonator other than the second series arm resonator interposed therebetween.

The impedance of a series arm resonator at the low edge of the pass band is positioned at the vicinity of the normalized impedance and becomes inductive as the frequency increases. As a result of connecting a series arm resonator to the odd-numbered IDT terminal of the longitudinally coupled resonator, the impedance of the longitudinally coupled resonator and that of the series arm resonator almost satisfy a conjugate relationship, thereby reducing the loss caused by impedance mismatching within the filter. With this configuration, impedance matching can be provided at the odd-numbered IDT terminal as well as at the even-numbered IDT terminal of the longitudinally coupled resonator, thereby further reducing the loss within the pass band.

The odd-numbered IDT terminal and the second input-output terminal may be connected to each other without any elastic wave resonator interposed therebetween.

As stated above, the impedance at the odd-numbered IDT terminal is inductive at the low edge of the pass band and becomes capacitive as the frequency increases. As discussed above, the impedance of the parallel arm resonator is inductive at the low edge of the pass band and approaches the normalized impedance as the frequency increases. The impedance of the ladder circuit is inductive at the low edge of the pass band and becomes capacitive as the frequency increases. With the above-described characteristics, when a parallel arm resonator or a ladder circuit is connected between the odd-numbered IDT terminal and the second input-output terminal, impedance mismatching occurs in the filter, thereby increasing the loss. As a result of connecting the odd-numbered IDT terminal and the second input-output terminal without any elastic wave resonator interposed therebetween, the occurrence of impedance mismatching is decreased, thereby further reducing the loss within the pass band.

The longitudinally coupled resonator may include three, five, or nine IDT electrodes. Providing more IDT electrodes makes it possible to enhance the sharpness on the low-frequency side of the pass band and to achieve the attenuation characteristics.

The resonant frequency of the second parallel arm resonator may be lower than that of the first parallel arm resonator. The anti-resonant frequency of the second parallel arm resonator may be lower than that of the first parallel arm resonator. The first parallel arm resonator and the variable frequency circuit may be connected in series with each other. The second parallel arm resonator may be connected in parallel with a series circuit of the first parallel arm resonator and the variable frequency circuit.

This configuration implements a tunable filter that can switch between the first characteristics and the second characteristics substantially without increasing the insertion loss at the high edge of the pass band while switching the frequency of the attenuation pole on the high-frequency side of the pass band as a result of the switch element being switched between ON and OFF.

The resonant frequency of the second parallel arm resonator may be higher than that of the first parallel arm resonator. The anti-resonant frequency of the second parallel arm resonator may be higher than that of the first parallel arm resonator. The first parallel arm resonator and the variable frequency circuit may be connected in series with each other. The second parallel arm resonator may be connected in parallel with a series circuit of the first parallel arm resonator and the variable frequency circuit.

This configuration implements a tunable filter that can switch between the first characteristics and the second characteristics substantially without increasing the insertion loss at the low edge of the pass band while switching the frequency of the attenuation pole on the low-frequency side of the pass band as a result of the switch element being switched between ON and OFF.

The first and second parallel arm resonators may be connected in parallel with each other. The variable frequency circuit may be connected in series with a parallel circuit of the first and second parallel arm resonators.

This configuration implements a tunable filter that can switch the frequencies of the attenuation poles on both sides of the pass band as a result of the switch element being switched between ON and OFF.

The variable frequency circuit may be connected in series with only one of the first and second parallel arm resonators. The elastic waver filter device may further include a different variable frequency circuit connected in series with only the other one of the first and second parallel arm resonators. A series circuit of the variable frequency circuit and one of the first and second parallel arm resonators and a series circuit of the different variable frequency circuit and the other one of the first and second parallel arm resonators may be connected in parallel with each other.

This configuration implements a tunable filter that can switch the frequency of the attenuation pole on the high-frequency side and that on the low-frequency side of the pass band and can also reduce the insertion loss on the high and low edges of the pass band as a result of the switch elements being switched between ON and OFF. It is thus possible to implement a tunable filter that can switch the center frequency while maintaining the bandwidth, for example.

The variable frequency circuit may be a parallel circuit of the first impedance element and the switch element and may be connected in parallel with the first parallel arm resonator between the node and the ground.

This configuration implements a tunable filter that can switch the frequency of the attenuation pole on the low-frequency side of the pass band as a result of the switch element being switched between ON and OFF.

The first impedance element may be one of an inductor and a capacitor. The variable frequency circuit may further include a second impedance element that is the other one of the inductor and the capacitor and that is connected in series with the switch element. A series circuit of the switch element and the second impedance element may be connected in parallel with the first impedance element.

This configuration implements a tunable filter that achieves a wide variable frequency range of the pass band.

The variable frequency circuit may be a parallel circuit of the first impedance element and the switch element and may be connected in series with the first parallel arm resonator between the node and the ground. The first impedance element may be an elastic wave resonator having a resonant frequency higher than that of the first parallel arm resonator and an anti-resonant frequency higher than that of the first parallel arm resonator.

This configuration implements a tunable filter that can switch the frequency of the attenuation pole on the low-frequency side of the pass band and can also add an attenuation pole on the high-frequency side of the pass band so as to achieve attenuation on the high-frequency side of the pass band as a result of the switch element being switched between ON and OFF.

The first impedance element and the switch element may be connected in series with each other and may be connected in parallel with the first parallel arm resonator between the node and the ground. The first impedance element may be an elastic wave resonator having a resonant frequency higher than that of the first parallel arm resonator and an anti-resonant frequency higher than that of the first parallel arm resonator.

This configuration implements a tunable filter that can switch the frequency at the high edge of the pass band as a result of the switch element being switched between ON and OFF.

A radio-frequency front-end circuit according to an aspect of the present disclosure includes one of the above-described elastic wave filter devices and an amplifier circuit connected to the elastic wave filter device.

This configuration implements a radio-frequency front-end circuit that can be decreased in size and reduce the loss within the pass band.

A communication apparatus according to an aspect of the present disclosure includes an RF signal processing circuit and the above-described radio-frequency front-end circuit.

The RF signal processing circuit processes a radio-frequency signal received by an antenna device and a radio-frequency signal to be transmitted by the antenna device. The radio-frequency front-end circuit transfers the radio-frequency signals between the antenna device and the RF signal processing circuit.

This configuration implements a communication apparatus that can be decreased in size and reduce the loss within the pass band.

According to the present disclosure, it is possible to provide a variable-frequency elastic wave filter device, a radio-frequency front-end circuit, and a communication apparatus that are capable of reducing the loss within a pass band while achieving sufficient attenuation in a band separated from the pass band.

BRIEF DESCRIPTION OF THE SEVERAL VIEWS OF THE DRAWINGS

FIGS. 2A-2D show diagrams illustrating the characteristics of a longitudinally coupled resonator device in the embodiment.

FIGS. 5A-5C show diagrams for explaining impedance matching in the embodiment.

FIGS. 7A-7D show diagrams illustrating the characteristics of a filter constituted by elements having a connection relationship opposite to that of FIGS. 6A-6D.

FIGS. 8A-8D show diagrams illustrating the characteristics of a ladder circuit in the embodiment.

FIGS. 9A-9C show diagrams illustrating the characteristics of the ladder circuit shown in FIGS. 8A-8D.

FIG. 11A shows Smith charts illustrating the impedance characteristics extracted from those in FIGS. 8A-8D and shows the impedance characteristics within a pass band when a switch SW is ON.

FIGS. 12C-12F are a second group of drawings illustrating the characteristics of the filter according to the first configuration example.

FIG. 13C-13F are a second group of drawings illustrating the characteristics of the filter according to the second configuration example.

FIGS. 14C-14F are a second group of drawings illustrating the characteristics of the filter according to the third configuration example.

FIGS. 15A-15B are a first group of drawings illustrating the characteristics of a filter according to a fourth configuration example.

FIGS. 15C-15F are a second group of drawings illustrating the characteristics of the filter according to the fourth configuration example.

FIGS. 16C-16F are a second group of drawings illustrating the characteristics of the filter according to the fifth configuration example.

FIGS. 17C-17F are a second group of drawings illustrating the characteristics of the filter according to the sixth configuration example.

FIGS. 18C-18F are a second group of drawings illustrating the characteristics of the filter according to the seventh configuration example.

FIGS. 19C-19F are a second group of drawings illustrating the characteristics of the filter according to the eighth configuration example.

FIGS. 20A-20F show diagrams illustrating configurations applicable to a longitudinally coupled resonator device according to the embodiment and the characteristics thereof.

FIG. 22A is a circuit diagram illustrating a ladder circuit according to a second modified example.

FIGS. 22B-22D show graphs illustrating the filter characteristics of the ladder circuit according to the second modified example.

FIG. 23A is a circuit diagram illustrating a ladder circuit according to a third modified example.

FIGS. 23B-23D show graphs illustrating the filter characteristics of the ladder circuit according to the third modified example.

FIG. 24A is a circuit diagram illustrating a ladder circuit according to a fourth modified example.

FIGS. 24B-24D show graphs illustrating the filter characteristics of the ladder circuit according to the fourth modified example.

FIG. 27A is a circuit diagram illustrating a ladder circuit according to a seventh modified example.

FIGS. 27B-27D show graphs illustrating the filter characteristics of the ladder circuit according to the seventh modified example.

FIG. 28A is a circuit diagram illustrating a ladder circuit according to an eighth modified example.

FIGS. 28B-20D show graphs illustrating the filter characteristics of the ladder circuit according to the eighth modified example.

DETAILED DESCRIPTION OF THE DISCLOSURE

Figure 1:
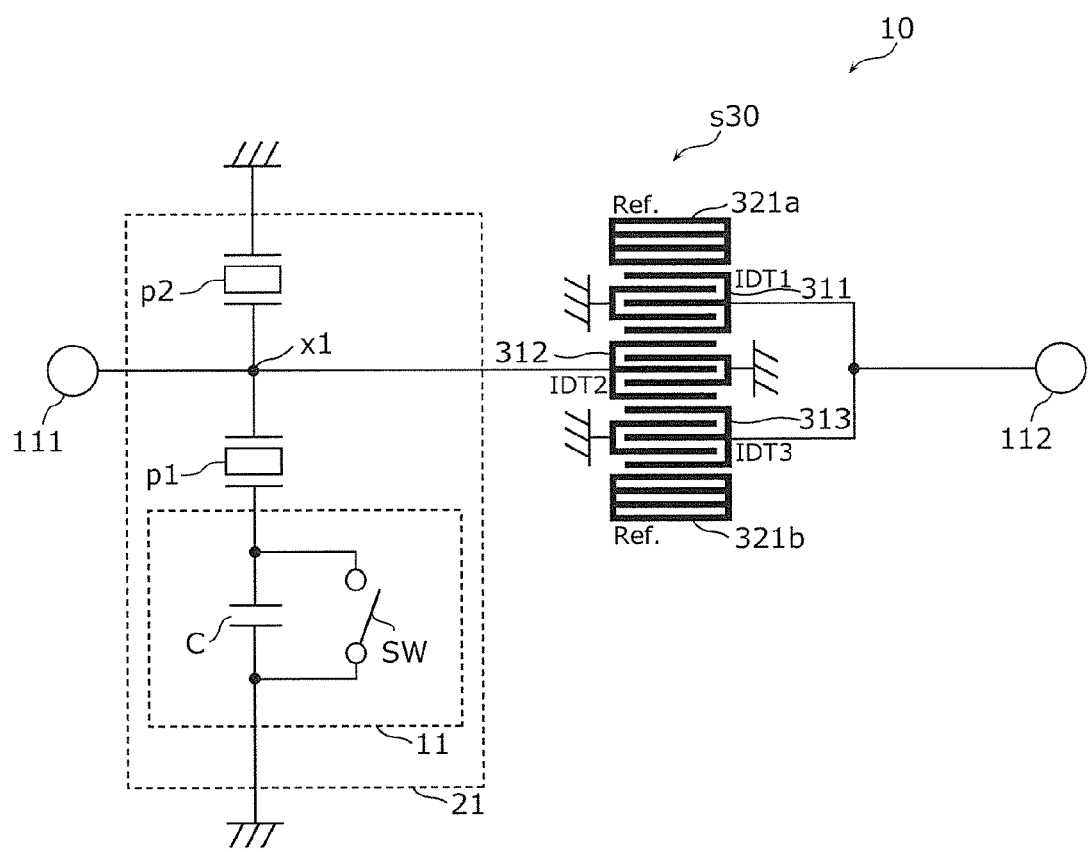
FIG. 1 is a circuit diagram of a filter having the basic configuration according to a first embodiment.

Embodiments of the present disclosure will be described below in detail through illustration of examples and the drawings. All of the embodiments described below illustrate general or specific examples. Numeric values, configurations, materials, components, and positions and connection states of the components illustrated in the following embodiments are only examples, and are not described for limiting the present disclosure. Among the components illustrated in the following embodiments, the components that are not recited in the independent claims will be described as optional components. The sizes and dimensional ratios of the components in the drawings are not necessarily illustrated as actual sizes and ratios. In the individual drawings, substantially the same configurations are designated by the same reference numeral, and an explanation thereof may not be repeated or may be simplified.

First Embodiment

1. Basic Configuration

A filter according to the embodiment is an elastic wave filter device which is disposed in a front-end portion of a multimode/multiband-support cellular phone, for example, and which filters radio-frequency signals by using elastic wave resonators. The filter is disposed in a front-end portion of a cellular phone supporting LTE (Long Term Evolution), for example. The filter allows radio-frequency signals of a desired band (frequency band) compliant with 3GPP (Third Generation Partnership Project) to pass through the filter, while filtering other radio-frequency signals out.

The basic configuration of the filter according to the embodiment will be described below with reference to FIG. 1. The specific configurations of the filter according to the embodiment will be discussed later through illustration of examples.

FIG. 1 is a circuit diagram of a filter 10 having the basic configuration according to a first embodiment.

As shown in FIG. 1, the filter 10 having the basic configuration includes a longitudinally coupled resonator device s30, a parallel arm resonator p1 (first parallel arm resonator), a parallel arm resonator p2 (second parallel arm resonator), and a variable frequency circuit 11.

The longitudinally coupled resonator device s30 is connected between an input-output terminal 111 (first input-output terminal) and an input-output terminal 112 (second input-output terminal). That is, the longitudinally coupled resonator device s30 is a resonator device constituted by plural elastic wave resonators disposed on a path connecting the input-output terminals 111 and 112.

More specifically, the longitudinally coupled resonator device s30 is a DMS (double mode SAW (surface acoustic wave)) filter having plural IDT (interdigital transducer) electrodes disposed side by side along the propagating direction of elastic waves (downward direction in the plane of FIG. 1). In this embodiment, the longitudinally coupled resonator device s30 includes, for example, three IDT electrodes 311 (IDT1), 312 (IDT2), and 313 (IDT3) and a pair of reflectors (Ref.) 321a and 321b disposed on both sides of the IDT electrodes 311 through 313 in the propagating direction of elastic waves. The reflectors 321a and 321b may not necessarily be provided.

The IDT electrodes 311 through 313 are each constituted by a pair of interdigital electrodes opposing to each other. The pair of interdigital electrodes has plural electrode fingers which extend in a direction perpendicular to the propagating direction of elastic waves and which are arranged side by side in the propagating direction of elastic waves. The plural electrode fingers are alternately connected to the same terminal so as to form the pair of interdigital electrodes. One of the pair of interdigital electrodes is connected to a first signal terminal or a second signal terminal and the other interdigital electrode is connected to a ground terminal. That is, one terminal (ground terminal) of each of the IDT electrodes 311 through 313 is connected to a ground, and the other terminal (signal terminal) thereof is connected to the first or second signal terminal, which is the signal terminal of the overall longitudinally coupled resonator device s30.

The IDT electrodes 311 through 313 configured as described above are alternately connected to the first and second signal terminals of the overall longitudinally coupled resonator device s30 in accordance with the arrangement order. More specifically, among the IDT electrodes 311 through 313, concerning one or more IDT electrodes located at even-numbered positions from an edge of the arrangement order (the second IDT electrode 312 in this example, which will hereinafter be simply called the "even-numbered IDT electrode"), one interdigital electrode is connected to an even-numbered IDT terminal (discussed later), which is the above-described first signal terminal, and the other interdigital electrode is connected to a ground terminal. In contrast, among the IDT electrodes 311 through 313, concerning two or more IDT electrodes located at odd-numbered positions from the edge of the arrangement order (the first and third IDT electrodes 311 and 313 in this example, which will hereinafter be simply called the "odd-numbered IDT electrodes"), one interdigital electrode is connected to an odd-numbered IDT terminal (discussed later), which is the above-described second signal terminal, and the other interdigital electrode is connected to a ground terminal.

That is, the signal terminal of the even-numbered IDT electrode is connected to the even-numbered IDT terminal, while the signal terminals of the two or more odd-numbered IDT electrodes are connected to the same odd-numbered IDT terminal. If two or more even-numbered IDT electrodes are provided, the signal terminals thereof are connected to the same even-numbered IDT terminal. In other words, the even-numbered IDT terminal is the first signal terminal of the longitudinally coupled resonator device s30, which is connected to the other terminal (signal terminal) of the even-numbered IDT electrode. The odd-numbered IDT terminal is the second signal terminal of the longitudinally coupled resonator device s30, which is connected to the other terminals (signal terminals) of the odd-numbered IDT electrodes.

As described above, the longitudinally coupled resonator device s30 includes three or more odd-number IDT electrodes (for example, three IDT electrodes 311 through 313 in this embodiment), the even-numbered IDT terminal, and the odd-numbered IDT terminal.

The even-numbered IDT terminal and the odd-numbered IDT terminal are disposed opposite to each other with respect to the plural IDT electrodes 311 through 313. In this embodiment, the even-numbered IDT terminal is indirectly connected to the input-output terminal 111 via a node x1, while the odd-numbered IDT terminal is directly connected to the input-output terminal 112. In other words, the odd-numbered IDT terminal and the input-output terminal 112 are connected to each other without any elastic wave resonator interposed therebetween.

The parallel arm resonator p1 is an elastic wave resonator connected between a ground (reference terminal) and the node x1 provided on a path connecting the input-output terminals 111 and 112. The parallel arm resonator p1 determines the pass band (pass band of the filter 10) together with the longitudinally coupled resonator device s30. That is, the parallel arm resonator p1 is an elastic wave resonator disposed on a path connecting a ground and the node x1 provided on the series arm.

The parallel arm resonator p1 is connected to the even-numbered IDT electrode of the longitudinally coupled resonator device s30. That is, the node x1 to which the parallel arm resonator p1 is connected is positioned on a path connecting the input-output terminal (first input-output terminal) and the even-numbered IDT terminal.

The parallel arm resonator p2 is an elastic wave resonator connected between a ground (reference terminal) and the node x1 provided on the path connecting the input-output terminals 111 and 112. That is, the parallel arm resonator p2 is an elastic wave resonator disposed on another path connecting a ground and the node x1 provided on the series arm. The parallel arm resonator p2 is connected in parallel with a circuit including the parallel arm resonator p1 (first parallel arm resonator) between the node x1 and a ground.

In this manner, the circuit including the parallel arm resonator p1 provided on a path connecting the node x1 to a ground and a circuit including the parallel arm resonator p2 provided on another path connecting the node x to a ground are connected in parallel with each other.

The resonant frequency of the parallel arm resonator p2 (second parallel arm resonator) is different from that of the parallel arm resonator p1 (first parallel arm resonator). The anti-resonant frequency of the parallel arm resonator p2 is different from that of the parallel arm resonator p1. More specifically, the resonant frequency of the parallel arm resonator p2 is higher than that of the parallel arm resonator p1. The anti-resonant frequency of the parallel arm resonator p2 is higher than that of the parallel arm resonator p1.

The resonant frequency of an elastic wave resonator is the frequency of a "resonance point", which is the singularity point at which the impedance of this elastic wave resonator is minimized (ideally zero). The anti-resonant frequency of an elastic wave resonator is the frequency of an "anti-resonance point", which is the singularity point at which the impedance of this elastic wave resonator is maximized (ideally infinite). For the sake of convenience, in this specification, concerning a circuit constituted by plural elastic wave resonators or impedance elements, as well as concerning a single elastic wave resonator, the singularity point at which the impedance is minimized (ideally zero) will be called the "resonance point" and the frequency of the resonance point will be called the "resonant frequency". The singularity point at which the impedance is maximized (ideally infinite) will be called the "anti-resonance point" and the frequency of the anti-resonance point will be called the "anti-resonant frequency".

The parallel arm resonators p1 and p2 are each connected between a ground and the same node x1 provided on the series arm.

Elastic wave resonators forming the parallel arm resonators p1 and p2 are constituted by resonators using surface acoustic waves, bulk waves, or boundary acoustic waves, for example. The longitudinally coupled resonator device s30 and the elastic wave resonators forming the parallel arm resonators p1 and p2 include a piezoelectric body and electrodes disposed on the piezoelectric body. As the piezoelectric body, a $LiTaO_3$ piezoelectric single crystal, a $LiNbO_3$ piezoelectric single crystal, a $KNbO_3$ piezoelectric single crystal, quartz, piezoelectric ceramics, or a multilayer body thereof may be used. As the electrodes, a metal, such as Ti, Al, Cu, Pt, Au, Ag, and Pd, an alloy thereof, or a multilayer body thereof may be used.

The variable frequency circuit 11 is constituted by a capacitor C (first impedance element) and a switch SW (switch element) connected to each other. The variable frequency circuit 11 is connected to the parallel arm resonator p1 (first parallel arm resonator) between the node x1 and a ground. The variable frequency circuit 11 varies the frequency of the pass band, for example, of the filter 10 (elastic wave filter device) having the basic configuration as a result of the switch SW being switched between ON (conducting state) and OFF (non-conducting state). In this embodiment, the variable frequency circuit 11 is a circuit constituted by the capacitor C and the switch SW connected in parallel with each other, and is connected in series with the parallel arm resonator p1 between the node x1 and a ground. More specifically, the variable frequency circuit 11 is connected in series with only the parallel arm resonator p1 (first parallel arm resonator) among the parallel arm resonator p1 and the parallel arm resonator p2 (second parallel arm resonator).

The capacitor C is constituted by an interdigital electrode on a piezoelectric body or as a multilayer structure, or by a multilayer chip capacitor. The capacitor C may be constituted by a variable capacitor, such as a varicap or a DTC (digitally tunable capacitor).

The switch SW is a switch element which is turned ON (conducting) and OFF (non-conducting) in accordance with a control signal from a controller (not shown), such as a RF signal processing circuit (RFIC: radio frequency integrated circuit). The switch SW is a SPST (single-pole, single-throw) switch, for example. Examples of the switch SW are a FET (field effect transistor) switch made of GaAs or CMOS (complementary metal oxide semiconductor) or a diode switch.

The switch SW may be constituted by a switch IC (integrated circuit) having plural switches. Each of the switches is not restricted to a semiconductor switch formed on a semiconductor substrate, and may be a mechanical switch formed by using MEMS (micro electro mechanical systems).

The filter 10 having the basic configuration as described above includes the variable frequency circuit 11 connected to the parallel arm resonator p1 so that it can vary at least the resonant frequency concerning the combined characteristics (combined impedance characteristics) of a parallel arm resonance circuit 21 constituted by the parallel arm resonators p1 and p2 and the variable frequency circuit 11. The filter 10 having the basic configuration can thus vary the frequency difference between the resonant frequency and the anti-resonant frequency concerning the above-described combined characteristics, thereby implementing a tunable filter that can vary the frequencies of the pass band and the attenuation band, for example.

Although the variable frequency circuit 11 is connected between the parallel arm resonator p1 and a ground in FIG. 1, it may be connected between the node x1 and the parallel arm resonator p1.

2. Characteristics

Before explaining the specific configuration of the filter according to this embodiment, a description will first be given of the characteristics of elements forming the filter, that is, a longitudinally coupled resonator device, a parallel arm resonator, a series arm resonator, and a ladder circuit constituted by a parallel arm resonator and a series arm resonator. A series arm resonator and a ladder circuit constituted by a parallel arm resonator and a series arm resonator are not provided in the above-described filter 10 having the basic configuration. However, a series arm resonator or a ladder circuit may be provided in filters in some examples and will thus be explained.

[2-1. Longitudinally Coupled Resonator Device]

FIGS. 2A-2D show diagrams illustrating the characteristics of the longitudinally coupled resonator device s30 in this embodiment. More specifically, FIG. 2A is a schematic diagram illustrating the longitudinally coupled resonator device s30 exhibiting the characteristics and the surrounding portion. FIG. 2B is a graph illustrating the bandpass characteristics of the single longitudinally coupled resonator device s30, and shows the insertion loss (I.L.) between Port1 and Port2 in FIG. 2A. FIG. 2C is a Smith chart illustrating the impedance characteristics at Port1 in FIG. 2A(a), while FIG. 2D is a Smith chart illustrating the impedance characteristics at Port2 in FIG. 2A. Port1 in FIG. 2A corresponds to the above-described even-numbered IDT terminal, while port2 in FIG. 2A corresponds to the above-described odd-numbered IDT terminal.

In the graph illustrating the bandpass characteristics and the Smith charts, the low edge (925 MHz) of the pass band and the high edge (960 MHz) of the pass band are appended with markers. On the right side of the graph illustrating the bandpass characteristics, the frequency and the insertion loss at the position of a marker m* (* indicates the numeric value which follows m in the graph) in the graph are shown. On the right side of each of the graphs illustrating the impedance characteristics, the frequency, the magnitude $\rho$ and the phase $\theta$ of the reflection coefficient $\Gamma$, and the impedance (coefficient Z0 is the normalized impedance (50$\Omega$, for example)) at the position of a marker m* in the graphs are shown. Markers in the other graphs illustrating the bandpass characteristics and impedance characteristics, which will be discussed below, are also represented in a similar manner.

As shown in FIGS. 2A-2D (in particular, in FIG. 2C and FIG. 2D), the impedance at Port1, which is the even-numbered IDT terminal, is capacitive at the low edge of the pass band and becomes inductive as the frequency increases. In contrast, the impedance at Port2, which is the odd-numbered IDT terminal, is inductive at the low edge of the pass band and becomes capacitive as the frequency increases.

[2-2. Parallel Arm Resonator]

Figure 3A:
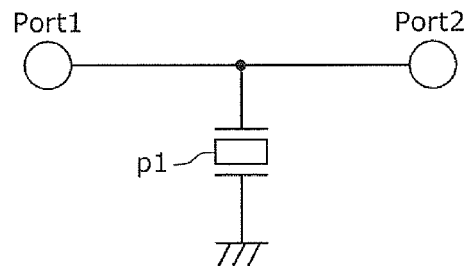
FIGS. 3A-3C show diagrams illustrating the characteristics of a parallel arm resonator in the embodiment.
Figure 3B:
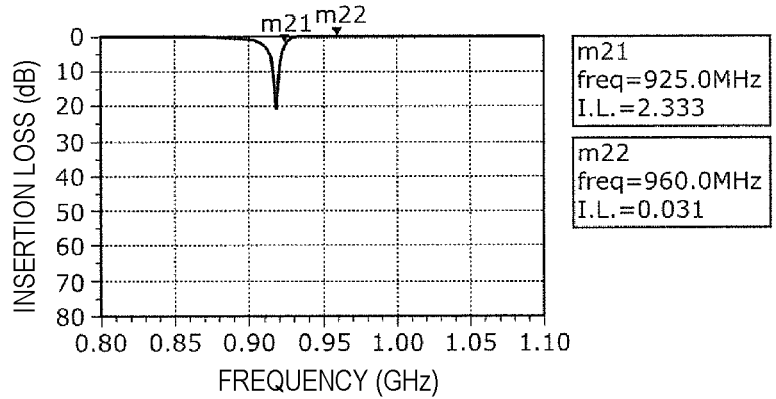
Figure 3C:
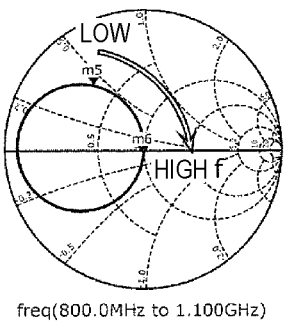

FIGS. 3A-3C show diagrams illustrating the characteristics of the parallel arm resonator p1 in this embodiment. FIG. 3A is a schematic diagram illustrating the parallel arm resonator p1 exhibiting the characteristics and the surrounding portion. FIG. 3B is a graph illustrating the bandpass characteristics of the single parallel arm resonator p1 and shows the insertion loss between Port1 and Port2 in FIG. 3A. FIG. 3C is a Smith chart illustrating the impedance characteristics at Port1 and Port2 in FIG. 3A.

The parallel arm resonator p1 determines the attenuation pole on the low-frequency side of the pass band by setting the resonant frequency of the parallel arm resonator p1 to be lower than the pass band. The parallel arm resonator p1 determines the pass band by setting the anti-resonant frequency of the parallel arm resonator p1 to be the vicinity of the pass band.

As shown in FIGS. 3A-3C (in particular, in FIG. 3C, the impedance of the parallel arm resonator p1 is inductive at the low edge of the pass band and approaches the normalized impedance (50$\Omega$) as the frequency increases.

[2-3. Series Arm Resonator]

Figure 4A:
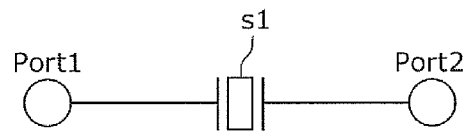
FIGS. 4A-C show diagrams illustrating the characteristics of a series arm resonator in the embodiment.
Figure 4B:
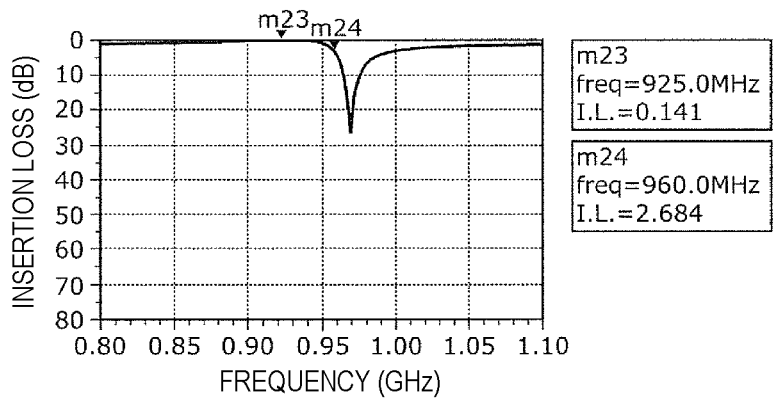
Figure 4C:
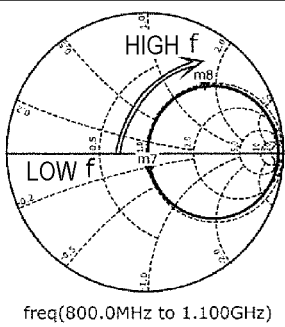

FIGS. 4A-4C show diagrams illustrating the characteristics of a series arm resonator s1 in this embodiment. FIG. 4A is a schematic diagram illustrating the series arm resonator s1 exhibiting the characteristics and the surrounding portion. FIG. 4B is a graph illustrating the bandpass characteristics of the single series arm resonator s1 and shows the insertion loss between Port1 and Port2 in FIG. 4A. FIG. 4C is a Smith chart illustrating the impedance characteristics at Port1 and Port2 in FIG. 4A.

The series arm resonator s1 determines the pass band by setting the resonant frequency of the series arm resonator s1 to be the vicinity of the pass band. The series arm resonator s1 determines the attenuation pole on the high-frequency side of the pass band by setting the anti-resonant frequency of the series arm resonator s1 to be higher than the pass band.

As shown in FIGS. 4A-4C (in particular, in FIG. 4C), the impedance of the series arm resonator s1 is close to the normalized impedance (50Ω) at the low edge of the pass band and becomes inductive as the frequency increases.

[2-4. First Knowledge Gained Regarding Impedance Matching]

Based on the above-described characteristics, the inventor of the disclosure of this application has gained the following first knowledge regarding impedance matching with the longitudinally coupled resonator device s30.

FIGS. 5A-5C show diagrams for explaining impedance matching in this embodiment. More specifically, in FIGS. 5A-5C, the diagrams of FIG. 2C, FIG. 2D, FIG. 3C, and FIG. 4C are shown together.

When connecting the parallel arm resonator p1 to the longitudinally coupled resonator device s30, it is connected to the even-numbered IDT terminal (Port1). With this arrangement, as shown in FIGS. 5A-5C, the impedance of the longitudinally coupled resonator device s30 and that of the parallel arm resonator p1 almost satisfy a conjugate relationship, thereby reducing the loss caused by impedance mismatching within the filter. That is, as a result of providing impedance matching with the longitudinally coupled resonator device s30, the loss of the filter within the pass band can be reduced.

When connecting the series arm resonator s1 to the longitudinally coupled resonator device s30, it is connected to the odd-numbered IDT terminal (Port2). With this arrangement, as shown in FIGS. 5A-5C, the impedance of the longitudinally coupled resonator device s30 and that of the series arm resonator s1 almost satisfy a conjugate relationship, thereby reducing the loss caused by impedance mismatching within the filter. That is, as a result of providing impedance matching with the longitudinally coupled resonator device s30, the loss of the filter within the pass band can be reduced.

Figure 6A:
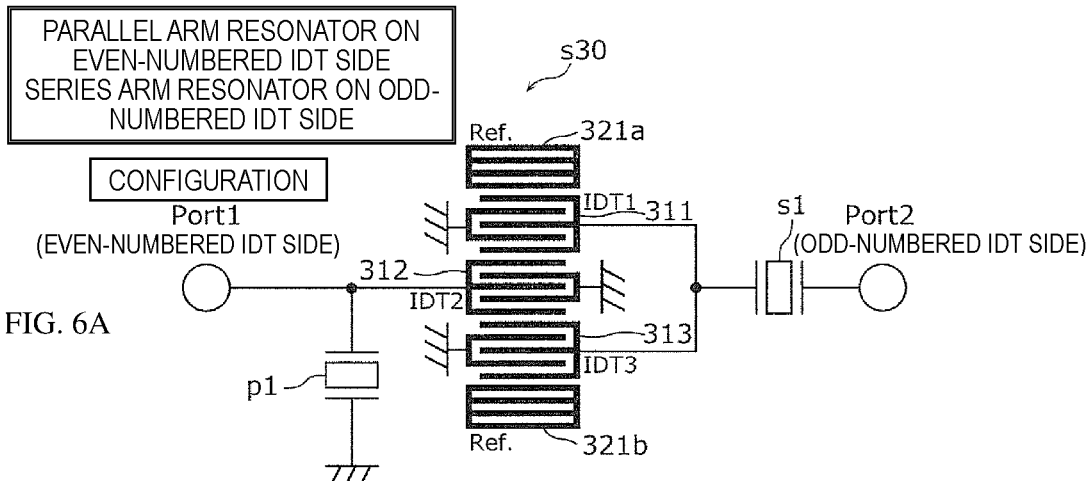
FIGS. 6A-6D show diagrams illustrating the characteristics of a filter constituted by elements having a connection relationship according to the embodiment.
Figure 6B:
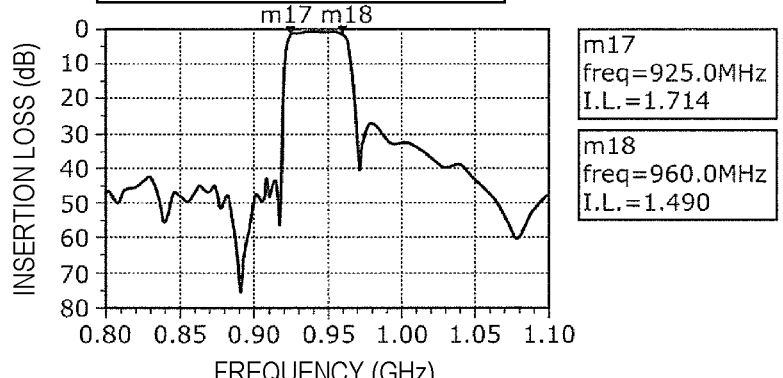
Figure 6C:
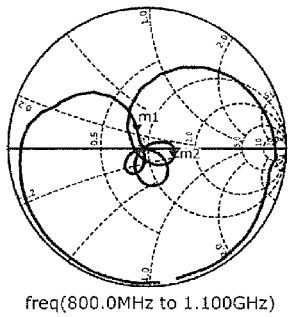
Figure 6D:
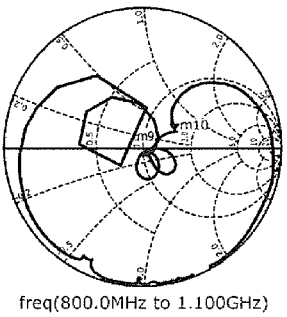

The characteristics of a filter constituted by elements having the above-described connection relationship based on the knowledge are shown in FIGS. 6A-6D. As a comparative example, the characteristics of a filter constituted by elements having a connection relationship opposite to that in FIGS. 6A-6D are shown in FIGS. 7A-7D. FIGS. 6A-6D shows diagrams illustrating the characteristics of the filter constituted by elements having a connection relationship according to this embodiment. FIGS. 7A-7D show diagrams illustrating the characteristics of a filter constituted by elements having a connection relationship opposite to that of FIGS. 6A-6D. More specifically, FIG. 6A and FIG. 7A are schematic diagrams each illustrating the filter constituted by elements having the connection relationship exhibiting the corresponding characteristics. FIG. 6B and FIG. 7B show graphs illustrating the bandpass characteristics of the filters shown in FIG. 6A and FIG. 7A, respectively. FIG. 6C and FIG. 7C are Smith charts illustrating the impedance characteristics at Port1 in FIG. 6A and FIG. 7A, respectively. FIG. 6D and FIG. 7D are Smith charts illustrating the impedance characteristics at Port2 in FIG. 6A and FIG. 7A, respectively. In both of the filters, the elements (longitudinally coupled resonator device s30, parallel arm resonator p1, and series arm resonator s1) are optimally designed.

As shown in FIGS. 6A-6D, when the elements of the filter have the connection relationship based on the above-described knowledge, impedance matching is provided in the filter within the pass band, thereby achieving a small-loss filter. In other words, since impedance matching is provided, the impedance at Port1 and that at Port2 can match the normalized impedance, thereby reducing the loss of the filter as a whole. "The impedance at Port1 and that at Port2 can match the normalized impedance" includes the meaning of "the impedance at Port1 and that at Port2 can match the vicinity of the normalized impedance". For example, it includes the meaning of "VSWR matches a range of 2.2 or smaller".

In contrast, as shown in FIGS. 7A-7D, when the elements of the filter have the connection relationship opposite to that based on the above-described knowledge, impedance mismatching occurs in the filter within the pass band, thereby failing to achieve a small-loss filter. In other words, the occurrence of impedance mismatching increases variations in the impedance at Port1 and that at Port2 in the pass band, thereby increasing the loss of the filter as a whole.

[2-5. Ladder Circuit]

The characteristics of a ladder circuit will now be described below through illustration of a ladder circuit including the above-described variable frequency circuit 11.

FIGS. 8A-8D shows diagrams illustrating the characteristics of a ladder circuit in this embodiment. FIG. 8A is a schematic diagram illustrating the ladder circuit exhibiting the characteristics. FIG. 8B is a graph illustrating the bandpass characteristics of the ladder circuit and shows the bandpass characteristics when the switch SW is ON (indicated by the broken line) and those when the switch SW is OFF (indicated by the solid line). FIG. 8C is a Smith chart illustrating the impedance characteristics at Port1 in FIG. 8A. FIG. 8D is a Smith chart illustrating the impedance characteristics at Port2 in FIG. 8A. Port1 in FIG. 8A is a terminal of the ladder circuit closer to a series arm resonator, while Port2 in FIG. 8A is a terminal of the ladder circuit closer to a parallel arm resonator.

The configuration and the characteristics of the ladder circuit shown in FIGS. 8A-8D will first be discussed below.

The ladder circuit shown in FIGS. 8A-8D is a ladder filter circuit constituted by the series arm resonator s1 and the parallel arm resonance circuit 21 of the above-described filter 10 having the basic configuration.

The ladder circuit configured as described above changes the resonant frequency on the low-frequency side of the pass band concerning the combined characteristics of the parallel arm resonance circuit 21. This will be discussed more specifically with reference to FIGS. 9A-9C.

FIGS. 9A-9C shows diagrams illustrating the characteristics of the ladder circuit in FIGS. 8A-8D. More specifically, FIG. 9A is a graph illustrating the impedance characteristics of a single resonator and shows the combined characteristics of the parallel arm resonator p1 and the variable frequency circuit 11 when the switch SW is ON (indicated by the broken line in FIG. 9A), the combined characteristics of the parallel arm resonator p1 and the variable frequency circuit 11 when the switch SW is OFF (indicated by the solid line in FIG. 9A), the characteristics of the parallel arm resonator p2 (indicated by the long dashed dotted line in FIG. 9A), and the characteristics of the series arm resonator s1 (long dashed line in FIG. 9A). FIG. 9B is a graph illustrating a comparison result of the combined characteristics of the parallel arm resonance circuit 21 when the switch SW is ON (broken line in FIG. 9B) and those when the switch SW is OFF (solid line in FIG. 9B). FIG. 9C is a graph illustrating a comparison result of the filter characteristics of the ladder circuit when the switch SW is ON (indicated by the broken line in FIG. 9C) and those when the switch SW is OFF (indicated by the solid line in FIG. 9C).

In the circuit constituted by the parallel arm resonator p1 and the variable frequency circuit 11, when the switch SW is OFF, the capacitor C is added to the parallel arm resonator p1, and, when the switch SW is ON, the capacitor C is short-circuited and only the parallel arm resonator p1 forms the circuit. That is, the combined characteristics of the parallel arm resonator p1 and the variable frequency circuit 11 exhibit the impedance characteristics of the parallel arm resonator p1 and the capacitor C when the switch SW is OFF and exhibit the impedance characteristics of the single parallel arm resonator p1 when the switch SW is ON. Hence, as shown in FIGS. 9A-9C, concerning the impedance characteristics of the parallel arm resonance circuit 21 (combined characteristics of the parallel arm in FIGS. 9A-9C), as a result of the switch SW being changed from ON to OFF, the lower resonant frequency of the two resonant frequencies and the lower anti-resonant frequency of the two anti-resonant frequencies shift to a higher-frequency region.

The range by which the frequency of the pass band of the ladder circuit is variable (hereinafter referred to as the variable frequency range or shiftable frequency range) is determined by the constant of the capacitor C (first impedance element). For example, as the constant of the capacitor C is smaller, the variable frequency range becomes wider. The constant (capacitance) of the capacitor C is thus suitably determined in accordance with the frequency specifications demanded for the ladder circuit.

The lower anti-resonant frequency and the lower resonant frequency of the parallel arm resonance circuit 21 determine the attenuation slope on the low-frequency side of the pass band of the ladder circuit. As shown in FIG. 9C, as a result of the switch SW being changed from ON to OFF, the bandpass characteristics of the ladder circuit shift to the higher-frequency side while maintaining the sharpness of the attenuation slope on the low-frequency side of the pass band. In other words, the ladder circuit forms a tunable filter that is able to shift the pass band to the higher-frequency side substantially without increasing the insertion loss at the low edge of the pass band while shifting the attenuation pole on the low-frequency side of the pass band to the higher-frequency side.

The parallel arm resonance circuit 21 determines the attenuation pole on the low-frequency side of the pass band by setting the lower resonant frequency to be lower than the pass band, and also determines the pass band by setting the lower anti-resonant frequency to the vicinity of the pass band. The impedance of the parallel arm resonance circuit 21 is thus inductive at the low edge of the pass band and becomes capacitive as the frequency increases.

As shown in FIGS. 8A-8D (in particular, in FIG. 8C and FIG. 8D), at both of Port1 and Port2, the impedance of the ladder circuit constituted by the parallel arm resonance circuit 21 and the series arm resonator s1 connected to each other is inductive at the low edge of the pass band and becomes capacitive as the frequency increases.

[2-6. Second Knowledge Gained Regarding Impedance Matching]

Based on the above-described characteristics, the inventor of the disclosure of this application has gained the following second knowledge regarding impedance matching with the longitudinally coupled resonator device s30.

Figure 10A:
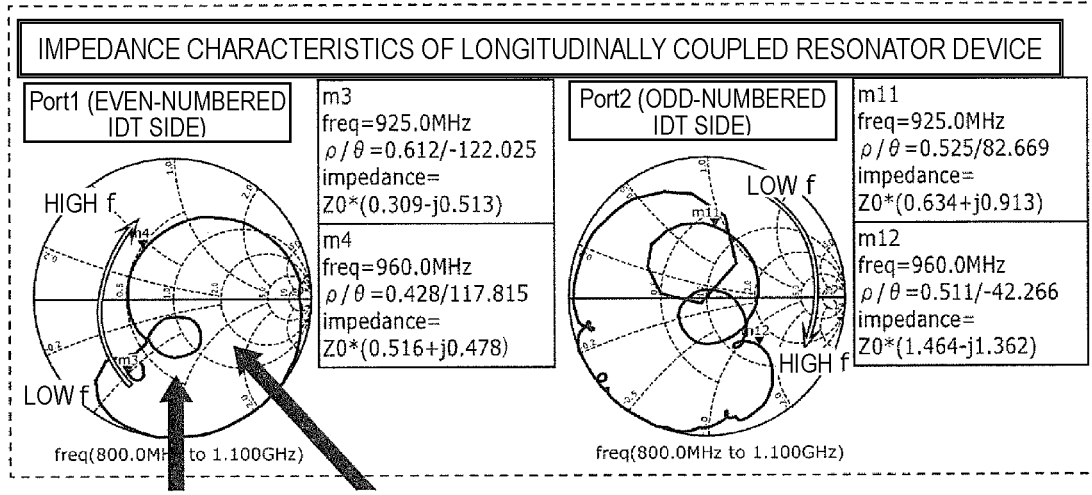
FIGS. 10A-10B show diagrams for explaining impedance matching in the embodiment.
Figure 10B:
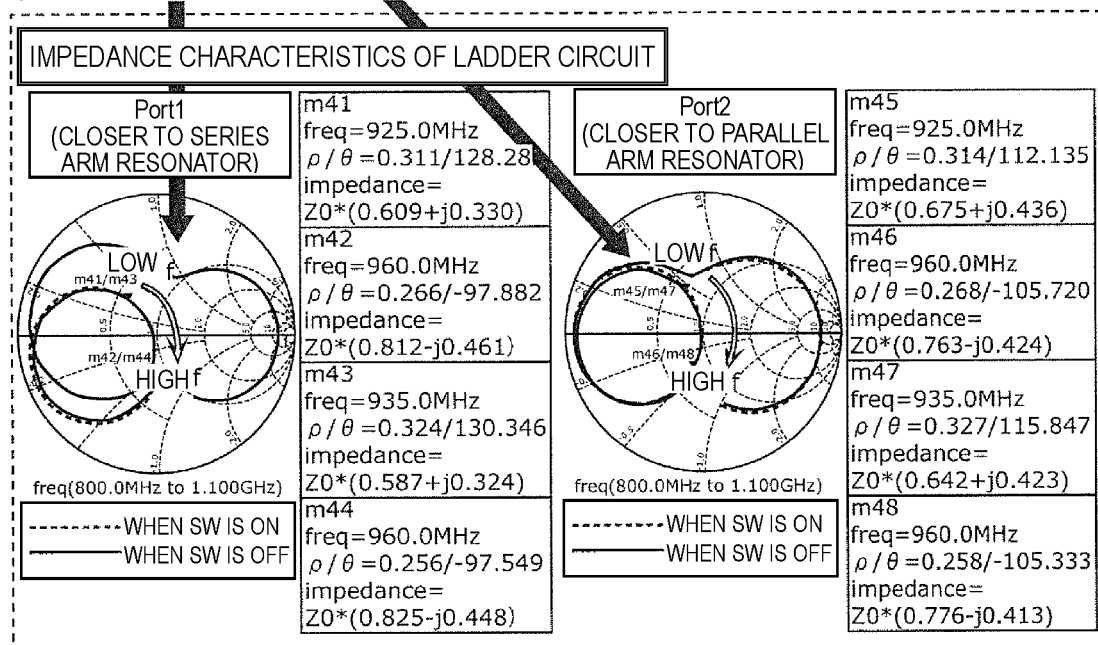

FIGS. 10A-10B shows diagrams for explaining impedance matching in this embodiment. More specifically, in FIGS. 10A-10B, the diagrams of FIG. 2C, FIG. 2D, FIG. 8C, and FIG. 8D are shown together.

When connecting a ladder circuit to the longitudinally coupled resonator device s30, regardless of whether the terminal of the ladder circuit closer to a series arm resonator (Port1) or that closer to a parallel arm resonator (Port2) is connected to the longitudinally coupled resonator device s30, the ladder circuit is connected to the even-numbered IDT terminal (Port1). With this arrangement, as shown in FIGS. 10A-10B, the impedance of the longitudinally coupled resonator device s30 and that of the ladder circuit almost satisfy a conjugate relationship, thereby reducing the loss caused by impedance mismatching within the filter. That is, as a result of providing impedance matching with the longitudinally coupled resonator device s30, the loss of the filter within the pass band can be reduced.

Providing impedance matching as described above is more effective in a filter including a variable-impedance ladder circuit having the variable frequency circuit 11 than in a fixed-frequency ladder circuit. It is effective especially in a filter including a ladder circuit in which the impedance within a pass band varies. This will be explained below with reference to FIGS. 11A through 11C.

Figure 11A:
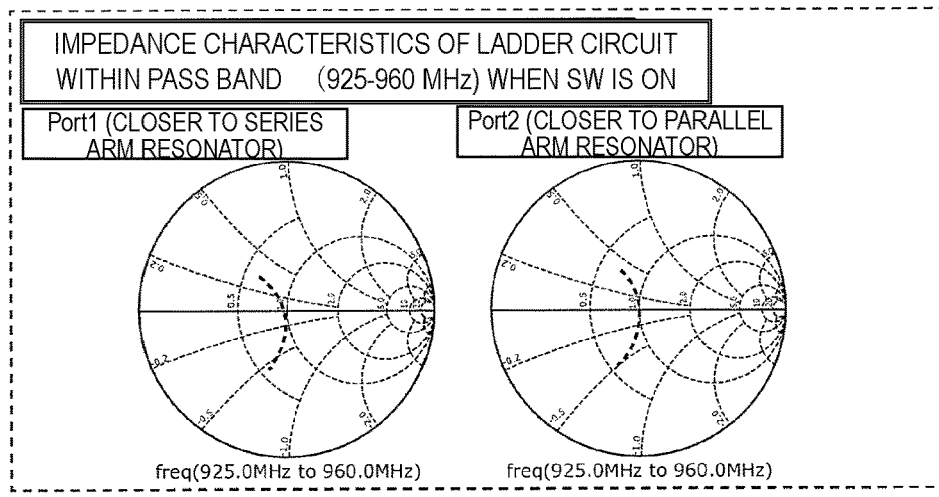
Figure 11B:
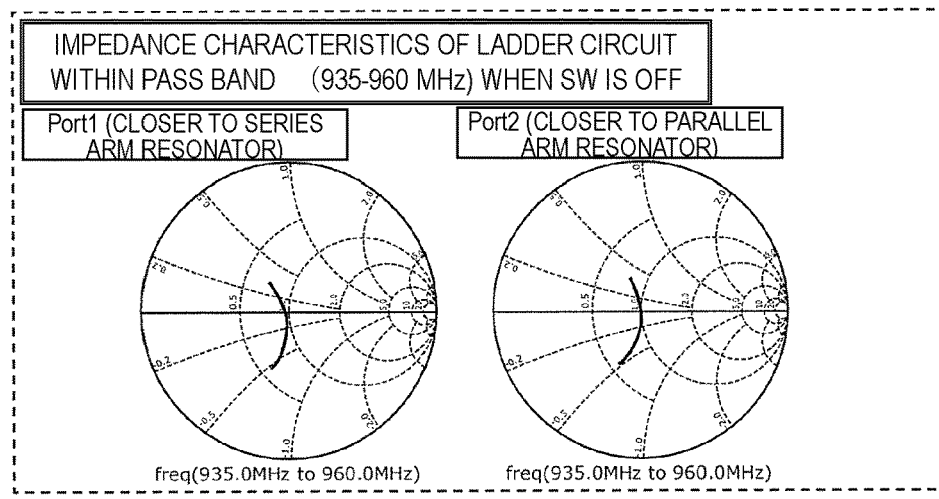
FIG. 11B shows Smith charts illustrating the impedance characteristics extracted from those in FIGS. 8A-8D and shows the impedance characteristics within the pass band when the switch SW is OFF.
Figure 11C:
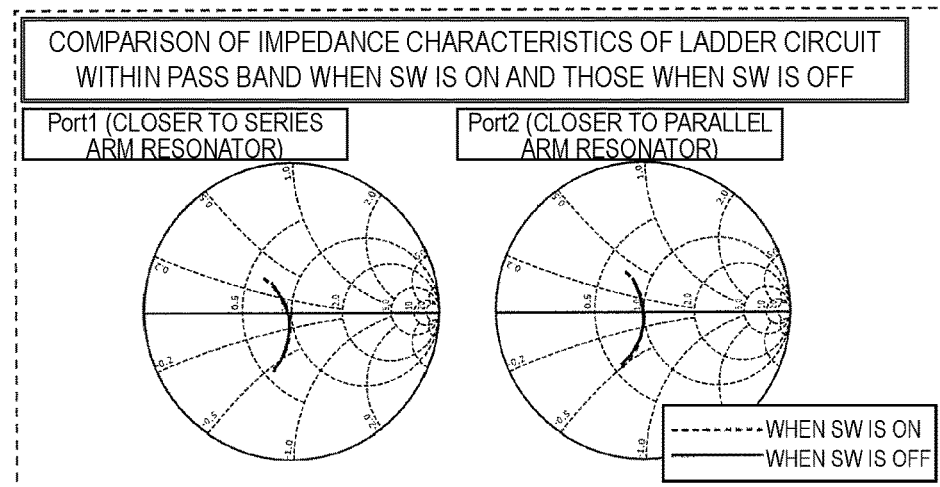
FIG. 11C shows a comparison result of the impedance characteristics shown in FIG. 11A and those shown in FIG. 11B.

FIG. 11A shows Smith charts illustrating the impedance characteristics extracted from those in FIG. 8C and FIG. 8D and shows the impedance characteristics within the pass band when the switch SW is ON. FIG. 11B shows Smith charts illustrating the impedance characteristics extracted from those in FIG. 8C and FIG. 8D and shows the impedance characteristics within the pass band when the switch SW is OFF. FIG. 11C shows a comparison result of the impedance characteristics shown in FIG. 11A (indicated by the broken lines) and those shown in FIG. 11B (indicated by the solid lines).

As shown in FIGS. 11A through 11C, in the ladder circuit including the parallel arm resonators p1 and p2, the impedance in the pass band varies as a result of the switch SW being switched between ON and OFF. The reason for this is as follows. In this type of ladder circuit, not only the resonant frequency (lower resonant frequency, for example) of the parallel arm resonance circuit, but also the anti-resonant frequency (lower anti-resonant frequency, for example) thereof is changed. The impedance within the pass band thus varies more considerably than that in a ladder circuit having only one parallel arm resonator.

If the connection relationship between the ladder circuit and the longitudinally coupled resonator device s30 of such a filter is opposite to that based on the above-described second knowledge, impedance mismatching in the filter within the pass band is elevated, which leads to a noticeable increase in the loss of the filter as a whole.

3. Configuration Examples

The characteristics of filters according to first through eighth configuration examples obtained by variously combining the above-described individual elements and circuits (series arm resonators, parallel arm resonators, longitudinally coupled resonator device, and ladder circuit) will be explained below with reference to FIGS. 12A through 19A, which are the first drawings, and FIGS. 12B through 19B, which are the second drawings.

In the first drawings of the configuration examples, FIGS. 12A through 19A are schematic diagrams of the filters according to the first through eighth configuration examples, respectively. FIGS. 12B through 19B show graphs illustrating the bandpass characteristics of the filters according to the first through eighth configuration examples, respectively, and shows the bandpass characteristics when the switch SW is ON (indicated by the broken line in the graph) and those when the switch SW is OFF (indicated by the solid line in the graph). In the second drawings of the configuration examples, FIGS. 12C through 19C are Smith charts illustrating the impedance characteristics at Port1 in FIGS. 12A through 19A, respectively, when the switch SW is ON. In the second drawings, FIGS. 12D through 19D are Smith charts illustrating the impedance characteristics at Port2 in FIGS. 12A through 19A, respectively, when the switch SW is ON. In the second drawings, FIGS. 12E through 19E are Smith charts illustrating the impedance characteristics at Port1 in FIGS. 12A through 19A, respectively, when the switch SW is OFF. In the second drawings, FIGS. 12F through 19F are Smith charts illustrating the impedance characteristics at Port2 in FIGS. 12A through 19, respectively, when the switch SW is OFF.

The above-described explanation applies to the entire first through eighth configuration examples, and will thus be simplified when referring to the individual configuration examples.

Port1 shown in FIGS. 12A through 19A is the input-output terminal 111 connected to the even-numbered IDT terminal (Port1 in FIGS. 2A-2D) of the longitudinally coupled resonator device s30. Port2 shown in FIGS. 12A(a) through 19A(a) is the input-output terminal 112 connected to the odd-numbered IDT terminal (Port2 in FIGS. 2A-2D) of the longitudinally coupled resonator device s30.

The first through third and sixth through eighth configuration examples, which will be discussed below, are respectively first through sixth examples, which are specific configuration examples of the filters according to this embodiment, and include the basic configuration of the filter 10. The fourth and fifth configuration examples are configurations of first and second comparative examples and do not include the basic configuration of the filter 10.

[3-1. First Configuration Example (First Example)]

Figure 12A:
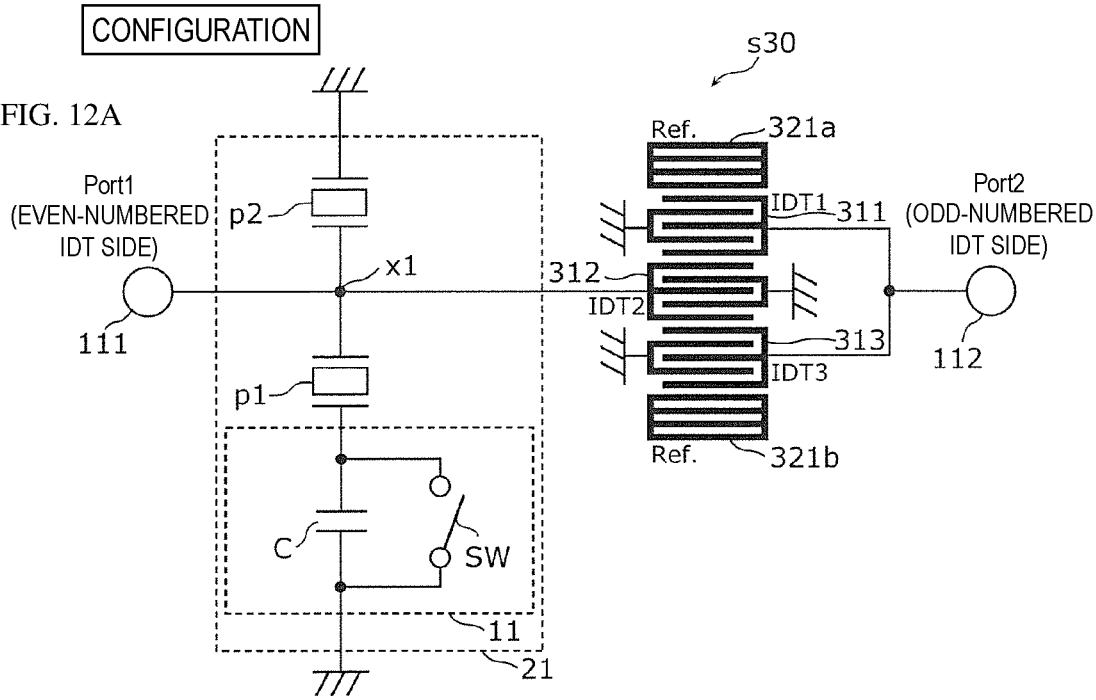
FIGS. 12A-12B are a first group of drawings illustrating the characteristics of a filter according to a first configuration example.
Figure 12B:
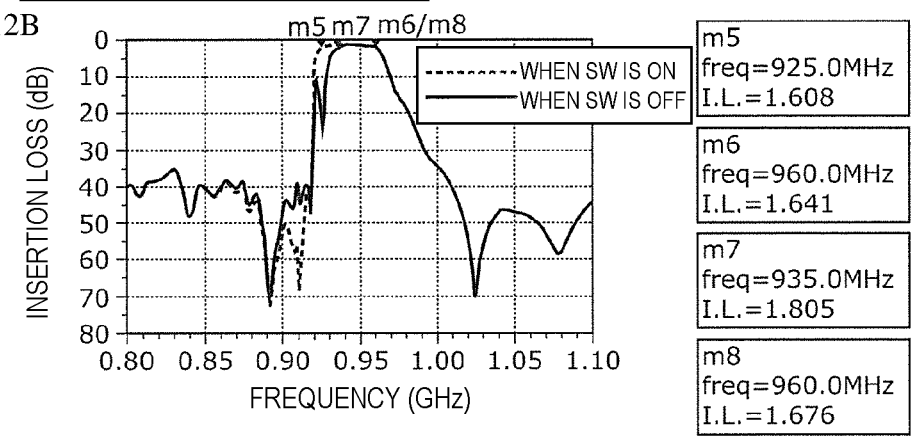

FIGS. 12A-12B is a first drawing illustrating the characteristics of the filter according to the first configuration example. FIG. 12B is a second drawing illustrating the characteristics of the filter according to the first configuration example.

As shown in FIGS. 12A-12F (in particular, FIG. 12A), in the filter according to the first configuration example, the parallel arm resonance circuit 21 is connected to the even-numbered IDT of the longitudinally coupled resonator device s30. That is, the filter of the first configuration example is a tunable filter in which the parallel arm resonators p1 and p2 and the variable frequency circuit 11 are connected to the even-numbered IDT terminal (Port1 in FIGS. 2A-2D) of the longitudinally coupled resonator device s30.

In the filter configured as described above, as shown in FIGS. 12A and 12B (in particular, FIG. 12B and FIG. 12C through FIG. 12F), the loss caused by impedance mismatching within the filter can be reduced, thereby decreasing the loss within the pass band.

[3-2. Second Configuration Example (Second Example)]

Figure 13A:
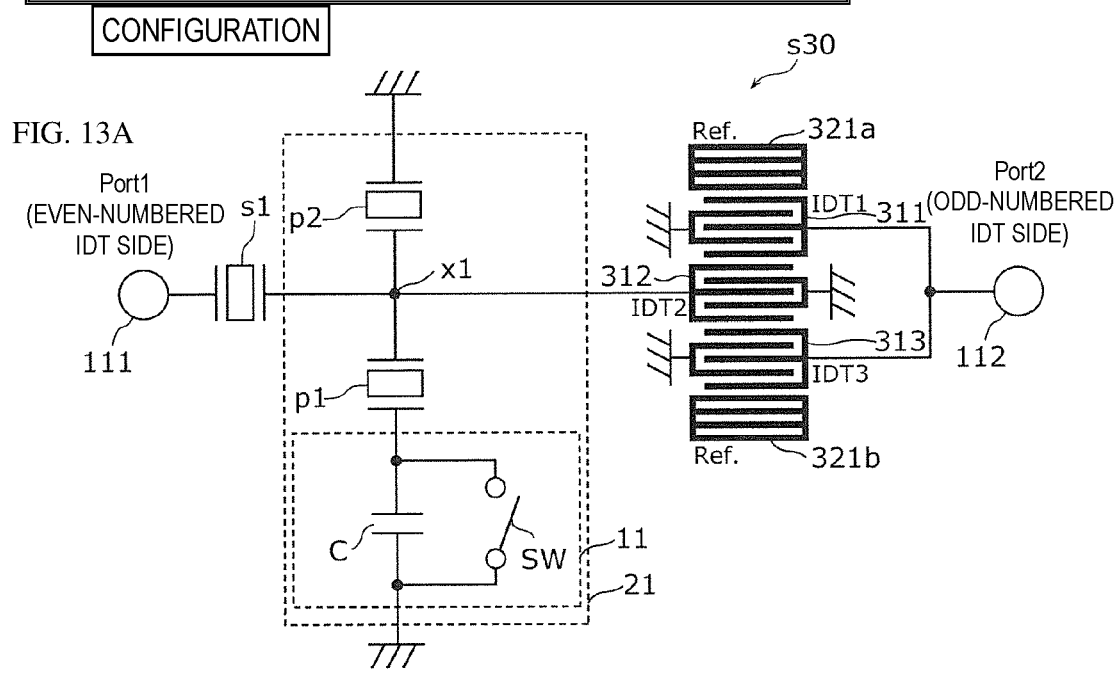
FIGS. 13A-13B are a first group of drawings illustrating the characteristics of a filter according to a second configuration example.
Figure 13B:
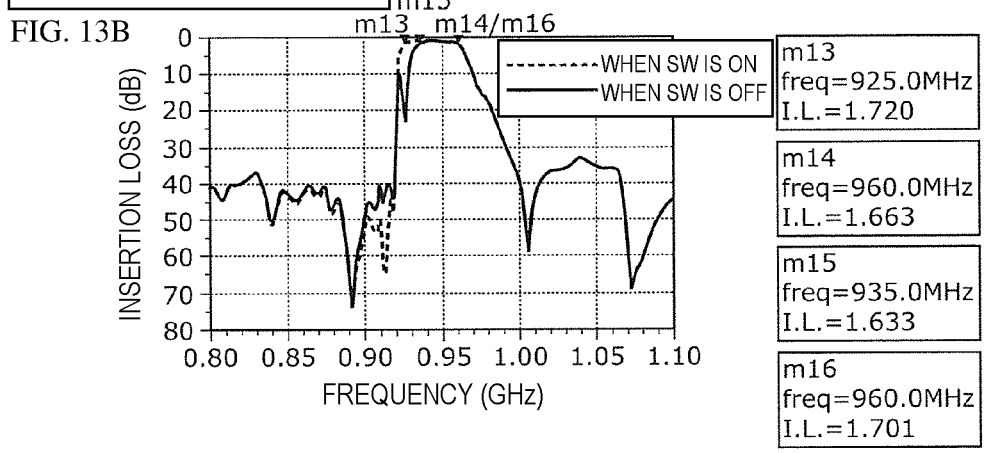

FIGS. 13A-13B is a first group of drawings illustrating the characteristics of the filter according to the second configuration example. FIGS. 13C-13F is a second group of drawings illustrating the characteristics of the filter according to the second configuration example.

As shown in FIGS. 13A-13F (in particular, FIG. 13A), in the filter according to the second configuration example, the parallel arm resonance circuit 21 is connected to the even-numbered IDT of the longitudinally coupled resonator device s30, and then, the series arm resonator s1 is connected to the parallel arm resonance circuit 21. That is, the filter of the second configuration example is a tunable filter in which a terminal (Port1 in FIGS. 8A-8D) of a ladder circuit closer to the series arm resonator, which is constituted by the series arm resonator s1 and the parallel arm resonance circuit 21, is connected to the even-numbered IDT terminal (Port1 in FIGS. 2A-2D) of the longitudinally coupled resonator device s30.

In the filter configured as described above, as well as in the first configuration example, as shown in FIGS. 13A13F (in particular, FIG. 13B and FIG. 13C through FIG. 13F, the loss caused by impedance mismatching within the filter can be reduced, thereby decreasing the loss within the pass band.

[3-3. Third Configuration Example (Third Example)]

Figure 14A:
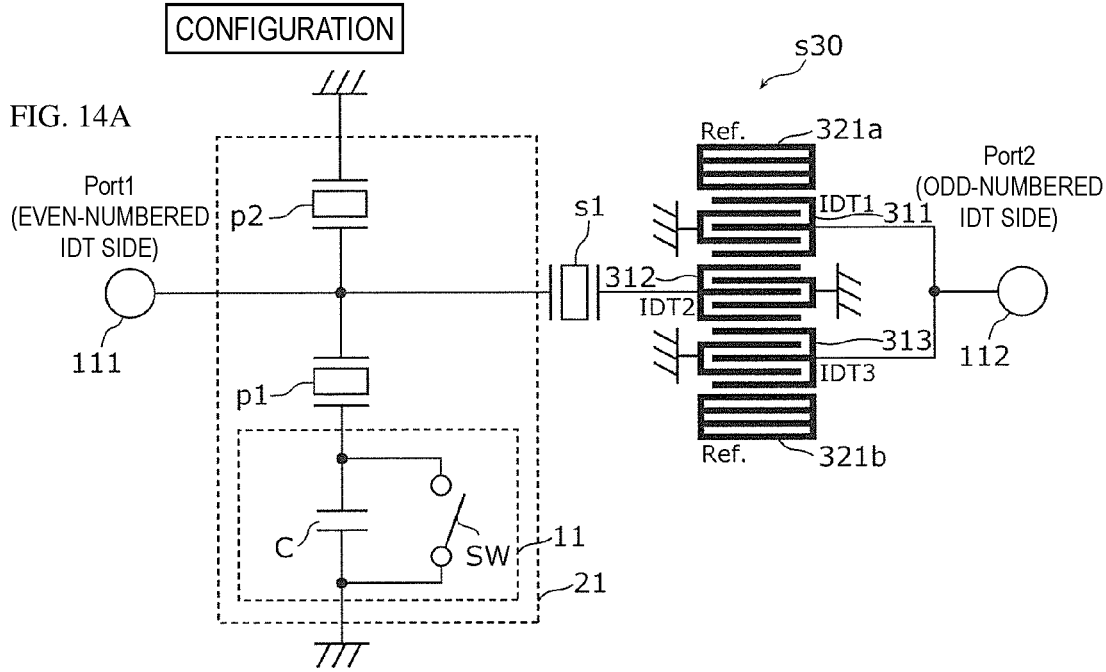
FIGS. 14A-14B are a first group of drawings illustrating the characteristics of a filter according to a third configuration example.
Figure 14B:
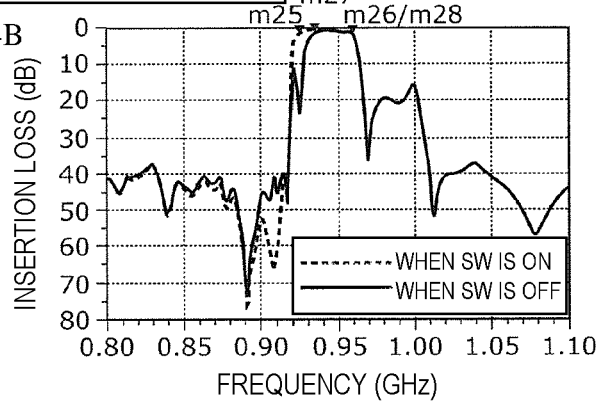

FIGS. 14A-14B is a first group of drawings illustrating the characteristics of the filter according to the third configuration example. FIGS. 14C-14F is a second group of drawings illustrating the characteristics of the filter according to the third configuration example.

As shown in FIGS. 14A-14F (in particular, FIG. 14A), in the filter according to the third configuration example, the series arm resonator s1 is connected to the even-numbered IDT of the longitudinally coupled resonator device s30, and then, the parallel arm resonance circuit 21 is connected to the series arm resonator s1. That is, the filter of the third configuration example is a tunable filter in which a terminal (Port2 in FIGS. 8A-8D) of a ladder circuit closer to the parallel arm resonator, which is constituted by the series arm resonator s1 and the parallel arm resonance circuit 21, is connected to the even-numbered IDT terminal (Port1 in FIGS. 2A-2D) of the longitudinally coupled resonator device s30.

In the filter configured as described above, as well as in the first configuration example, as shown in FIGS. 14A-14F (in particular, FIG. 14B and FIG. 14C through FIG. 14F), the loss caused by impedance mismatching within the filter can be reduced, thereby decreasing the loss within the pass band.

[3-4. Fourth Configuration Example (First Comparative Example)]

FIG. 15A-15B is a first group of drawings illustrating the characteristics of the filter according to the fourth configuration example. FIGS. 15C-15F is a second group of drawings illustrating the characteristics of the filter according to the fourth configuration example.

As shown in FIGS. 15A-15F (in particular, FIG. 15A), in the filter according to the fourth configuration example, the series arm resonator s1 is connected to the odd-numbered IDTs of the longitudinally coupled resonator device s30, and then, the parallel arm resonance circuit 21 is connected to the series arm resonator s1. That is, the filter of the fourth configuration example is a tunable filter in which a terminal (Port1 in FIGS. 8A-8D) of a ladder circuit closer to the series arm resonator, which is constituted by the series arm resonator s1 and the parallel arm resonance circuit 21, is connected to the odd-numbered IDT terminal (Port2 in FIGS. 2A-2D) of the longitudinally coupled resonator device s30.

In the filter configured as described above, impedance mismatching occurs. As shown in FIGS. 15A-15F (in particular, FIG. 15B and FIG. 15C through FIG. 15F), the impedance at Port1 and that at Port2 within the pass band considerably vary, thereby increasing the loss of the filter.

[3-5. Fifth Configuration Example (Second Comparative Example)]

Figure 16A:
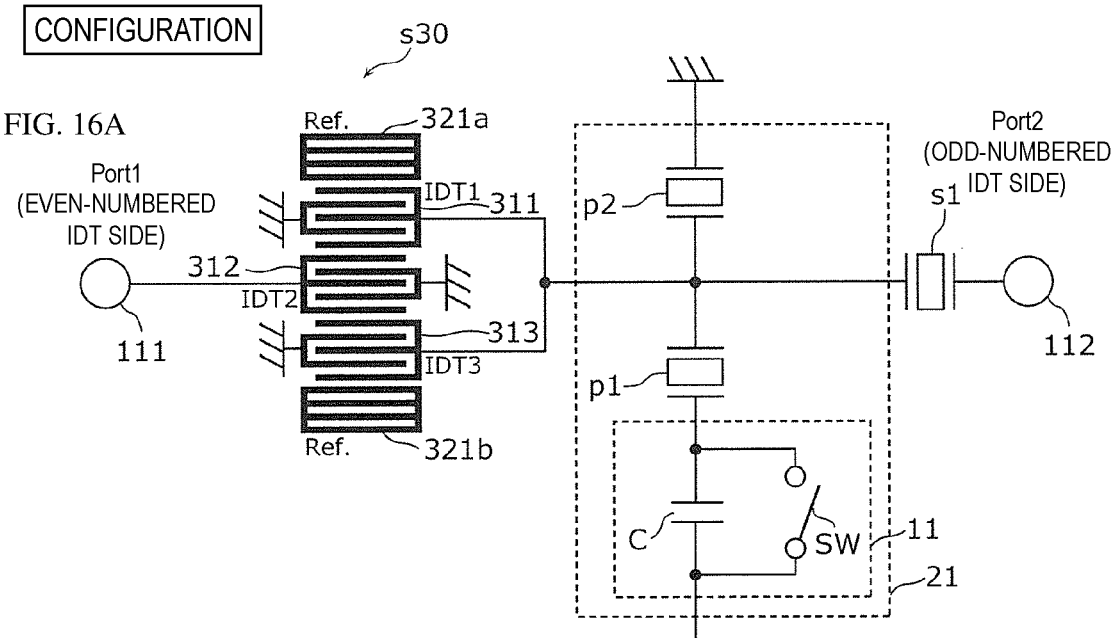
FIGS. 16A-16B are a first group of drawings illustrating the characteristics of a filter according to a fifth configuration example.
Figure 16B:
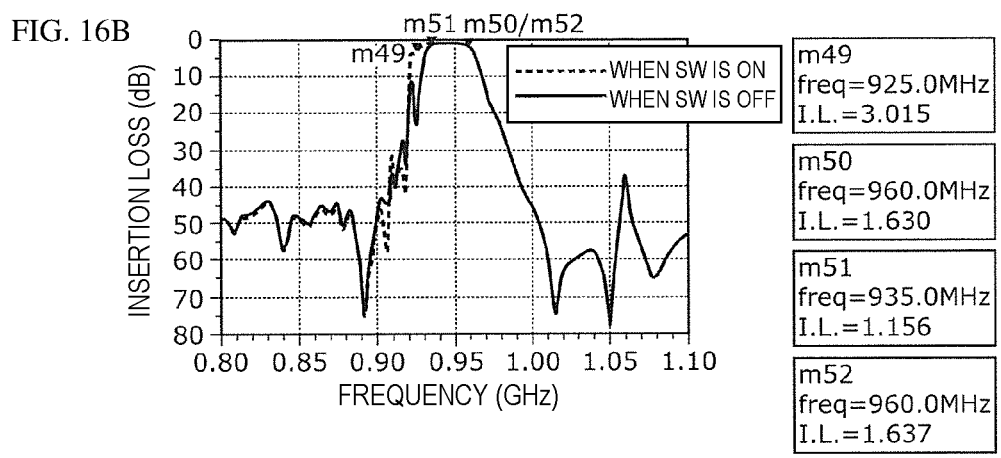

FIG. 16A-16B is a first group of drawings illustrating the characteristics of the filter according to the fifth configuration example. FIG. 16C-16F is a second set drawings illustrating the characteristics of the filter according to the fifth configuration example.

As shown in FIGS. 16A-16F (in particular, FIG. 16A), in the filter according to the fifth configuration example, the parallel arm resonance circuit 21 is connected to the odd-numbered IDTs of the longitudinally coupled resonator device s30, and then, the series arm resonator s1 is connected to the parallel arm resonance circuit 21. That is, the filter of the fifth configuration example is a tunable filter in which a terminal (Port2 in FIGS. 8A-8D) of a ladder circuit closer to the parallel arm resonator, which is constituted by the series arm resonator s1 and the parallel arm resonance circuit 21, is connected to the odd-numbered IDT terminal (Port2 in FIGS. 2A-2D) of the longitudinally coupled resonator device s30.

In the filter configured as described above, as well as in the above-described fourth configuration example (first comparative example), impedance mismatching occurs. As shown in FIGS. 16A-16F (in particular, FIG. 16B and FIG. 16C through FIG. 16F), the impedance at Port1 and that at Port2 within the pass band considerably vary, thereby increasing the loss of the filter.

[3-6. Sixth Configuration Example (Fourth Example)]

Figure 17A:
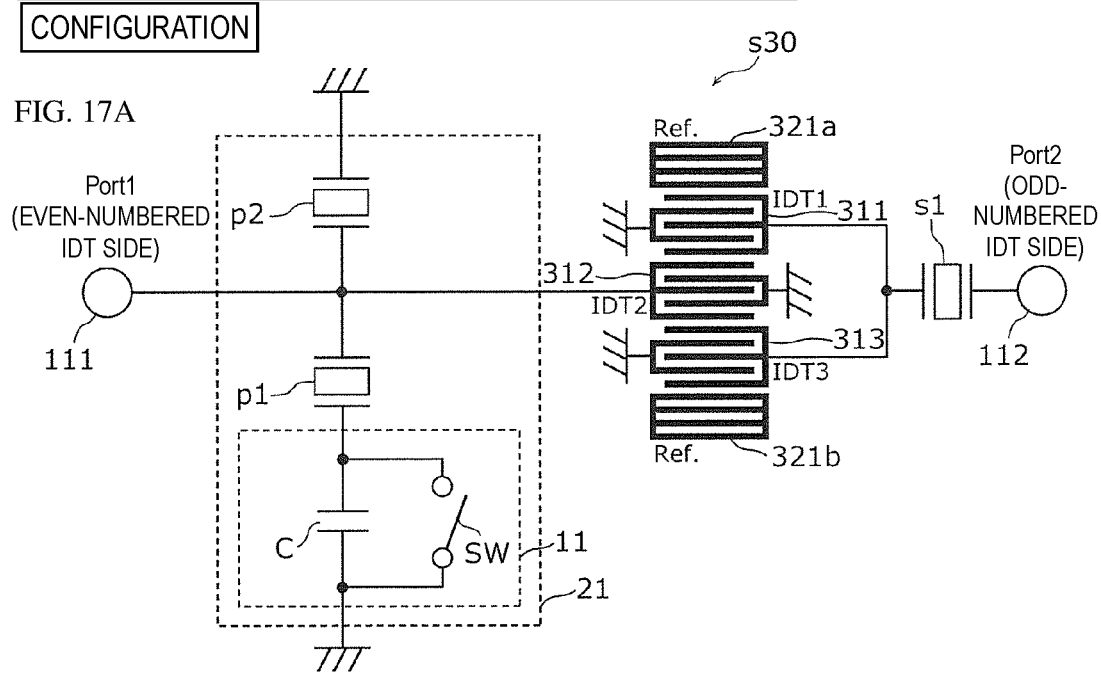
FIGS. 17A-17B are a first group of drawings illustrating the characteristics of a filter according to a sixth configuration example.
Figure 17B:
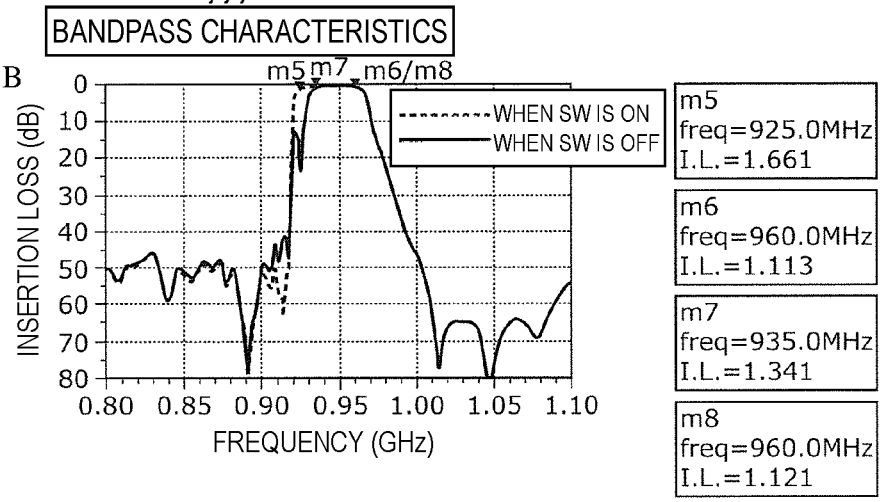

FIGS. 17A-17B is a first group of drawings illustrating the characteristics of the filter according to the sixth configuration example. FIGS. 17C-17F is a second group of drawings illustrating the characteristics of the filter according to the sixth configuration example.

As shown in FIGS. 17A and 17B (in particular, FIG. 17A), in the filter according to the sixth configuration example, the parallel arm resonance circuit 21 is connected to the even-numbered IDT of the longitudinally coupled resonator device s30, and the series arm resonator s1 is connected to the odd-numbered IDTs of the longitudinally coupled resonator device s30. That is, the filter of the sixth configuration example is a tunable filter similar to the filter of the first configuration example, except that the series arm resonator s1 is connected to the odd-numbered IDT terminal (Port2 in FIGS. 2A-2D) of the longitudinally coupled resonator device s30.

In the filter configured as described above, as well as in the first configuration example, as shown in FIGS. 17A and 17B (in particular, FIG. 17B and FIG. 17C through FIG. 17F), the loss caused by impedance mismatching within the filter can be reduced, thereby decreasing the loss within the pass band. Additionally, the series arm resonator s1 is connected to the odd-numbered IDTs of the longitudinally coupled resonator device s30, thereby achieving impedance matching at the odd-numbered IDT terminal. This can further reduce variations in the impedance within the pass band, thereby decreasing the loss within the pass band.

[3-7. Seventh Configuration Example (Fifth Example)]

Figure 18A:
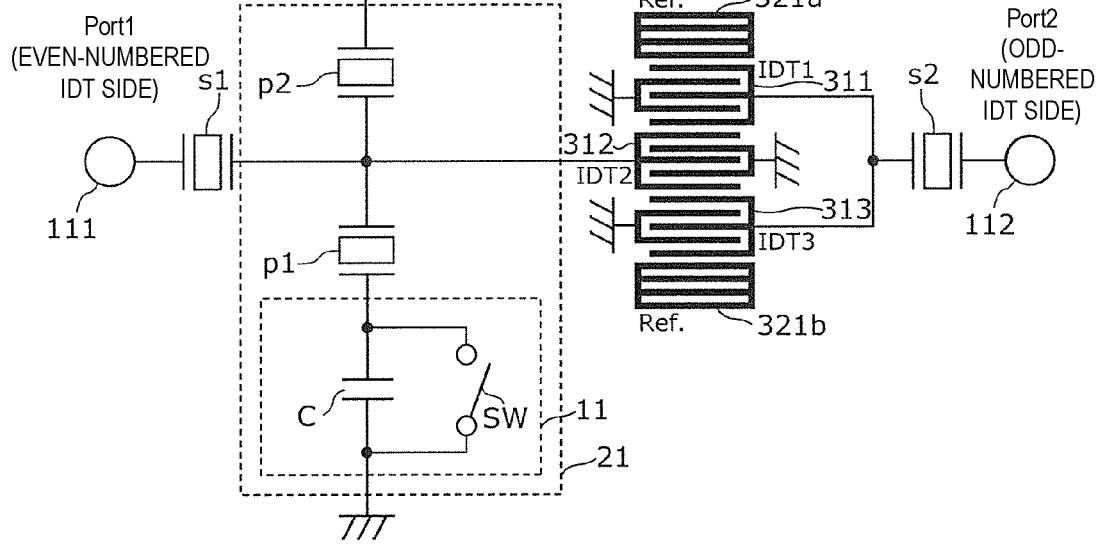
FIGS. 18A-18B are a first group of drawings illustrating the characteristics of a filter according to a seventh configuration example.
Figure 18B:
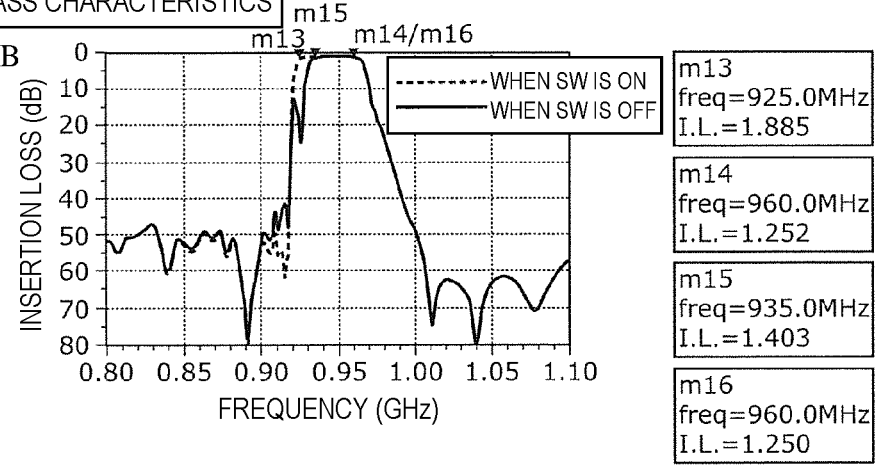

FIG. 18A is a first drawing illustrating the characteristics of the filter according to the seventh configuration example. FIG. 18B is a second drawing illustrating the characteristics of the filter according to the seventh configuration example.

As shown in FIGS. 18A and 18B (in particular, FIG. 18A), in the filter according to the seventh configuration example, the parallel arm resonance circuit 21 is connected to the even-numbered IDT of the longitudinally coupled resonator device s30, and then, the series arm resonator s1 is connected to the parallel arm resonance circuit 21. Additionally, the series arm resonator s2 is connected to the odd-numbered IDTs of the longitudinally coupled resonator device s30. That is, the filter of the seventh configuration example is a tunable filter similar to the filter of the second configuration example, except that the series arm resonator s2 is connected to the odd-numbered IDT terminal (Port2 in FIGS. 2A-2D) of the longitudinally coupled resonator device s30.

In the filter configured as described above, as well as in the second configuration example, as shown in FIGS. 18A and 18B (in particular, FIG. 18B and FIG. 18C through FIG. 18F), the loss caused by impedance mismatching within the filter can be reduced, thereby decreasing the loss within the pass band. Additionally, the series arm resonator s2 is connected to the odd-numbered IDTs of the longitudinally coupled resonator device s30, thereby achieving impedance matching at the odd-numbered IDT terminal, as in the seventh configuration example. This can further reduce variations in the impedance within the pass band, thereby decreasing the loss within the pass band.

[3-8. Eighth Configuration Example (Sixth Example)]

Figure 19A:
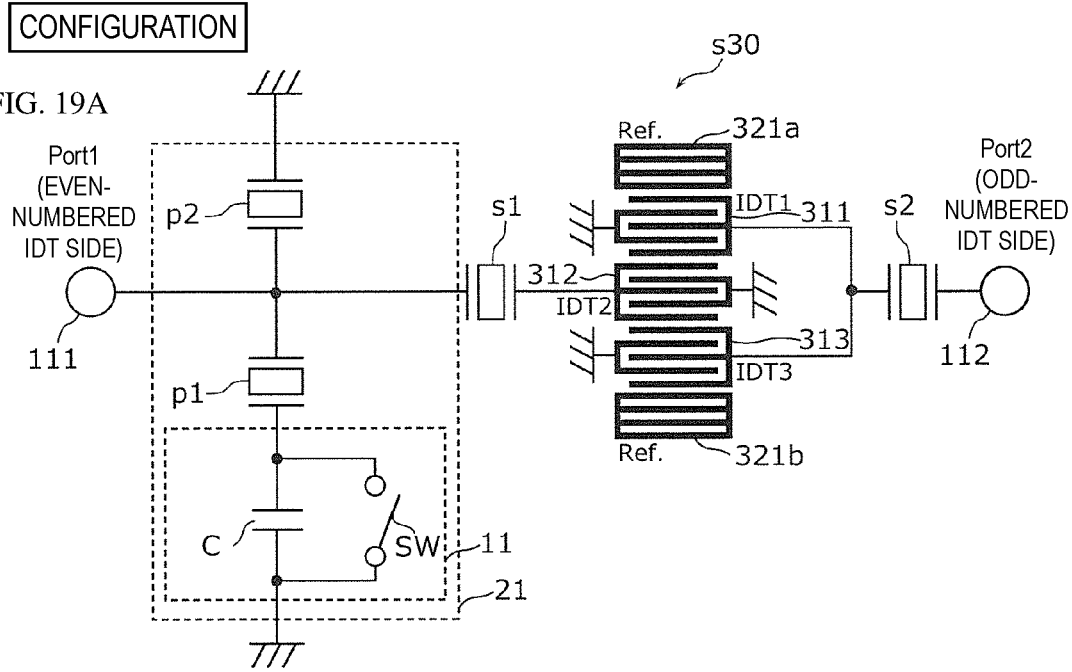
FIGS. 19A-19B are a first group of drawings illustrating the characteristics of a filter according to an eighth configuration example.
Figure 19B:
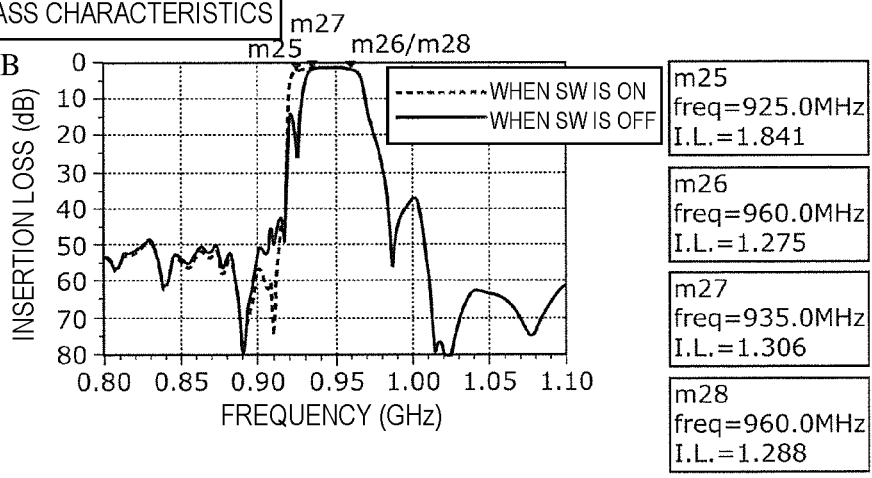

FIG. 19A is a first drawing illustrating the characteristics of the filter according to the eighth configuration example. FIG. 19B is a second drawing illustrating the characteristics of the filter according to the eighth configuration example.

As shown in FIGS. 19A and 19B (in particular, FIG. 19A), in the filter according to the eighth configuration example, the series arm resonator s1 is connected to the even-numbered IDT of the longitudinally coupled resonator device s30, and then, the parallel arm resonance circuit 21 is connected to the series arm resonator s1. Additionally, the series arm resonator s2 is connected to the odd-numbered IDTs of the longitudinally coupled resonator device s30. That is, the filter of the eighth configuration example is a tunable filter similar to the filter of the third configuration example, except that the series arm resonator s2 is connected to the odd-numbered IDT terminal (Port2 in FIGS. 2A-2D) of the longitudinally coupled resonator device s30.

In the filter configured as described above, as well as in the third configuration example, as shown in FIGS. 19A and 19B (in particular, FIG. 19B and FIG. 19C through FIG. 19F), the loss caused by impedance mismatching within the filter can be reduced, thereby decreasing the loss within the pass band. Additionally, the series arm resonator s2 is connected to the odd-numbered IDTs of the longitudinally coupled resonator device s30, thereby achieving impedance matching at the odd-numbered IDT terminal, as in the seventh configuration example. This can further reduce variations in the impedance within the pass band, thereby decreasing the loss within the pass band.

[3-9. Summary of Configuration]

As is seen from the first through eighth configuration examples, the parallel arm resonance circuit 21 or the ladder circuit constituted by the parallel arm resonance circuit 21 and the series arm resonator s1 is connected to the even-numbered IDT terminal (Port1 in FIGS. 2A-2D) of the longitudinally coupled resonator device s30, thereby reducing impedance mismatching in the filter. It is thus possible to implement a tunable filter that can reduce the loss within the pass band while achieving sufficient attenuation in a band separated from the pass band.

In the first through third configuration examples (first through third examples), the odd-numbered IDT terminal (Port2 in FIGS. 2A-2D) and the input-output terminal 112 (second input-output terminal) are connected to each other without any elastic wave resonator interposed therebetween. In the sixth through eighth configuration examples (fourth through sixth examples), the odd-numbered IDT terminal and the input-output terminal 112 are connected to each other without any elastic wave resonator other than a series arm resonator (second series arm resonator) interposed therebetween. The series arm resonator is the series arm resonator s1 in the sixth configuration example (fourth example) and is the series arm resonator s2 in the seventh and eighth configuration examples (fifth and sixth examples).

That is, no elastic wave resonator is connected or only a series arm resonator is connected between the odd-numbered IDT terminal of the longitudinally coupled resonator device s30 and the input-output terminal 112. This can reduce the occurrence of impedance mismatching within the filter. It is thus possible to implement a tunable filter (small-loss tunable filter) that can reduce the loss within the pass band while achieving sufficient attenuation in a band separated from the pass band.

For the sake of simplicity, a description has been given above, assuming that the longitudinally coupled resonator device s30 is constituted by three IDT electrodes, for example. However, the longitudinally coupled resonator device s30 according to this embodiment may be constituted by five or nine IDT electrodes, for example, instead of three IDT electrodes.

FIGS. 20A-20F show diagrams illustrating configurations applicable to the longitudinally coupled resonator device s30 according to this embodiment and the characteristics thereof. More specifically, FIG. 20A through FIG. 20C are schematic diagrams illustrating longitudinally coupled resonator devices. FIG. 20A is a schematic diagram illustrating a longitudinally coupled resonator device (hereinafter called "3-IDT configuration") constituted by three IDT electrodes (IDT1 through IDT3). FIG. 20B is a schematic diagram illustrating a longitudinally coupled resonator device (hereinafter called "5-IDT configuration") constituted by five IDT electrodes (IDT1 through IDT5). FIG. 20C is a schematic diagram illustrating a longitudinally coupled resonator device (hereinafter called "9-IDT configuration") constituted by nine IDT electrodes (IDT1 through IDT9). FIG. 20E is a Smith chart illustrating the impedance characteristics at Port1 in FIG. 20A through FIG. 20C. FIG. 20F is a Smith chart illustrating the impedance characteristics at Port2 in FIG. 20A through FIG. 20C.

Regarding the characteristics, the characteristics of the 3-IDT configuration are indicated by the solid line, the characteristics of the 5-IDT configuration are indicated by the broken line, and the characteristics of the 9-IDT configuration are indicated by the long dashed dotted line. The 3-IDT configuration, 5-IDT configuration, and 9-IDT configuration are applied to the filter 10 having the basic configuration shown in FIG. 1. In FIG. 20E and FIG. 20F, the characteristics of the 3-IDT configuration, 5-IDT configuration, and 9-IDT configuration in the pass band (925 to 960 MHz) when the switch SW is ON are indicated by the thick lines.

As shown in FIG. 20E and FIG. 20F, variations in the impedance of the 5-IDT configuration and 9-IDT configuration within the pass band are similar to those of the 3-IDT configuration. That is, the impedance at Port1, which is the even-numbered IDTs terminal is capacitive at the low edge of the pass band and becomes inductive as the frequency increases. In contrast, the impedance at Port2, which is the odd-numbered IDT terminal, connected to the odd-numbered IDTs is inductive at the low edge of the pass band and becomes capacitive as the frequency increases.

The above-described first knowledge and second knowledge regarding impedance matching with a longitudinally coupled resonator device is applicable, not only to a longitudinally coupled resonator device having the 3-IDT configuration, but also to a longitudinally coupled resonator device having the 5-IDT or 9-IDT configuration.

As shown in FIG. 20D, providing more IDT electrodes makes it possible to enhance the sharpness on the low-frequency side of the pass band.

The longitudinally coupled resonator device s30 may not necessarily be constituted by three, five, or nine IDT electrodes, and may be constituted by any three or more odd-number IDT electrodes.

4. Advantages and Others

As described above, in the filter (elastic wave filter device) according to this embodiment, the parallel arm resonator p1 (first parallel arm resonator) is connected to the even-numbered IDT terminal of the longitudinally coupled resonator device s30.

The impedance of the even-numbered IDT terminal is capacitive at the low edge of the pass band and becomes inductive as the frequency increases (see FIG. 2C). In contrast, the impedance of the odd-numbered IDT terminal is inductive at the low edge of the pass band and becomes capacitive as the frequency increases (see FIG. 2D). The impedance of the parallel arm resonator p1 is inductive at the low edge of the pass band and approaches the normalized impedance as the frequency increases (see FIG. 3C).

As a result of connecting the parallel arm resonator p1 to the even-numbered IDT terminal of the longitudinally coupled resonator device s30, the impedance of the longitudinally coupled resonator device s30 and that of the parallel arm resonator p1 almost satisfy a conjugate relationship, thereby reducing the loss caused by impedance mismatching within the filter.

The variable frequency circuit 11 is connected to the parallel arm resonator p1, thereby making it possible to vary the frequency as a result of the switch being switched between ON and OFF.

According to this embodiment, it is possible to implement a variable-frequency elastic wave filter device (tunable filter) that can reduce the loss within the pass band as a result of providing impedance matching with the longitudinally coupled resonator device s30. That is, it is possible to reduce the loss within the pass band as a result of providing impedance matching with the longitudinally coupled resonator device s30 while achieving sufficient attenuation in a band separated from the pass band by using the longitudinally coupled resonator device s30.

In the filter according to this embodiment, the even-numbered IDT is connected to the input-output terminal 111 (first input-output terminal) via the node x1, while the odd-numbered IDTs are connected to the input-output terminal 112 (second input-output terminal). This can reduce the occurrence of impedance mismatching both at the even-numbered IDT terminal and at the odd-numbered IDT terminal of the longitudinally coupled resonator device s30, thereby further reducing the loss within the pass band.

A circuit element, such as an inductor, a capacitor, or a switch, may be connected between the even-numbered IDT and the node x1. That is, "being connected" is not limited to direct connection without any intervening circuit element, but includes indirect connection with an intervening circuit element.

The filters according to this embodiment (in particular, filters of the second, third, fifth, and sixth examples) include a series arm resonator (first series arm resonator) provided on a path connecting the input-output terminal 111 and the even-numbered IDT terminal. The provision of the series arm resonator adds the characteristics of a ladder circuit to those of the longitudinally coupled resonator device s30, thereby enhancing the attenuation characteristics outside the pass band, for example, sharp attenuation characteristics are obtained on the high-frequency side of the pass band.

In the filter according to this embodiment (in particular, filters of the first through third examples), the odd-numbered IDT terminal and the input-output terminal 112 are connected to each other without any elastic wave resonator interposed therebetween.

As stated above, the impedance at the odd-numbered IDT terminal is inductive at the low edge of the pass band and becomes capacitive as the frequency increases (see FIG. 2D). As discussed above, the impedance of the parallel arm resonator is inductive at the low edge of the pass band and approaches the normalized impedance as the frequency increases (see FIG. 3C). The impedance of the ladder circuit is inductive at the low edge of the pass band and becomes capacitive as the frequency increases (see FIG. 8C and FIG. 8D). With the above-described characteristics, when a parallel arm resonator or a ladder circuit is connected between the odd-numbered IDT terminal and the input-output terminal 112, impedance mismatching occurs in the filter, thereby increasing the loss. As a result of connecting the odd-numbered IDT terminal and the input-output terminal 112 without any elastic wave resonator interposed therebetween, the occurrence of impedance mismatching is decreased, thereby further reducing the loss within the pass band.

The filters according to this embodiment (in particular, filters of the fourth through sixth examples) include a series arm resonator (series arm resonator s1 in the fourth example and series arm resonator s2 in the fifth and sixth examples) provided on a path connecting the odd-numbered IDT terminal and the input-output terminal 112 (second input-output terminal).

The impedance of the series arm resonator at the low edge of the pass band is positioned at the vicinity of the normalized impedance and becomes inductive as the frequency increases (see FIG. 4C). As a result of connecting the series arm resonator to the odd-numbered IDT terminal of the longitudinally coupled resonator device s30, the impedance of the longitudinally coupled resonator device s30 and that of the series arm resonator almost satisfy a conjugate relationship, thereby reducing the loss caused by impedance mismatching within the filter. With this configuration, impedance matching can be provided at the odd-numbered IDT terminal as well as at the even-numbered IDT terminal of the longitudinally coupled resonator device s30, thereby further reducing the loss within the pass band.

In the filters of this embodiment, the longitudinally coupled resonator device s30 includes three, five, or nine IDT electrodes.

The filters of this embodiment include the parallel arm resonator p2 (second parallel arm resonator) having a resonant frequency and an anti-resonant frequency different from those of the parallel arm resonator p1. It is thus possible to implement a tunable filter that can shift the frequency of at least one of the attenuation pole on the low-frequency side of the pass band and that on the high-frequency side of the pass band (attenuation pole on the low-frequency side of the pass band in this embodiment).

In other words, in this embodiment, the circuit including the parallel arm resonator p1 and that including the parallel arm resonator p2 are connected in parallel with each other. This implements a tunable filter that can switch the frequency of at least one of the attenuation pole on the low-frequency side of the pass band and that on the high-frequency side of the pass band as a result of the switch SW being switched between ON and OFF.

In the filters of this embodiment, the resonant frequency of the parallel arm resonator p2 is higher than that of the parallel arm resonator p1, and the anti-resonant frequency of the parallel arm resonator p2 is higher than that of the parallel arm resonator p1. This implements a tunable filter that can shift the pass band to the higher-frequency side substantially without increasing the insertion loss at the low edge of the pass band while shifting the attenuation pole on the low-frequency side of the pass band to the higher-frequency side.

This will be explained more specifically. In this embodiment, a series circuit of the parallel arm resonator p1 and the variable frequency circuit 11 is connected in parallel with the parallel arm resonator p2. This configuration implements a tunable filter that can switch between the first characteristics and the second characteristics substantially without increasing the insertion loss at the low edge of the pass band while switching the frequency of the attenuation pole on the low-frequency side of the pass band as a result of the switch SW being switched between ON and OFF.

In this embodiment, the capacitor C is used as the first impedance element by way of example. However, the first impedance element is not restricted to a capacitor, and may be an inductor, for example. In the case of using an inductor as the first impedance element, in the circuit constituted by the parallel arm resonator p1 and a variable frequency circuit, when the switch SW is OFF, the inductor is added to the parallel arm resonator p1, and, when the switch SW is ON, the inductor is short-circuited and only the parallel arm resonator p1 forms the circuit. Hence, when the switch SW is OFF, the resonant frequency of the parallel arm resonance circuit 21 shifts to the lower-frequency side and becomes lower than that of the single parallel arm resonator p1. The filter configured as described above is thus able to shift the attenuation pole on the low-frequency side of the pass band to a lower-frequency region as a result of the switch SW being changed from ON to OFF.

The configurations of the filters according to this embodiment are applicable to the configuration of another tunable filter. As various modified examples of this embodiment, the configurations of a ladder circuit to be connected to the longitudinally coupled resonator device s30 will be described below.

A series arm resonator may be removed from a ladder circuit, which will be discussed below, and such a circuit (that is, a parallel arm resonance circuit) may be connected to the longitudinally coupled resonator device s30. The configuration of such a circuit is also included in the filters of the present disclosure. The resonant frequencies and the anti-resonant frequencies of the series arm resonator s1 and the parallel arm resonators p1 and p2, which will be described below, are different from those discussed in the embodiment. From this point of view, a circuit having a configuration similar to that of a ladder circuit discussed in this embodiment will repeatedly be described. The ladder circuits, which will be described below, are illustrated merely for providing examples of the circuit configuration.

When such a ladder circuit is connected to the longitudinally coupled resonator device s30 of this embodiment, the resonant frequency and the anti-resonant frequency of each resonator are suitably adjusted in accordance with the required pass band.

First Modified Example

In the above-described embodiment, the variable frequency circuit 11 is connected in series with only the parallel arm resonator p1 of the parallel arm resonators p1 and p2. However, the variable frequency circuit 11 may be connected in series with only the parallel arm resonator p2 of the parallel arm resonators p1 and p2.

Figure 21A:
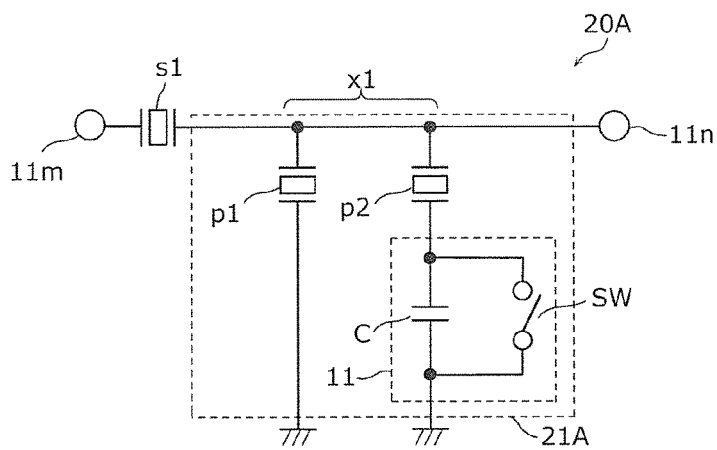
FIG. 21A is a circuit diagram illustrating a ladder circuit according to a first modified example.

FIG. 21A is a circuit diagram illustrating a ladder circuit 20A according to a first modified example.

The ladder circuit 20A shown in FIG. 21A includes a parallel arm resonance circuit 21A instead of the parallel arm resonance circuit 21 of the ladder circuit shown in FIG. 8A. In the parallel arm resonance circuit 21A, the variable frequency circuit 11 is connected in series with only the parallel arm resonator p2 of the parallel arm resonators p1 and p2.

That is, in this modified example, the parallel arm resonator p1 having a resonant frequency and an anti-resonant frequency lower than those of the parallel arm resonator p2 (first parallel arm resonator) is connected in parallel with the parallel arm resonator p2. The parallel arm resonator p1 corresponds to a second parallel arm resonator having a resonant frequency and an anti-resonant frequency different from those of the parallel arm resonator p2.

Figure 21B:
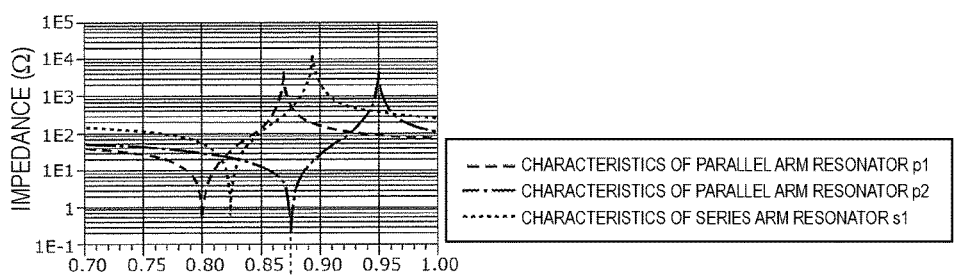
FIGS. 21B-21D show graphs illustrating the filter characteristics of the ladder circuit according to the first modified example.
Figure 21C:
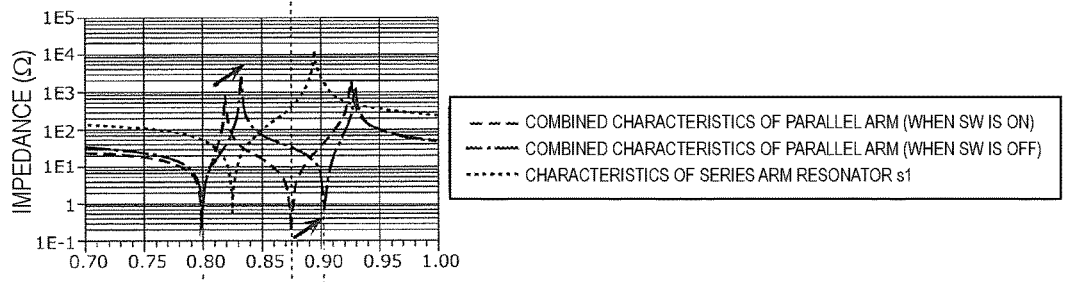
Figure 21D:
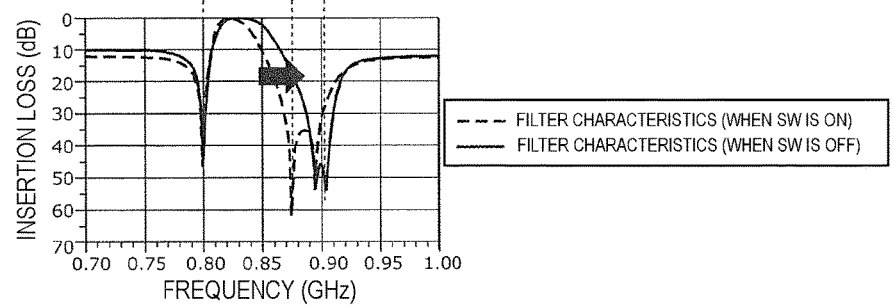

FIGS. 21B-21D shows graphs illustrating the filter characteristics (bandpass characteristics) of the ladder circuit 20A according to the first modified example of the first embodiment. More specifically, FIGS. 21B-21D shows graphs illustrating the comparison results between the filter characteristics when the switch SW is ON and those when the switch SW is OFF.

In the ladder circuit 20A, the pass band is formed by causing the lower anti-resonant frequency of the two anti-resonant frequencies of the parallel arm resonance circuit 21A and the resonant frequency of the series arm resonator s1 to be close to each other.

In this modified example, the capacitor C is added to the parallel arm resonator p2 only when the switch SW is OFF. With this arrangement, when the switch SW is OFF, the higher resonant frequency of the two resonant frequencies of the parallel arm resonance circuit 21A shifts to the higher-frequency side and becomes higher than the resonant frequency of the single parallel arm resonator p2. When the switch SW is OFF, the lower anti-resonant frequency of the parallel arm resonance circuit 21A shifts to the higher-frequency side and becomes higher than that when the switch SW is ON. The attenuation pole on the high-frequency side of the pass band of the ladder circuit 20A is determined by the higher anti-resonant frequency of the parallel arm resonance circuit 21A. The sharpness of the attenuation slope on the high-frequency side of the pass band is determined by the difference between the higher resonant frequency and the lower anti-resonant frequency of the parallel arm resonance circuit 21A. Hence, as a result of the switch SW being changed from ON to OFF, the ladder circuit 20A is able to shift the pass band to the higher-frequency side substantially without increasing the insertion loss at the high edge of the pass band while shifting the attenuation pole on the high-frequency side of the pass band to the higher-frequency side.

From another perspective, in this modified example, the parallel arm resonator p1 and a series circuit of the parallel arm resonator p2 and the variable frequency circuit 11 are connected in parallel with each other. This configuration implements a tunable filter that can switch between the first characteristics and the second characteristics substantially without increasing the insertion loss at the high edge of the pass band while switching the frequency of the attenuation pole on the high-frequency side of the pass band as a result of the switch SW being switched between ON and OFF.

In the ladder circuit 20A configured as described above, too, an input-output terminal 11m or 11n of the ladder circuit 20A is connected to the even-numbered IDT terminal of the longitudinally coupled resonator device s30, thereby reducing the loss caused by impedance mismatching within the filter. That is, it is possible to implement a tunable filter that can reduce the loss within the pass band while achieving sufficient attenuation in a band separated from the pass band.

Second Modified Example

The variable frequency circuit 11 may be connected in series with only the parallel arm resonator p1 of the parallel arm resonators p1 and p2.

FIG. 22A is a circuit diagram illustrating a ladder circuit 20B according to a second modified example.

The ladder circuit 20B shown in FIG. 22A includes a parallel arm resonance circuit 21B instead of the parallel arm resonance circuit 21A of the ladder circuit 20A shown in FIG. 21A. In the parallel arm resonance circuit 21B, the variable frequency circuit 11 is connected in series with only the parallel arm resonator p1 of the parallel arm resonators p1 and p2.

That is, in this modified example, the parallel arm resonator p2 having a resonant frequency and an anti-resonant frequency higher than those of the parallel arm resonator p1 (first parallel arm resonator) is connected in parallel with the parallel arm resonator p1. The parallel arm resonator p2 corresponds to a second parallel arm resonator having a resonant frequency and an anti-resonant frequency different from those of the parallel arm resonator p1.

FIGS. 22B-22D show graphs illustrating the filter characteristics (bandpass characteristics) of the ladder circuit 20B according to the second modified example of the first embodiment. More specifically, FIGS. 22B-22D show graphs illustrating the comparison results between the filter characteristics when the switch SW is ON and those when the switch SW is OFF.

In the parallel arm resonance circuit 21B, the impedance is minimized at each of the resonant frequency of the parallel arm resonator p1 and that of the parallel arm resonator p2. That is, the parallel arm resonance circuit 21B has two resonant frequencies. In the parallel arm resonance circuit 21B, the impedance is maximized in a frequency band between the two resonant frequencies and in a frequency band higher than the two resonant frequencies. That is, the parallel arm resonance circuit 21B has two anti-resonant frequencies.

In the ladder circuit 20B, the pass band is formed by causing the lower anti-resonant frequency of the two anti-resonant frequencies of the parallel arm resonance circuit 21B and the resonant frequency of the series arm resonator s1 to be close to each other.

In this modified example, the capacitor C is added to the parallel arm resonator p1 only when the switch SW is OFF. With this arrangement, when the switch SW is OFF, the lower resonant frequency of the two resonant frequencies of the parallel arm resonance circuit 21B shifts to the higher-frequency side and becomes higher than the resonant frequency of the single parallel arm resonator p1. When the switch SW is OFF, the lower anti-resonant frequency of the parallel arm resonance circuit 21B shifts to the higher-frequency side and becomes higher than that when the switch SW is ON. The attenuation pole on the low-frequency side of the pass band of the ladder circuit 20B is determined by the lower anti-resonant frequency of the parallel arm resonance circuit 21B. The sharpness of the attenuation slope on the low-frequency side of the pass band is determined by the difference between the lower resonant frequency and the lower anti-resonant frequency of the parallel arm resonance circuit 21B. Hence, as a result of the switch SW being changed from ON to OFF, the ladder circuit 20B is able to shift the pass band to the higher-frequency side substantially without increasing the insertion loss at the low edge of the pass band while shifting the attenuation pole on the low-frequency side of the pass band to the higher-frequency side.

In the ladder circuit 20B configured as described above, too, an input-output terminal 11m or 11n of the ladder circuit 20B is connected to the even-numbered IDT terminal of the longitudinally coupled resonator device s30, thereby reducing the loss caused by impedance mismatching within the filter. That is, it is possible to implement a tunable filter that can reduce the loss within the pass band while achieving sufficient attenuation in a band separated from the pass band.

Third Modified Example

In the first modified example, the ladder circuit 20A includes the variable frequency circuit 11 connected in series with only the parallel arm resonator p2 of the parallel arm resonators p1 and p2. In the second modified example, the ladder circuit 20B includes the variable frequency circuit 11 connected in series with only the parallel arm resonator p1 of the parallel arm resonators p1 and p2. However, a ladder circuit may include both of the variable frequency circuit 11 in the first modified example and that in the second modified example.

FIG. 23A is a circuit diagram of a ladder circuit 20C according to a third modified example.

The ladder circuit 20C shown in FIG. 23A includes both of a variable frequency circuit 11a corresponding to the variable frequency circuit 11 of the ladder circuit 20B shown in FIG. 22A and a variable frequency circuit 11b corresponding to the variable frequency circuit 11 of the ladder circuit 20A shown in FIG. 21A. That is, a parallel arm resonance circuit 21C of this modified example includes the variable frequency circuit 11a connected in series with only one of the parallel arm resonators p1 and p2 (first and second parallel arm resonators) and the variable frequency circuit 11b connected in series with only the other one of the parallel arm resonators p1 and p2 (first and second parallel arm resonators).

FIGS. 23B-23D shows graphs illustrating the filter characteristics (bandpass characteristics) of the ladder circuit 20C according to the third modified example of the first embodiment. More specifically, FIGS. 23B-23D shows graphs illustrating the comparison results between the filter characteristics when switches SW are ON and those when the switches SW are OFF.

In the ladder circuit 20C, a capacitor C1 is added to the parallel arm resonator p1 only when the switch SW1 is OFF, and a capacitor C2 is added to the parallel arm resonator p2 only when the switch SW2 is OFF. With this arrangement, when the switch SW1 is OFF, the lower resonant frequency of the two resonant frequencies of the parallel arm resonance circuit 21C shifts to the higher-frequency side and becomes higher than the resonant frequency of the single parallel arm resonator p1. When the switch SW2 is OFF, the higher resonant frequency of the two resonant frequencies of the parallel arm resonance circuit 21C shifts to the higher-frequency side and becomes higher than the resonant frequency of the single parallel arm resonator p2. When at least one of the switches SW1 and SW2 is OFF, the lower anti-resonant frequency of the parallel arm resonance circuit 21C shifts to the higher-frequency side and becomes higher than that when both of the switches SW1 and SW2 are ON.

Hence, as a result of both of the switches SW1 and SW2 being changed from ON to OFF, the ladder circuit 20C is able to shift the pass band to a higher-frequency region without increasing the insertion loss on the high and low edges of the pass band while shifting the attenuation pole on the high-frequency side and that on the low-frequency side of the pass band to a higher-frequency region.

From another perspective, in this modified example, a series circuit of the parallel arm resonator p1 and one variable frequency circuit 11a and a series circuit of the parallel arm resonator p2 and the other variable frequency circuit 11b are connected in parallel with each other. This configuration implements a tunable filter that can switch the frequency of the attenuation pole on the high-frequency side and that on the low-frequency side of the pass band and can also reduce the insertion loss on the high and low edges of the pass band as a result of the switches SW1 and SW2 being switched between ON and OFF.

The ladder circuit 20C can thus shift (switch) the center frequency while maintaining the bandwidth, for example.

In the ladder circuit 20C, the switches SW1 and SW2 may not necessarily be switched from ON to OFF or from OFF to ON together, and may be switched individually. However, if the switches SW1 and SW2 are switched from ON to OFF or from OFF to ON together, fewer control lines are required for controlling the switches SW1 and SW2, thereby making it possible to simplify the configuration of the ladder circuit 20C.

On the other hand, if the switches SW1 and SW2 are switched between ON and OFF individually, variations in the bandwidths that can be switched by the ladder circuit 20C can be increased.

More specifically, the high edge of the pass band can be changed as a result of the switch SW2 connected in series with the parallel arm resonator p2 being switched between ON and OFF. The low edge of the pass band can be changed as a result of the switch SW1 connected in series with the parallel arm resonator p1 being switched between ON and OFF.

Switching both of the switches SW1 and SW2 to be ON or OFF can shift both of the high and low edges of the pass band to the lower-frequency side or the higher-frequency side. That is, the center frequency of the pass band can be shifted to the lower-frequency side or the higher-frequency side. Additionally, by switching one of the switches SW1 and SW2 from ON to OFF and the other one of the switches SW1 and SW2 from OFF to ON, the high and low edges of the pass band can be shifted to increase or decrease the frequency difference therebetween. That is, it is possible to vary the pass band width while fixing the center frequency of the pass band at substantially the same position. By setting one of the switches SW1 and SW2 to be ON or OFF and by switching the other one of the switches SW1 and SW2 between ON and OFF, one of the high and low edges of the pass band is fixed and the other one of the high and low edges can be shifted to the lower-frequency side or the higher-frequency side. That is, it is possible to vary the low edge or the high edge of the pass band.

In this manner, the ladder circuit 20C includes the variable frequency circuit 11a connected in series with only the parallel arm resonator p1 of the parallel arm resonators p1 and p2 and the variable frequency circuit 11b connected in series with only the parallel arm resonator p2 of the parallel arm resonators p1 and p2, thereby making it possible to increase the flexibility in varying the pass band.

In the ladder circuit 20C configured as described above, too, an input-output terminal 11m or 11n of the ladder circuit 20C is connected to the even-numbered IDT terminal of the longitudinally coupled resonator device s30, thereby reducing the loss caused by impedance mismatching within the filter. That is, it is possible to implement a tunable filter that can reduce the loss within the pass band while achieving sufficient attenuation in a band separated from the pass band.

Fourth Modified Example

In the first modified example, the variable frequency circuit 11 is connected in series with only the parallel arm resonator p2 of the parallel arm resonators p1 and p2. In the second modified example, the variable frequency circuit 11 is connected in series with only the parallel arm resonator p1 of the parallel arm resonators p1 and p2. However, the variable frequency circuit 11 may be connected in series with a parallel circuit of the parallel arm resonators p1 and p2.

FIG. 24A is a circuit diagram of a ladder circuit 20D according to a fourth modified example.

The ladder circuit 20D shown in FIG. 24A includes a parallel arm resonance circuit 21D having a variable frequency circuit 11 connected in series with a parallel circuit of the parallel arm resonators p1 and p2.

FIGS. 24B-24D show graphs illustrating the filter characteristics (bandpass characteristics) of the ladder circuit 20D according to the fourth modified example of the first embodiment. More specifically, FIGS. 24B-24D shows graphs illustrating the comparison results between the filter characteristics when the switch SW is ON and those when the switch SW is OFF.

In the ladder circuit 20D as well as in the ladder circuits of the first through third modified examples, the pass band is formed by causing the lower anti-resonant frequency of the two anti-resonant frequencies of the parallel arm resonance circuit 21D and the resonant frequency of the series arm resonator s1 to be close to each other.

In this modified example, the capacitor C is added to both of the parallel arm resonators p1 and p2 only when the switch SW is OFF. With this arrangement, when the switch SW is OFF, the lower resonant frequency of the two resonant frequencies of the parallel arm resonance circuit 21D shifts to the higher-frequency side and becomes higher than the resonant frequency of the single parallel arm resonator p1. When the switch SW is OFF, the higher resonant frequency of the two resonant frequencies of the parallel arm resonance circuit 21D shifts to the higher-frequency side and becomes higher than the resonant frequency of the single parallel arm resonator p2. However, when the switch SW is OFF, the lower anti-resonant frequency of the parallel arm resonance circuit 21D does not shift because the variable frequency circuit 11 is connected in series with the parallel circuit of the parallel arm resonators p1 and p2. Hence, as a result of the switch SW being changed from ON to OFF, the ladder circuit 20D is able to shift the attenuation poles on both sides of the pass band to the higher-frequency side. In other words, as a result of the switch SW being switched between ON and OFF, the ladder circuit 20D is able to switch the frequencies of the attenuation poles on both sides of the pass band.

In the ladder circuit 20D configured as described above, too, an input-output terminal 11m or 11n of the ladder circuit 20D is connected to the even-numbered IDT terminal of the longitudinally coupled resonator device s30, thereby reducing the loss caused by impedance mismatching within the filter. That is, it is possible to implement a tunable filter that can reduce the loss within the pass band while achieving sufficient attenuation in a band separated from the pass band.

Fifth Modified Example

The above-described parallel arm resonance circuits each include, not only the parallel arm resonator p1 which determines the attenuation pole on the low-frequency side of the pass band, but also the parallel arm resonator p2 which determines the attenuation pole on the high-frequency side of the pass band. However, the attenuation pole on the high-frequency side of the pass band may also be formed by the series arm resonator s1. Accordingly, the parallel arm resonance circuit may not necessarily include the parallel arm resonator p2.

Figure 25A:
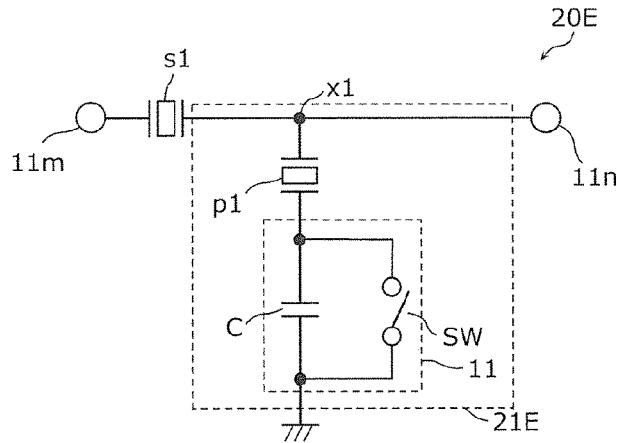
FIG. 25A is a circuit diagram illustrating a ladder circuit according to a fifth modified example.

FIG. 25A is a circuit diagram illustrating a ladder circuit 20E according to a fifth modified example.

The ladder circuit 20E shown in FIG. 25A includes a parallel arm resonance circuit 21E without the parallel arm resonator p2, instead of the parallel arm resonance circuit 21B of the ladder circuit 20B shown in FIG. 22A.

Figure 25B:
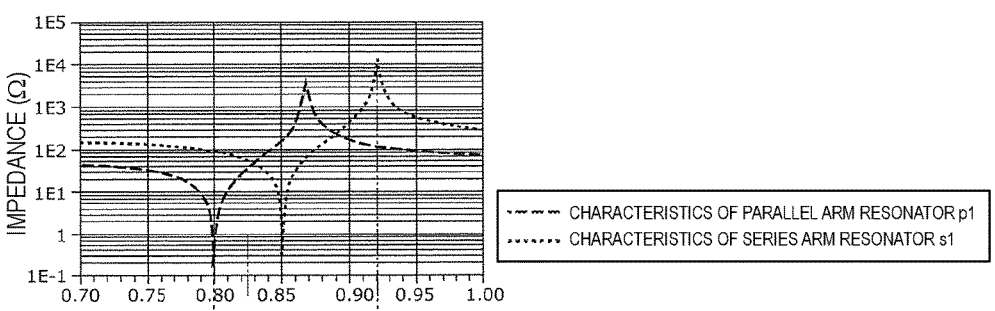
FIGS. 25B-25D show graphs illustrating the filter characteristics of the ladder circuit according to the fifth modified example.
Figure 25C:
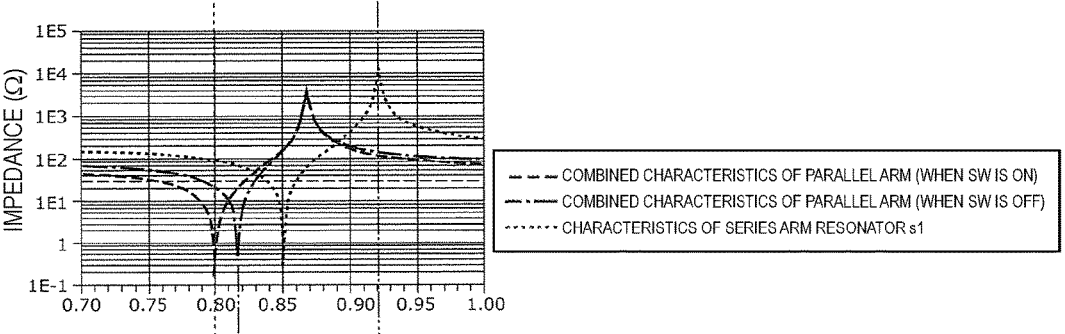
Figure 25D:
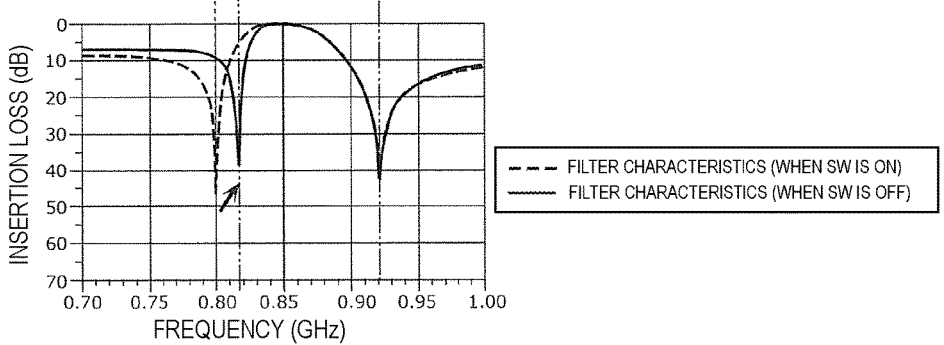

FIGS. 25B-25D shows graphs illustrating the filter characteristics (bandpass characteristics) of the ladder circuit 20E according to the first modified example of the fifth embodiment. More specifically, FIGS. 25B-25D shows graphs illustrating the comparison results between the filter characteristics when the switch SW is ON and those when the switch SW is OFF.

In the ladder circuit 20E, the pass band is formed by causing the anti-resonant frequency of the parallel arm resonance circuit 21E and the resonant frequency of the series arm resonator s1 to be close to each other.

In this modified example, the capacitor C is added to the parallel arm resonator p1 only when the switch SW is OFF. With this arrangement, when the switch SW is OFF, the resonant frequency of the parallel arm resonance circuit 21E shifts to the higher-frequency side and becomes higher than the resonant frequency of the single parallel arm resonator p1. The attenuation pole on the low-frequency side of the pass band of the ladder circuit 20E is determined by the resonant frequency of the parallel arm resonance circuit 21E. Hence, as a result of the switch SW being changed from ON to OFF, the ladder circuit 20E is able to shift the attenuation pole on the low-frequency side of the pass band to the higher-frequency side. That is, as a result of the switch SW being switched between ON and OFF, the ladder circuit 20E is able to switch the pass band.

In the ladder circuit 20E configured as described above, too, an input-output terminal 11m or 11n of the ladder circuit 20E is connected to the even-numbered IDT terminal of the longitudinally coupled resonator device s30, thereby reducing the loss caused by impedance mismatching within the filter. That is, it is possible to implement a tunable filter that can reduce the loss within the pass band while achieving sufficient attenuation in a band separated from the pass band.

Sixth Modified Example

In the above-described fifth modified example, as the variable frequency circuit 11, a parallel circuit of the switch SW and the capacitor C has been discussed by way of example. However, the variable frequency circuit is not restricted to this configuration.

Figure 26A:
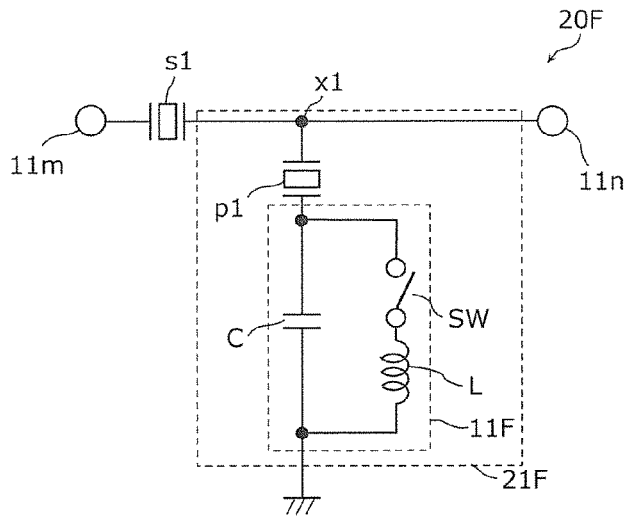
FIG. 26A is a circuit diagram illustrating a ladder circuit according to a sixth modified example.

FIG. 26A is a circuit diagram of a ladder circuit 20F according to a sixth modified example.

The ladder circuit 20F shown in FIG. 26A is different from the ladder circuit 20E in FIG. 25A in that it also includes an inductor L (second impedance element) connected in series with the switch SW. That is, in this modified example, a series circuit of the switch SW and the inductor L is connected in parallel with the capacitor C, thereby forming a variable frequency circuit 11F. The variable frequency circuit 11F is connected to a parallel arm resonator p1 (first parallel arm resonator) so as to form a parallel arm resonance circuit 21F.

The connection order of the switch SW and the inductor L is not particularly restricted to that shown in FIG. 26A, and may be reversed.

Figure 26B:
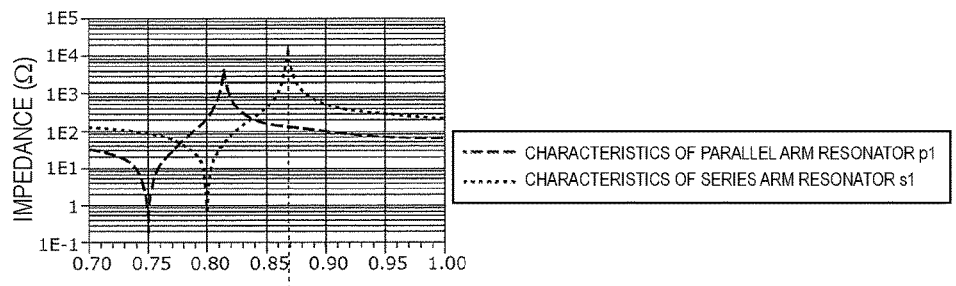
FIGS. 26B-26D show graphs illustrating the filter characteristics of the ladder circuit according to the sixth modified example.
Figure 26C:
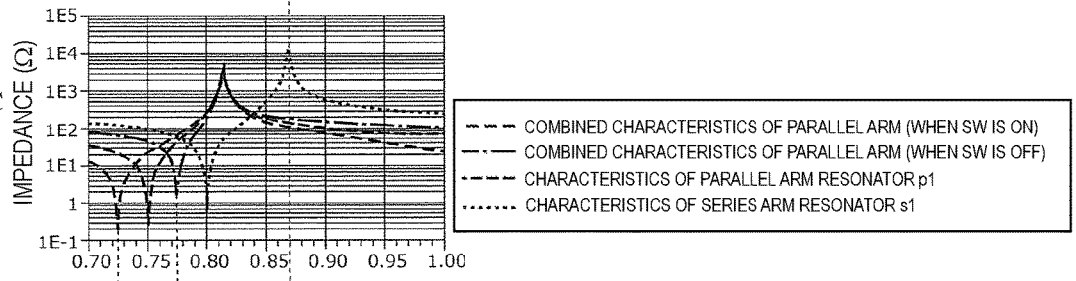
Figure 26D:
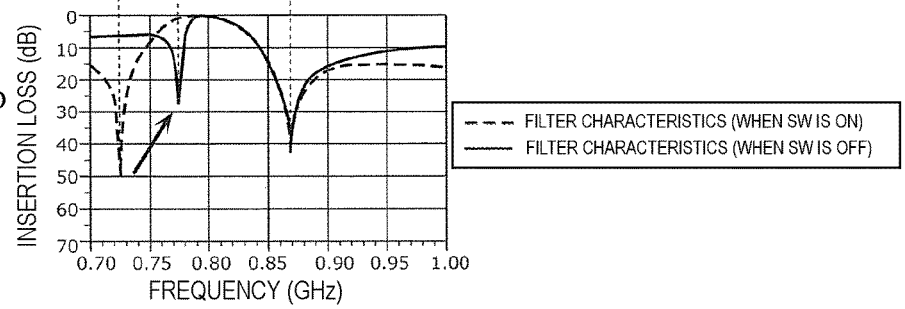

FIGS. 26B-26D shows graphs illustrating the filter characteristics (bandpass characteristics) of the ladder circuit 20F according to the sixth modified example of the first embodiment. More specifically, FIGS. 26B-26D show graphs illustrating the comparison results between the filter characteristics when the switch SW is ON and those when the switch SW is OFF.

In the ladder circuit 20F, the pass band is formed by causing the anti-resonant frequency of the parallel arm resonance circuit 21F and the resonant frequency of the series arm resonator s1 to be close to each other.

In this modified example, when the switch SW is ON, the inductor L is added to the parallel arm resonator p1, while, when the switch SW is OFF, the capacitor C is added to the parallel arm resonator p1. With this arrangement, when the switch SW is OFF, the resonant frequency of the parallel arm resonance circuit 21F shifts to the lower-frequency side and becomes lower than that of the single parallel arm resonator p1. When the switch SW is ON, the resonant frequency of the parallel arm resonance circuit 21F shifts to the higher-frequency side and becomes higher than that of the single parallel arm resonator p1. Hence, the ladder circuit 20F according to this modified example can increase the variable frequency range of the pass band to be wider than the ladder circuit 20E of the fifth modified example.

The variable frequency range of the pass band of the ladder circuit 20F is determined by the constant of the inductor. For example, as the constant of the inductor is greater, the variable frequency range becomes wider. The constant of the inductor is thus suitably determined in accordance with the frequency specifications demanded for the ladder circuit 20F. The inductor may be a variable inductor formed by using MEMS. This can adjust the variable frequency range more precisely.

The arrangement of the capacitor C and the inductor L shown in FIG. 26A may be reversed. That is, a series circuit of the switch SW and the capacitor C may be connected in parallel with the inductor L. With this configuration, the shifting direction of the attenuation pole as a result of the switch SW being switched between ON and OFF in the ladder circuit 20A of the sixth modified example is reversed.

In the ladder circuit 20F configured as described above, too, an input-output terminal 11m or 11n of the ladder circuit 20F is connected to the even-numbered IDT terminal of the longitudinally coupled resonator device s30, thereby reducing the loss caused by impedance mismatching within the filter. That is, it is possible to implement a tunable filter that can reduce the loss within the pass band while achieving sufficient attenuation in a band separated from the pass band.

Seventh Modified Example

Ladder circuits each including a capacitor or an inductor as the first impedance element have been discussed above. However, the first impedance element may be an elastic wave resonator having a resonant frequency higher than that of the parallel arm resonator p1 (first parallel arm resonator) and an anti-resonant frequency higher than that of the parallel arm resonator p1. In this modified example, as such an elastic wave resonator, the parallel arm resonator p2 discussed in the first through fourth modified examples is connected in series with the parallel arm resonator p1.

FIG. 27A is a circuit diagram of a ladder circuit 20G according to a seventh modified example.

In the ladder circuit 20G shown in FIG. 27A, the switch SW is connected in parallel with the parallel arm resonator p2 and forms a variable frequency circuit 11G together with the parallel arm resonator p2. The variable frequency circuit 11G is connected in series with the parallel arm resonator p1 (first parallel arm resonator) and forms a parallel arm resonance circuit 21G together with the parallel arm resonator p1.

FIGS. 27B-27D shows graphs illustrating the filter characteristics (bandpass characteristics) of the ladder circuit 20G according to the seventh modified example of the first embodiment. More specifically, FIGS. 27B-27D shows graphs illustrating the comparison results between the filter characteristics when the switch SW is ON and those when the switch SW is OFF.

In the ladder circuit 20G configured as described above, the parallel arm resonator p2 is added to the parallel arm resonator p1 only when the switch SW is OFF. When the switch SW is ON, the parallel arm resonance circuit 21G exhibits the characteristics of the single parallel arm resonator p1, and when the switch is OFF, the parallel arm resonance circuit 21G exhibits the combined characteristics of the parallel arm resonators p1 and p2.

With this arrangement, when the switch SW is OFF, the lower resonant frequency of the parallel arm resonance circuit 21G is positioned on the higher-frequency side than the resonant frequency of the single parallel arm resonator p1, and the higher resonant frequency of the parallel arm resonance circuit 21G is positioned between the anti-resonant frequency of the single parallel arm resonator p1 and that of the single parallel arm resonator p2. Hence, as a result of the switch SW being changed from ON to OFF, the ladder circuit 20G is able to shift the attenuation pole on the low-frequency side of the pass band to the higher-frequency side and also to add an attenuation pole on the high-frequency side of the pass band so as to achieve attenuation on the high-frequency side of the pass band.

In the ladder circuit 20G configured as described above, too, an input-output terminal 11m or 11n of the ladder circuit 20G is connected to the even-numbered IDT terminal of the longitudinally coupled resonator device s30, thereby reducing the loss caused by impedance mismatching within the filter. That is, it is possible to implement a tunable filter that can reduce the loss within the pass band while achieving sufficient attenuation in a band separated from the pass band.

Eighth Modified Example

In the above-described variable frequency circuits, the first impedance element and the switch SW are connected in parallel with each other. However, the variable frequency circuit may be a series circuit of the first impedance element and the switch SW and may be connected in parallel with the parallel arm resonator p1 (first parallel arm resonator) between the node x1 and a ground. The first impedance element is an elastic wave resonator having a resonant frequency higher than that of the parallel arm resonator p1 (first parallel arm resonator) and an anti-resonant frequency higher than that of the parallel arm resonator p1. In this modified example, a ladder circuit configured as described above will be discussed.

FIG. 28A is a circuit diagram of a ladder circuit 20H according to an eighth modified example.

In the ladder circuit 20H shown in FIG. 28A, the switch SW is connected in series with the parallel arm resonator p2 and forms a variable frequency circuit 11H together with the parallel arm resonator p2. The variable frequency circuit 11H is connected in parallel with the parallel arm resonator p1 (first parallel arm resonator) and forms a parallel arm resonance circuit 21H together with the parallel arm resonator p1.

FIGS. 28B-28D shows graphs illustrating the filter characteristics (bandpass characteristics) of the ladder circuit 20H according to the eighth modified example of the first embodiment. More specifically, FIGS. 28B-28D shows graphs illustrating the comparison results between the filter characteristics when the switch SW is ON and those when the switch SW is OFF.

In the ladder circuit 20H configured as described above, the parallel arm resonator p2 is added to the parallel arm resonator p1 only when the switch SW is ON. When the switch SW is ON, the parallel arm resonance circuit 21H exhibits the combined characteristics of the parallel arm resonators p1 and p2, and when the switch is OFF, the parallel arm resonance circuit 21G exhibits the characteristics of the single parallel arm resonator p1.

With this arrangement, in the parallel arm resonance circuit 21H, when the switch SW is OFF, the resonant frequency positioned on the lower frequency side than the anti-resonant frequency of the single series arm resonator s1 disappears, thereby increasing the impedance at the anti-resonant frequency of the single series arm resonator s1. When the switch SW is OFF, the anti-resonant frequency positioned on the higher frequency side than the anti-resonant frequency of the single series arm resonator s1 disappears, thereby decreasing the impedance at the anti-resonant frequency of the single series arm resonator s1. Hence, as a result of the switch SW being changed from ON to OFF, the ladder circuit 20H is able to shift the high edge of the pass band to the higher-frequency side.

In the ladder circuit 20H configured as described above, too, an input-output terminal 11m or 11n of the ladder circuit 20H is connected to the even-numbered IDT terminal of the longitudinally coupled resonator device s30, thereby reducing the loss caused by impedance mismatching within the filter. That is, it is possible to implement a tunable filter that can reduce the loss within the pass band while achieving sufficient attenuation in a band separated from the pass band.

Second Embodiment

The configurations described in the first embodiment and modified examples thereof are applicable to a radio-frequency front-end circuit, for example, including three or more filters. In this embodiment, such a radio-frequency front-end circuit will be described.

Figure 29:
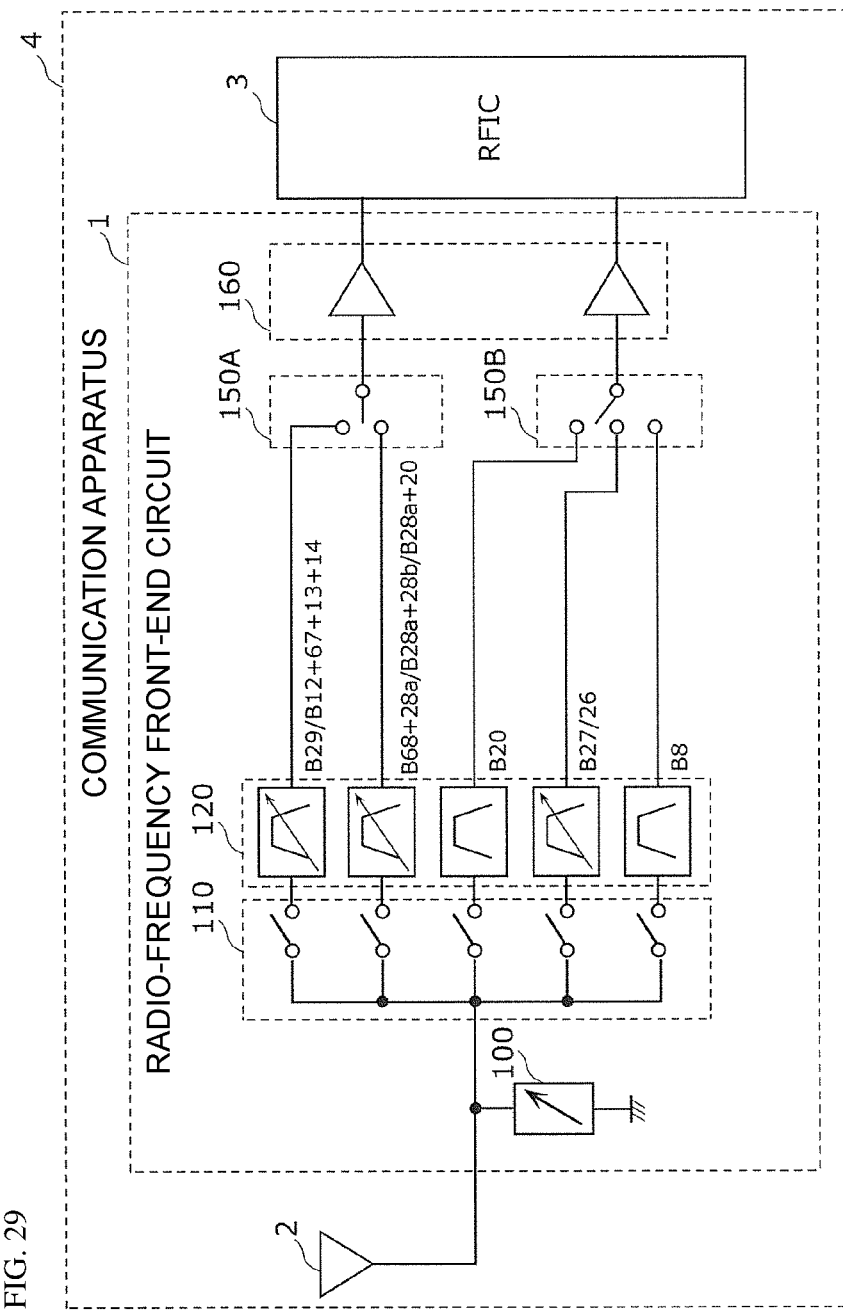
FIG. 29 is a circuit diagram of a radio-frequency front-end circuit according to a second embodiment and its surrounding circuits.

FIG. 29 is a circuit diagram of a radio-frequency front-end circuit 1 according to a second embodiment and its surrounding circuits. In FIG. 29, the radio-frequency front-end circuit 1, an antenna device 2, and an RF signal processing circuit (RFIC) 3 are shown. The radio-frequency front-end circuit 1, the antenna device 2, and the RFIC 3 form a communication apparatus 4. The antenna device 2, the radio-frequency front-end circuit 1, and the RFIC 3 are disposed in a front-end portion of a multimode/multiband-support cellular phone, for example.

The antenna device 2 is a multiband-support antenna, which is compliant with the communication standards, such as 3GPP, sends and receives radio-frequency signals. The antenna device 2 may not necessarily support all the bands of the communication apparatus 4, and may only support bands of a low-frequency band group or those of a high-frequency band group. The antenna device 2 may separately be provided from the communication apparatus 4, instead of being integrated in the communication apparatus 4.

The RFIC 3 is an RF signal processing circuit which processes radio-frequency signals received by the antenna device 2 and those to be sent by the antenna device 2. More specifically, the RFIC 3 performs signal processing, such as down-conversion, on a radio-frequency received signal inputted from the antenna device 2 via a receive signal path of the radio-frequency front-end circuit 1. The RFIC 3 then outputs a received signal generated by performing signal processing to a baseband signal processing circuit (not shown). The RFIC 3 also performs signal processing, such as up-conversion, on a transmit signal inputted from the baseband signal processing circuit. The RFIC 3 then outputs a radio-frequency transmit signal generated by performing signal processing to a transmit signal path (not shown) of the radio-frequency front-end circuit 1.

The radio-frequency front-end circuit 1 is a circuit that transfers radio-frequency signals between the antenna device 2 and the RFIC 3. More specifically, the radio-frequency front-end circuit 1 transfers a radio-frequency transmit signal outputted from the RFIC 3 to the antenna device 2 via the transmit signal path (not shown). The radio-frequency front-end circuit 1 also transfers a radio-frequency received signal received by the antenna device 2 to the RFIC 3 via the receive signal path.

The radio-frequency front-end circuit 1 includes a variable impedance matching circuit 100, a switch group 110, a filter group 120, switch groups 150A and 150B, and a receive amplifier circuit group 160 in this order from the antenna device 2.

The switch group 110 is a switch circuit constituted by plural switches which connect the antenna device 2 and a filter corresponding to a predetermined band in accordance with a control signal inputted from a controller (not shown). The switch group 110 may not necessarily connect the antenna device 2 to only one filter and may connect it to multiple filters.

The filter group 120 is constituted by plural filters, and is constituted by the following first through fifth filters, for example, in this embodiment. The first filter is a tunable filter that supports Band 29 and CA of Bands 12, 67, 13, and 14. The second filter is a tunable filter that supports CA of Band 68 and Band 28a, CA of Band 28a and Band 28b, and CA of Band 28a and Band 20. The third filter is a fixed-frequency filter which supports Band 20. The fourth filter is a tunable filter that supports Band 27 and Band 26. As the fourth filter, the filter 10 having the basic configuration of the first embodiment may be used. The fifth filter is a fixed-frequency filter which supports Band 8.

Each of the switch groups 150A and 150B is a switch circuit constituted by plural switches that connect a filter corresponding to a predetermined band and a receive amplifier circuit of the receive amplifier circuit group 160 corresponding to this band in accordance with a control signal inputted from a controller (not shown). The switch groups 150A and 150B may not necessarily connect a receive amplifier circuit to only one filter and may connect it to multiple filters.

The receive amplifier circuit group 160 is constituted by one or more low-noise amplifiers (plural low-noise amplifiers in this embodiment) that amplify power of radio-frequency received signals inputted from the switch groups 150A and 150B.

The radio-frequency front-end circuit 1 configured as described above causes a radio-frequency received signal inputted from the antenna device 2 to selectively pass through a predetermined filter, amplifies the radio-frequency received signal by using a predetermined low-noise amplifier, and outputs it to the RFIC 3. As the RFIC 3, a low-band RFIC and a high-band RFIC may individually be provided.

The radio-frequency front-end circuit 1 includes the filter 10 having the basic configuration of the first embodiment as the fourth filter. The loss caused by impedance mismatching within the fourth filter can thus be reduced. The radio-frequency front-end circuit requires fewer filters than when filters are provided for individual bands, thereby decreasing the size of the radio-frequency front-end circuit. The radio-frequency front-end circuit can also reduce the loss within the pass band.

In this embodiment, the radio-frequency front-end circuit 1 has a receive diversity configuration in which plural filters (receive filters) are disposed on the receive signal path. However, the configuration of the radio-frequency front-end circuit is not restricted to such a configuration, and may have a transmit diversity configuration in which plural filters (transmit filters) are disposed on the transmit signal path. The configuration of the radio-frequency front-end circuit is not restricted to a diversity configuration including plural receive filters or plural transmit filters. The radio-frequency front-end circuit may be configured as a transmit-and-receive circuit including at least one transmit filter and at least one receive filter.

Other Embodiments

The elastic wave filter devices and the radio-frequency front-end circuit according to embodiments of the present disclosure have been discussed above through illustration of the first and second embodiments. However, the present disclosure is not restricted to the above-described embodiments. Other embodiments implemented by combining certain elements in the above-described embodiments, and modified examples obtained by making various modifications to the above-described embodiments by those skilled in the art without departing from the scope and spirit of the disclosure are also encompassed in the disclosure. Various devices integrating the radio-frequency front-end circuit according to the present disclosure are also encompassed in the disclosure.

For example, the communication apparatus 4 including the above-described radio-frequency front-end circuit and RFIC 3 (RF signal processing circuit) is also encompassed in the present disclosure. Such a communication apparatus 4 can be decreased in size and reduce the loss within the pass band.

A multiplexer, such as a duplexer, including the above-described elastic wave filter device, is also encompassed in the present disclosure. That is, in a multiplexer including plural filters connected to a common terminal, at least one filter may be one of the above-described elastic wave filter devices.

The series arm resonator may be constituted by plural elastic wave resonators instead of one elastic wave resonator. That is, the series arm resonator is constituted by one or more elastic wave resonators. For example, the above-described series arm resonator may be a longitudinally coupled resonator device constituted by plural elastic wave resonators. In the elastic wave filter device configured described above, too, an elastic wave resonator of the longitudinally coupled resonator device is connected based on the above-described first knowledge and second knowledge, thereby making it possible to reduce the loss within the pass band and to achieve sufficient attenuation in a band separated from the pass band.

A single elastic wave resonator (series arm resonator or parallel arm resonator) may be constituted by plural series-connected resonators divided from one elastic wave resonator.

In the radio-frequency front-end circuit or the communication apparatus, an inductor or a capacitor may be connected between the components of the radio-frequency front-end circuit or the communication apparatus. In this case, a wiring inductor constituted by wiring for connecting the components may be an example of the inductor.

The present disclosure can widely be used in communication apparatuses, such as cellular phones, as a small-size and small-loss multiplexer, front-end circuit, and communication apparatus.

1 radio-frequency front-end circuit
2 antenna device
3 RFIC (RF signal processing circuit)
4 communication apparatus
10 filter (elastic wave filter device)
11, 11a, 11b, 11F to 11H variable frequency circuit
11m, 11n, 111, 112 input-output terminal
20A to 20H ladder circuit
21, 21A to 21H parallel arm resonance circuit
100 variable impedance matching circuit
110, 150A, 150B switch group
120 filter group
160 receive amplifier circuit group
311 to 313 IDT electrode
321a, 321b reflector
C, C1, C2 capacitor
L inductor
p1, p2 parallel arm resonator
s1, s2 series arm resonator
s30 longitudinally coupled resonator device
SW, SW1, SW2 switch (switch element)
x1 node

The invention claimed is:
1. An elastic wave filter comprising:
first and second input-output terminals;
a longitudinally coupled resonator disposed on a path connecting the first and second input-output terminals;
a first parallel arm resonator connected between a node on the path and a ground, wherein the first parallel arm resonator is an elastic wave resonator configured to determine a pass band together with the longitudinally coupled resonator; and a variable frequency circuit that is connected to the first parallel arm resonator and that includes a first impedance element and a switch element, wherein the variable frequency circuit varies the pass band as a result of the switch element being switched between ON and OFF, the longitudinally coupled resonator includes:
  a plurality of interdigital transducer ("IDT") electrodes,
  an even-numbered IDT terminal, and
  an odd-numbered IDT terminal, wherein the plurality of IDT electrodes are disposed along a propagating direction of elastic waves, one terminal of each of the plurality of IDT electrodes is connected to a ground, the plurality of IDT electrodes are three or more odd-number IDT electrodes, the even-numbered IDT terminal is a first signal terminal connected to the other terminal of each of one or more IDT electrodes located at even-numbered positions from an edge of an arrangement order of the plurality of IDT electrodes, the odd-numbered IDT terminal is a second signal terminal connected to the other terminal of each of two or more IDT electrodes located at odd-numbered positions from the edge of the arrangement order of the plurality of IDT electrodes, and the longitudinally coupled resonator is disposed so that the even-numbered IDT terminal is connected to the node.

2. The elastic wave filter according to claim 1, wherein:
the even-numbered IDT terminal is connected to the first input-output terminal via the node; and
the odd-numbered IDT terminal is connected to the second input-output terminal.

3. The elastic wave filter according to claim 2, further comprising:
a first series arm resonator disposed on a path connecting the first input-output terminal and the even-numbered IDT terminal, wherein the first series arm resonator is an elastic wave resonator.

4. The elastic wave filter according to claim 2, further comprising:
a second series arm resonator disposed on a path connecting the odd-numbered IDT terminal and the second input-output terminal, wherein the second series arm resonator is an elastic wave resonator,
wherein the odd-numbered IDT terminal and the second input-output terminal are connected to each other without any elastic wave resonator other than the second series arm resonator interposed therebetween.

5. The elastic wave filter according to claim 2, wherein the odd-numbered IDT terminal and the second input-output terminal are connected to each other without any elastic wave resonator interposed therebetween.

6. The elastic wave filter according to claim 1, wherein the first parallel arm resonator and the variable frequency circuit are connected in series with each other, and
the first impedance element and the switch element are connected in parallel with each other,
the elastic wave filter further comprising:
a circuit including a second parallel arm resonator that is an elastic wave resonator, wherein a circuit including the first parallel arm resonator and the circuit including the second parallel arm resonator are connected in parallel with each other, a resonant frequency of the second parallel arm resonator is different from a resonant frequency of the first parallel arm resonator, and an anti-resonant frequency of the second parallel arm resonator is different from an anti-resonant frequency of the first parallel arm resonator.

7. The elastic wave filter according to claim 6, wherein:
the resonant frequency of the second parallel arm resonator is lower than the resonant frequency of the first parallel arm resonator;
the anti-resonant frequency of the second parallel arm resonator is lower than the anti-resonant frequency of the first parallel arm resonator;
the first parallel arm resonator and the variable frequency circuit are connected in series with each other; and
the second parallel arm resonator is connected in parallel with a series circuit of the first parallel arm resonator and the variable frequency circuit.

8. The elastic wave filter according to claim 6, wherein:
the resonant frequency of the second parallel arm resonator is higher than the resonant frequency of the first parallel arm resonator;
the anti-resonant frequency of the second parallel arm resonator is higher than the anti-resonant frequency of the first parallel arm resonator;
the first parallel arm resonator and the variable frequency circuit are connected in series with each other; and
the second parallel arm resonator is connected in parallel with a series circuit of the first parallel arm resonator and the variable frequency circuit.

9. The elastic wave filter according to claim 6, wherein:
the first and second parallel arm resonators are connected in parallel with each other; and
the variable frequency circuit is connected in series with a parallel circuit of the first and second parallel arm resonators.

10. The elastic wave filter according to claim 6, wherein the variable frequency circuit is connected in series with only one of the first and second parallel arm resonators,
the elastic waver filter further comprising:
a different variable frequency circuit that is connected in series with only the other one of the first and second parallel arm resonators, wherein
a series circuit of the variable frequency circuit and one of the first and second parallel arm resonators and a series circuit of the different variable frequency circuit and the other one of the first and second parallel arm resonators are connected in parallel with each other.

11. The elastic wave filter according to claim 1, further comprising:
a first series arm resonator disposed on a path connecting the first input-output terminal and the even-numbered IDT terminal, wherein the first series arm resonator is an elastic wave resonator.

12. The elastic wave filter according to claim 1, further comprising:
a second series arm resonator disposed on a path connecting the odd-numbered IDT terminal and the second input-output terminal, wherein the second series arm resonator is an elastic wave resonator,
wherein the odd-numbered IDT terminal and the second input-output terminal are connected to each other without any elastic wave resonator other than the second series arm resonator interposed therebetween.

13. The elastic wave filter according to claim 1, wherein the odd-numbered IDT terminal and the second input-output terminal are connected to each other without any elastic wave resonator interposed therebetween.

14. The elastic wave filter according to claim 1, wherein the longitudinally coupled resonator includes three, five, or nine IDT electrodes.

15. The elastic wave filter according to claim 1, wherein the variable frequency circuit is a parallel circuit of the first impedance element and the switch element and is connected in parallel with the first parallel arm resonator between the node and the ground.

16. The elastic wave filter according to claim 1, wherein:
the first impedance element is one of an inductor and a capacitor;
the variable frequency circuit further includes a second impedance element that is the other one of the inductor and the capacitor and that is connected in series with the switch element; and
a series circuit of the switch element and the second impedance element is connected in parallel with the first impedance element.

17. The elastic wave filter according to claim 1, wherein:
the variable frequency circuit is a parallel circuit of the first impedance element and the switch element and is connected in series with the first parallel arm resonator between the node and the ground; and
the first impedance element is an elastic wave resonator having a resonant frequency higher than a resonant frequency of the first parallel arm resonator and an anti-resonant frequency higher than an anti-resonant frequency of the first parallel arm resonator.

18. The elastic wave filter according to claim 1, wherein:
the first impedance element and the switch element are connected in series with each other and is connected in parallel with the first parallel arm resonator between the node and the ground; and
the first impedance element is an elastic wave resonator having a resonant frequency higher than a resonant frequency of the first parallel arm resonator and an anti-resonant frequency higher than an anti-resonant frequency of the first parallel arm resonator.

19. A radio-frequency front-end circuit comprising:
the elastic wave filter according to claim 1; and
an amplifier circuit connected to the elastic wave filter.

20. A communication apparatus comprising:
an RF signal processing circuit that processes a radio-frequency signal received by an antenna and a radio-frequency signal to be transmitted by the antenna; and
the radio-frequency front-end circuit according to claim 19 that transfers the radio-frequency signals between the antenna and the RF signal processing circuit.

* * * * *